US012356765B2

(12) United States Patent
Jeong et al.

(10) Patent No.: US 12,356,765 B2
(45) Date of Patent: Jul. 8, 2025

(54) DISPLAY DEVICE

(71) Applicant: Samsung Display Co., LTD., Yongin-si (KR)

(72) Inventors: Da Sol Jeong, Seoul (KR); Jang Soon Park, Asan-si (KR); Sung Geun Bae, Hwaseong-si (KR); Hyun Wook Lee, Suwon-si (KR); Won Hyeong Heo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 647 days.

(21) Appl. No.: 17/663,931

(22) Filed: May 18, 2022

(65) Prior Publication Data
US 2023/0016834 A1  Jan. 19, 2023

(30) Foreign Application Priority Data

Jul. 15, 2021 (KR) .................. 10-2021-0092766
Nov. 4, 2021 (KR) .................. 10-2021-0150223

(51) Int. Cl.
H10H 20/831 (2025.01)
H10H 20/857 (2025.01)
H10H 29/14 (2025.01)

(52) U.S. Cl.
CPC ...... *H10H 20/8312* (2025.01); *H10H 20/857* (2025.01); *H10H 29/142* (2025.01)

(58) Field of Classification Search
CPC . H10H 20/8312; H10H 20/857; H10H 29/142
See application file for complete search history.

(56) References Cited

U.S. PATENT DOCUMENTS

| 11,670,737 | B2 | 6/2023 | Yang et al. | |
|---|---|---|---|---|
| 11,730,031 | B2* | 8/2023 | Lee | H10K 59/122 257/40 |
| 2021/0272943 | A1* | 9/2021 | Lee | H10D 86/60 |
| 2021/0320237 | A1* | 10/2021 | Kim | H01L 25/167 |

(Continued)

FOREIGN PATENT DOCUMENTS

| KR | 2021-0022799 A | 3/2021 |
|---|---|---|
| KR | 2021-0077864 A | 6/2021 |
| KR | 2022-0168606 A | 12/2022 |

*Primary Examiner* — Eugene Lee
(74) *Attorney, Agent, or Firm* — Womble Bond Dickinson (US) LLP

(57) ABSTRACT

A display device includes a first electrode extending in a first direction, and a second electrode spaced from the first electrode in a second direction, a plurality of light emitting elements on the first electrode and the second electrode, a light emitting element of the plurality of light emitting elements comprising a first end on the first electrode and a second end on the second electrode, a first connection electrode extending in the first direction and on the first electrode, a second connection electrode extending in the first direction and on the second electrode, a third connection electrode on the first electrode and spaced from the first connection electrode in the first direction, and a fourth connection electrode on the second electrode and spaced from the second connection electrode in the second direction, wherein the plurality of light emitting elements comprises first light emitting elements and second light emitting elements.

28 Claims, 38 Drawing Sheets

(56) References Cited

U.S. PATENT DOCUMENTS

| | | | |
|---|---|---|---|
| 2022/0189939 A1* | 6/2022 | Lee | H01L 25/167 |
| 2022/0254830 A1* | 8/2022 | Kim | H10H 20/831 |
| 2022/0320059 A1* | 10/2022 | Lee | H10H 20/857 |
| 2022/0320378 A1* | 10/2022 | Hong | H01L 25/0753 |
| 2022/0406972 A1* | 12/2022 | Im | H10H 20/8316 |
| 2023/0261142 A1* | 8/2023 | Park | H01L 25/0753 |
| | | | 257/91 |
| 2024/0030385 A1 | 1/2024 | Im et al. | |
| 2024/0222583 A1* | 7/2024 | Im | H01L 25/167 |
| 2024/0282802 A1* | 8/2024 | Hong | H01L 25/0753 |
| 2024/0413267 A1* | 12/2024 | Kim | H10H 20/84 |

\* cited by examiner

RME: RME1, RME2, RME3, RME4
ED: ED1, ED2, ED3, ED4

DISPLAY DEVICE

CROSS-REFERENCE TO RELATED APPLICATION

This application claims priority to and the benefit of Korean Patent Application No. 10-2021-0092766 filed on Jul. 15, 2021, and Korean Patent Application No. 10-2021-0150223 filed on Nov. 4, 2021 in the Korean Intellectual Property Office, the contents of all of which are incorporated by reference herein.

BACKGROUND

1. Field

The present disclosure relates to a display device.

2. Description of the Related Art

Display devices are becoming increasingly important with the development of multimedia. Accordingly, various types of display devices such as organic light emitting diode (OLED) displays and liquid crystal displays (LCDs) are being used.

As a device for displaying an image, there is a self-luminous display device including a light emitting element. The self-luminous display device may be an organic light emitting display using an organic material as a light emitting material in a light emitting element or an inorganic light emitting display using an inorganic material as a light emitting material.

SUMMARY

Aspects and features of embodiments of the present disclosure provide a display device having a novel electrode structure.

However, aspects and features of embodiments of the present disclosure are not restricted to the ones set forth herein. The above and other aspects and features of embodiments of the present disclosure will become more apparent to one of ordinary skill in the art to which the present disclosure pertains by referencing the detailed description of the present disclosure given below.

According to one or more embodiments of the disclosure, a display device includes a first electrode extending in a first direction, and a second electrode spaced from the first electrode in a second direction, a plurality of light emitting elements on the first electrode and the second electrode, a light emitting element of the plurality of light emitting elements including a first end on the first electrode and a second end on the second electrode, a first connection electrode extending in the first direction and located on the first electrode, a second connection electrode extending in the first direction and located on the second electrode, a third connection electrode located on the first electrode and spaced from the first connection electrode in the first direction, and a fourth connection electrode located on the second electrode and spaced from the second connection electrode in the second direction, wherein the plurality of light emitting elements includes first light emitting elements and second light emitting elements, each of the first light emitting elements having a first end in contact with the first connection electrode, and each of the second light emitting elements having a second end in contact with the second connection electrode, the third connection electrode extends in the second direction on one side opposing the first connection electrode, and includes a first connection portion on the first electrode and the second electrode, and the fourth connection electrode includes a second connection portion on the first connection portion and in direct contact with the first connection portion.

A first light emitting element of the first light emitting elements may have a second end in contact with the fourth connection electrode, and a second light emitting element of the second light emitting elements may have a first end in contact with the third connection electrode.

The display device may further include a first insulating layer on the first electrode and the second electrode, a second insulating layer on the first insulating layer and the light emitting element, and a third insulating layer on the second insulating layer, wherein the light emitting element may be directly on the first insulating layer.

At least a part of each of the first connection electrode and the third connection electrode may be located between the second insulating layer and the third insulating layer, and at least a part of each of the second connection electrode and the fourth connection electrode may be on the third insulating layer.

The display device may further include a plurality of first openings on one side of the first electrode opposing the second electrode and penetrating the second insulating layer to expose the first ends of the first light emitting element and the second light emitting element, and a plurality of second openings on one side of the second electrode opposing the first electrode and penetrating the second insulating layer and the third insulating layer to expose the second ends of the first light emitting element and the second light emitting element.

The plurality of first openings may be spaced from each other in the first direction, the plurality of second openings may be spaced from each other in the first direction, and a first opening of the plurality of first openings and a second opening of the plurality of second openings may be spaced from each other in the second direction.

The second connection portion may be in contact with the first connection portion through a third opening penetrating the third insulating layer to expose a part of the first connection portion, and the second insulating layer may do not overlap the third insulating layer while overlapping the first connection portion and the second connection portion at a portion where the first connection portion and the second connection portion are in contact with each other.

A width of the third opening measured in the second direction may be greater than a width of the first connection portion measured in the second direction.

The first connection electrode may be electrically connected to the first electrode, and the second connection electrode may be electrically connected to the second electrode.

The display device may further include a bank layer on the first insulating layer and surrounding an emission area in which the light emitting elements are located, and a sub-region located in the first direction of the emission area, wherein the first connection electrode may be in contact with the first electrode through a first contact portion penetrating the first insulating layer and the second insulating layer to expose a part of a top surface of the first electrode in the sub-region, and the second connection electrode may be in contact with the second electrode through a second contact portion penetrating the first insulating layer, the second insulating layer, and the third insulating layer to expose a part of a top surface of the second electrode in the sub-region.

According to one or more embodiments of the disclosure, a display device includes a plurality of electrodes including a first electrode extending in a first direction, a second electrode spaced from the first electrode in a second direction, a third electrode located between the first electrode and the second electrode, and a fourth electrode spaced from the second electrode in the second direction, a plurality of light emitting elements on the plurality of electrodes that are spaced from each other in the second direction, and a plurality of connection electrodes on at least some of the plurality of electrodes, and in contact with the plurality of light emitting elements, the plurality of connection electrodes being spaced from each other in the first direction and the second direction, wherein the plurality of connection electrodes includes a first connection electrode on the first electrode, a second connection electrode on the second electrode, a third connection electrode on the first electrode and spaced from the first connection electrode in the first direction, a fourth connection electrode on the second electrode and spaced from the second connection electrode in the first direction, a fifth connection electrode on the third electrode and spaced from the first connection electrode in the second direction, a sixth connection electrode on the fourth electrode and spaced from the second connection electrode in the second direction, and a seventh connection electrode including a first electrode extension portion on the third electrode and spaced from the third connection electrode in the second direction, a second electrode extension portion on the fourth electrode and spaced from the fourth connection electrode in the second direction, and a first electrode connection portion connecting the first electrode extension portion to the second electrode extension portion, each of the third connection electrode and the fourth connection electrode includes a first connection portion extending in the second direction on one side opposing the first connection electrode or the second connection electrode, the first connection portion being on the plurality of electrodes that are spaced from each other in the second direction, and each of the fifth connection electrode and the sixth connection electrode includes a second connection portion on the first connection portion and in direct contact with the first connection portion.

The plurality of light emitting elements may include a first light emitting element on the first electrode and the third electrode and in contact with the first connection electrode and the fifth connection electrode, a second light emitting element on the second electrode and the fourth electrode and in contact with the second connection electrode and the sixth connection electrode, a third light emitting element on the first electrode and the third electrode and in contact with the third connection electrode and the seventh connection electrode, and a fourth light emitting element on the second electrode and the fourth electrode and in contact with the fourth connection electrode and the seventh connection electrode.

The display device may further include a first insulating layer on the plurality of electrodes, a second insulating layer on the first insulating layer and the plurality of light emitting elements, and a third insulating layer on the second insulating layer, wherein the plurality of light emitting elements may be located directly on the first insulating layer.

At least a part of each of the first connection electrode, the second connection electrode, the third connection electrode, and the fourth connection electrode may be located between the second insulating layer and the third insulating layer, and at least a part of each of the fifth connection electrode, the sixth connection electrode, and the seventh connection electrode may be on the third insulating layer.

The display device may further include a plurality of first openings on one side of the first electrode opposing the third electrode and penetrating the second insulating layer to expose first ends of the first light emitting element and the third light emitting element; and a plurality of second openings on one side of the second electrode opposing the fourth electrode and penetrating the second insulating layer to expose first ends of the second light emitting element and the fourth light emitting element, wherein the first connection electrode and the third connection electrode may be in contact with the first ends of the first light emitting element and the third light emitting element exposed through the first openings, respectively, and the second connection electrode and the fourth connection electrode may be in contact with the first ends of the second light emitting element and the fourth light emitting element exposed through the second openings, respectively.

The second connection portion of the fifth connection electrode and the sixth connection electrode may be in contact with the first connection portion through a third opening penetrating the third insulating layer to expose the first connection portion of each of the third connection electrode and the fourth connection electrode, and the second insulating layer may do not overlap the third insulating layer while overlapping the first connection portion and the second connection portion at a portion where the first connection portion and the second connection portion are in contact with each other.

The display device may further include a plurality of fourth openings located on one side of the third electrode opposing the first electrode and penetrating the second insulating layer and the third insulating layer to expose second ends of the first light emitting element and the third light emitting element, and a plurality of fifth openings on one side of the fourth electrode opposing the second electrode and penetrating the second insulating layer and the third insulating layer to expose second ends of the second light emitting element and the fourth light emitting element, wherein the first electrode extension portions of the fifth connection electrode and the seventh connection electrode may be in contact with the second ends of the first light emitting element and the third light emitting element exposed through the fourth openings, respectively, and the second electrode extension portions of the sixth connection electrode and the seventh connection electrode may be in contact with the second ends of the second light emitting element and the fourth light emitting element exposed through the fifth openings, respectively.

The display device may further include a bank layer on the first insulating layer and surrounding an emission area in which the plurality of light emitting elements are located, and a sub-region located in the first direction of the emission area, and a first contact portion and a second contact portion located in the sub-region and penetrating the first insulating layer and the second insulating layer.

The plurality of electrodes may be located across the emission area and the sub-region, the first contact portion may overlap the first electrode, the second contact portion may overlap the second electrode, the first connection electrode may be in contact with the first electrode through the first contact portion, and the second connection electrode may be in contact with the second electrode through the second contact portion.

The display device may further include a third contact portion on the third electrode in the sub-region and penetrating the first insulating layer, the second insulating layer, and the third insulating layer, and a fourth contact portion on the fourth electrode in the sub-region and penetrating the first insulating layer, the second insulating layer, and the third insulating layer, wherein the fifth connection electrode may be in contact with the third electrode through the third contact portion, and the sixth connection electrode may be in contact with the fourth electrode through the fourth contact portion.

According to one or more embodiments of the disclosure, a display device includes a plurality of electrodes including a first electrode extending in a first direction, a second electrode spaced from the first electrode in a second direction, a third electrode between the first electrode and the second electrode, and a fourth electrode spaced from the second electrode in the second direction, a plurality of light emitting elements on the plurality of electrodes that are spaced from each other in the second direction, and a plurality of connection electrodes on at least some of the plurality of electrodes and in contact with the plurality of light emitting elements, the plurality of connection electrodes being spaced from each other in the first direction and the second direction, wherein the plurality of connection electrodes includes a first connection electrode located on the first electrode, a second connection electrode located on the second electrode, a third connection electrode located on the first electrode and spaced from the first connection electrode in the first direction, a fourth connection electrode on the second electrode and spaced from the second connection electrode in the first direction, a fifth connection electrode on the third electrode and spaced from the first connection electrode in the second direction, a sixth connection electrode on the fourth electrode and spaced from the second connection electrode in the second direction, and a seventh connection electrode including a first electrode extension portion disposed on the third electrode and spaced from the third connection electrode in the second direction, a second electrode extension portion on the fourth electrode and spaced from the fourth connection electrode in the second direction, and a first electrode connection portion connecting the first electrode extension portion to the second electrode extension portion, wherein each of the fifth connection electrode and the sixth connection electrode comprises a connection portion disposed on the third connection electrode and the fourth connection electrode, the connection portion of the fifth connection electrode is in direct contact with the third connection electrode, and the connection portion of the sixth connection electrode is in direct contact with the fourth connection electrode.

The display device may further include a first insulating layer on the plurality of electrodes, a second insulating layer on the first insulating layer and the plurality of light emitting elements, and a third insulating layer on the second insulating layer, wherein at least a part of each of the first connection electrode, the second connection electrode, the third connection electrode, and the fourth connection electrode may be located between the second insulating layer and the third insulating layer, and at least a part of each of the fifth connection electrode, the sixth connection electrode, and the seventh connection electrode may be located on the third insulating layer.

The display device may further include a plurality of first openings on one side of the first electrode opposing the third electrode and penetrating the second insulating layer, and a plurality of second openings on one side of the second electrode opposing the fourth electrode and penetrating the second insulating layer, wherein the connection portions of the fifth connection electrode and the sixth connection electrode may be in contact with the third connection electrode and the fourth connection electrode through a plurality of third openings penetrating the third insulating layer to expose the third connection electrode and the fourth connection electrode, respectively.

The plurality of third openings may be respectively located on the first electrode and the second electrode, the connection portion of the fifth connection electrode may be in contact with the third connection electrode on the first electrode, the connection portion of the sixth connection electrode may be in contact with the fourth connection electrode on the second electrode.

The display device may further include a plurality of fourth openings on one side of the third electrode opposing the first electrode and penetrating the second insulating layer and the third insulating layer, and a plurality of fifth openings on one side of the fourth electrode opposing the second electrode and penetrating the second insulating layer and the third insulating layer.

The display device may further include a bank layer on the first insulating layer and surrounding an emission area in which the plurality of light emitting elements are located, and a sub-region located in the first direction of the emission area, wherein the second electrode and the third electrode may be partially connected to each other in the sub-region, and the first electrode may comprise a main portion extending in the first direction, and a protrusion portion bent from the main portion in the second direction to overlap the bank layer.

The display device may further include a first contact portion overlapping the protrusion portion of the first electrode in the sub-region and penetrating the first insulating layer and the second insulating layer, a second contact portion overlapping a portion where the second electrode and the third electrode are connected in the sub-region and penetrating the first insulating layer and the second insulating layer, and a third contact portion overlapping the fourth electrode in the sub-region and penetrating the first insulating layer and the second insulating layer.

The first connection electrode may be in contact with the first electrode through the first contact portion, and the second connection electrode may be in contact with the second electrode, the third electrode, and the fourth electrode through the second contact portion and the third contact portion.

In the display device according to one embodiment, connection electrodes in contact with one end of a light emitting element may be disposed on the same layer. The display device is advantageous in that it is possible to correct misalignment of an electrode pattern that may occur in the case of forming connection electrodes disposed on the same layer by shifting them in the same direction.

However, the effects, aspects, and features of embodiments of the present disclosure are not limited to the aforementioned effects, aspects, and features, and various other effects, aspects, and features are included in the specification.

BRIEF DESCRIPTION OF THE DRAWINGS

The above and other aspects and features of embodiments of the present disclosure will become more apparent by describing in detail embodiments thereof with reference to the attached drawings, in which.

DETAILED DESCRIPTION

The embodiments of the present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described with reference to the accompanying drawings.

Figure 1:
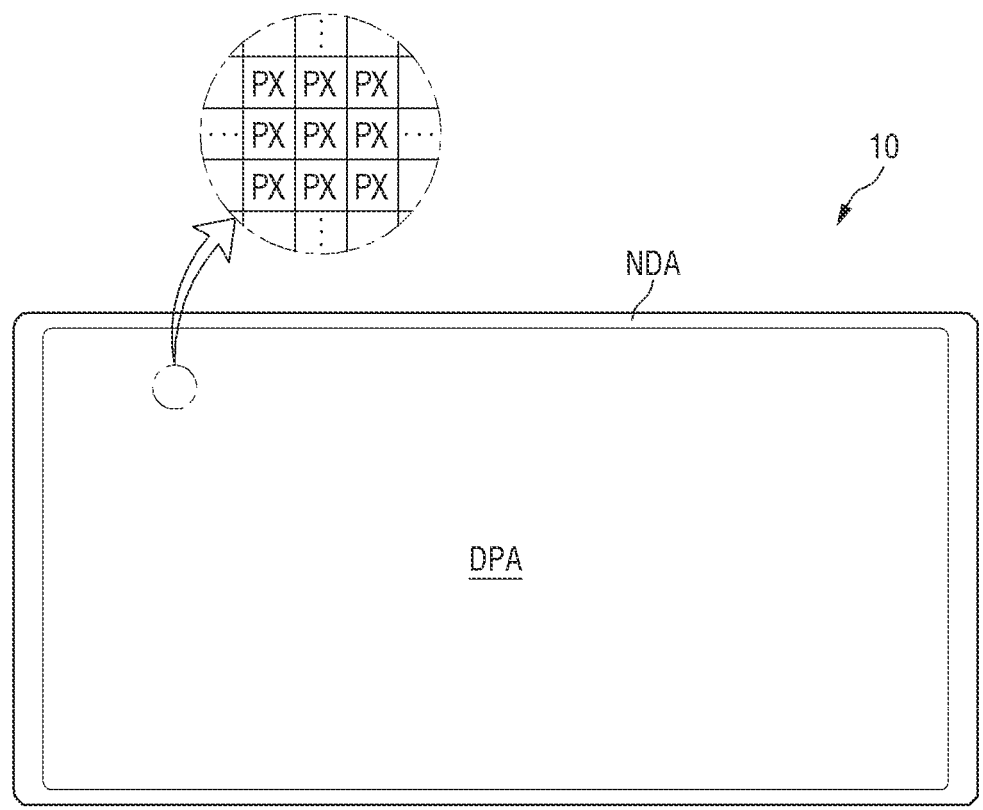
FIG. 1 is a schematic plan view of a display device according to one or more embodiments.

FIG. 1 is a schematic plan view of a display device according to one or more embodiments.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel which provides a display screen. Examples of the display panel may include an inorganic light emitting diode display panel, an organic light emitting display panel, a quantum dot light emitting display panel, a plasma display panel, and a field emission display panel. In the following description, a case where an inorganic light emitting diode display panel is applied as a display panel will be exemplified, but the present disclosure is not limited thereto, and other display panels may be applied within the same scope of technical spirit.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (e.g., vertices), another polygonal shape and a circular shape. The shape of a display area DPA of the display device 10 may also be similar to the overall shape of the display device 10. FIG. 1 illustrates the display device 10 having a rectangular shape elongated in a second direction DR2.

The display device 10 may include the display area DPA and a non-display area NDA. The display area DPA is an area where an image can be displayed, and the non-display area NDA is an area where no image is displayed. The display area DPA may also be referred to as an active region, and the non-display area NDA may also be referred to as a non-active region. The display area DPA may substantially occupy the center (or central region) of the display device 10.

The display area DPA may include a plurality of pixels PX. The plurality of pixels PX may be arranged in a matrix. For example, the plurality of pixels may be arranged along rows and columns of a matrix. The shape of each pixel PX may be a rectangular or square shape in a plan view. However, the present disclosure is not limited thereto, and it may be a rhombic shape in which each side is inclined with respect to one direction. The pixels PX may be arranged in a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. In addition, each of the pixels PX may include one or more light emitting elements that emit light of a specific wavelength band to display a specific color.

The non-display area NDA may be disposed around the display area DPA along the edge or periphery of the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
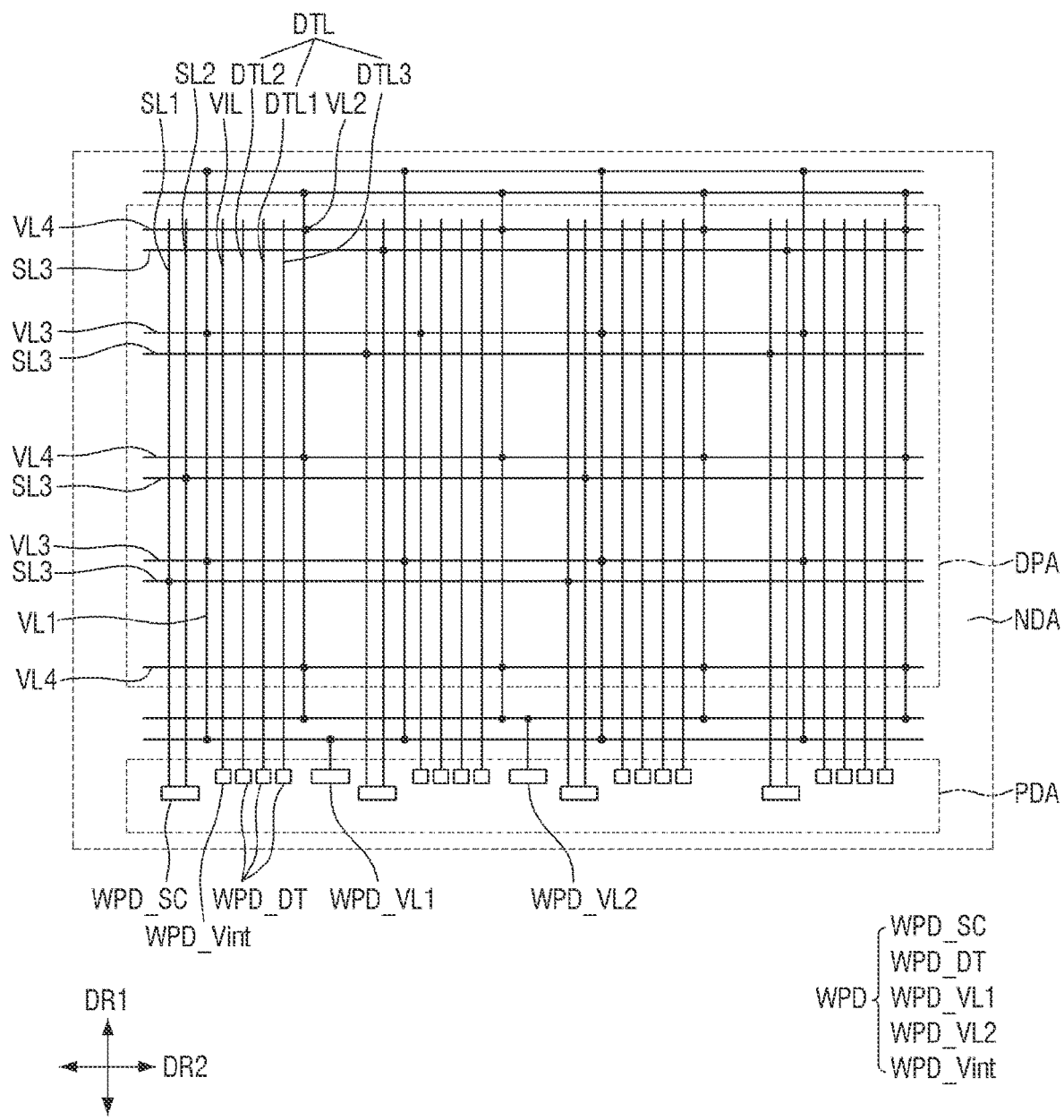
FIG. 2 is a plan view illustrating an arrangement of a plurality of wires included in a display device according to one or more embodiments.

FIG. 2 is a plan view illustrating an arrangement of a plurality of wires included in a display device according to one or more embodiments.

Referring to FIG. 2, the display device 10 may include a plurality of wires. The display device 10 may include a plurality of scan lines SL1, SL2, and SL3, a plurality of data lines DTL (DTL1, DTL2, and DTL3), an initialization voltage line VIL, and a plurality of voltage lines VL (VL1, VL2, VL3, and VL4). In one or more embodiments, other wires may be further provided in the display device 10.

The first scan line SL1 and the second scan line SL2 may be disposed to extend in the first direction DR1. The first scan line SL1 and the second scan line SL2 may be disposed adjacent to each other, and may be disposed to be spaced from the different first scan line SL1 and second scan line SL2 in the second direction DR2. The first scan line SL1 and the second scan line SL2 may be connected to a scan line pad WPD_SC connected to a scan driver. The first scan line SL1 and the second scan line SL2 may be disposed to extend from the pad area PDA disposed in the non-display area NDA to the display area DPA.

The third scan line SL3 may be disposed to extend in the second direction DR2, and may be disposed to be spaced from the other third scan line SL3 in the first direction DR1. One third scan line SL3 may be connected to one or more first scan lines SL1 or one or more second scan lines SL2.

In one or more embodiments, the first scan line SL1 and the second scan line SL2 may be formed as a conductive layer disposed on a different layer from the third scan line SL3. The plurality of scan lines SL1, SL2, and SL3 may have a mesh structure in the entire surface of the display area DPA, but the present disclosure is not limited thereto.

The term "connected" as used herein may mean not only that one member is connected to another member through a physical contact, but also that one member is connected to another member through yet another member. This may also be understood as one part and the other part as integral elements are connected into an integrated element via another element. Furthermore, if one element is connected to another element, this may be construed as a meaning including an electrical connection via another element in addition to a direct connection in physical contact.

The data lines DTL may be disposed to extend in the first direction DR1. The data line DTL includes a first data line DTL1, a second data line DTL2, and a third data line DTL3, and each one of the first to third data lines DTL1, DTL2, and DTL3 forms a pair and is disposed adjacent to each other. Each of the data lines DTL1, DTL2, and DTL3 may be disposed to extend from the pad area PDA disposed in the non-display area NDA to the display area DPA. However, the present disclosure is not limited thereto, and the plurality of data lines DTL may be spaced from each other at equal intervals between a first voltage line VL1 and a second voltage line VL2 to be described later.

The initialization voltage line VIL may be disposed to extend in the first direction DR1. The initialization voltage line VIL may be disposed between the data lines DTL and the first scan line SL1 and the second scan line SL2. In one or more embodiments, the initialization voltage line VIL may be disposed between the data lines DTL and the first voltage line VL1. The initialization voltage line VIL may be disposed to extend from the pad area PDA disposed in the non-display area NDA to the display area DPA.

The first voltage line VL1 and the second voltage line VL2 are disposed to extend in the first direction DR1, and the third voltage line VL3 and the fourth voltage line VL4 are disposed to extend in the second direction DR2. The first voltage line VL1 and the second voltage line VL2 may be alternately disposed along the second direction DR2, and the third voltage line VL3 and the fourth voltage line VL4 may be alternately disposed along the first direction DR1. The first voltage line VL1 and the second voltage line VL2 may be disposed to extend in the first direction DR1 to cross the display area DPA, and as for the third voltage line VL3 and the fourth voltage line VL4, some of the wires may be disposed in the display area DPA and other wires may be disposed in the non-display area NDA positioned on both sides of the display area DPA in the first direction DR1, respectively. The first voltage line VL1 and the second voltage line VL2 may be formed as a conductive layer disposed on a different layer from the third voltage line VL3 and the fourth voltage line VL4. The first voltage line VL1 may be connected to at least one third voltage line VL3, the second voltage line VL2 may be connected to at least one fourth voltage line VL4, and the plurality of voltage lines VL may have a mesh structure in the entire display area DPA. However, the present disclosure is not limited thereto.

The first scan line SL1, the second scan line SL2, the data line DTL, the initialization voltage line VIL, the first voltage line VL1, and the second voltage line VL2 may be electrically connected to at least one line pad WPD. Each line pad WPD may be disposed in the non-display area NDA. In one or more embodiments, each of the line pads WPD may be disposed in the pad area PDA positioned on the lower side, which is the other side of the display area DPA in the first direction DR1. The first scan line SL1 and the second scan line SL2 are connected to the scan line pad WPD_SC disposed in the pad area PDA, and the plurality of data lines DTL are connected to the data line pads WPD_DT different from each other, respectively. The initialization voltage line VIL is connected to an initialization line pad WPD Vint, the first voltage line VL1 is connected to a first voltage line pad WPD_VL1, and the second voltage line VL2 is connected to a second voltage line pad WPD_VL2. The external devices may be mounted on the line pads WPD. The external devices may be mounted on the line pads WPD by applying an anisotropic conductive film, ultrasonic bonding or the like. The drawing exemplifies that each of the line pads WPD is disposed on the pad area PDA disposed on the lower side of the display area DPA, but is not limited thereto. Some of the plurality of line pads WPD may be disposed in any one area on the upper side or on the left and right sides of the display area DPA.

Each pixel PX or sub-pixel SPXn (n is an integer of 1 to 3) of the display device 10 includes a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified. According to one or more embodiments, in each sub-pixel SPXn, the pixel driving circuit may have a 3T1C structure including three transistors and one capacitor. Hereinafter, the pixel driving circuit of the 3T1C structure will be described as an example, but the present disclosure is not limited thereto, and various other modified structures such as a 2T1C structure, a 7T1C structure, and a 6T1C structure may be applied.

Figure 3:
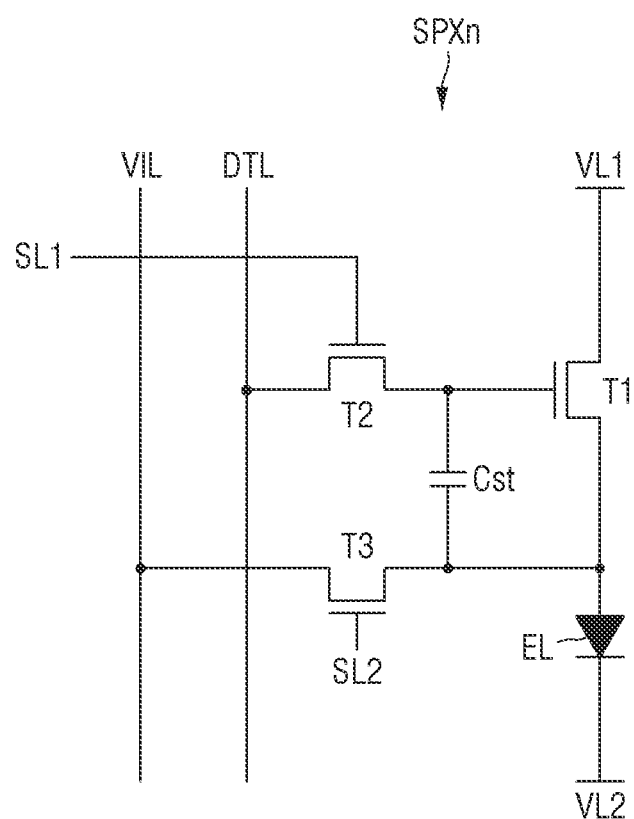
FIG. 3 is an equivalent circuit diagram of one sub-pixel of a display device according to one or more embodiments.

FIG. 3 is an equivalent circuit diagram of one sub-pixel of a display device according to one or more embodiments.

Referring to FIG. 3, each sub-pixel SPXn of the display device 10 according to one or more embodiments includes three transistors T1, T2, and T3 and one storage capacitor Cst in addition to a light emitting diode EL.

The light emitting diode EL emits light by a current supplied through a first transistor T1. The light emitting diode EL includes a first electrode, a second electrode, and at least one light emitting element disposed between them. The light emitting element may emit light of a specific wavelength band by electrical signals transmitted from the first electrode and the second electrode.

One end of the light emitting diode EL may be connected to the source electrode of the first transistor T1, and the other end thereof may be connected to the second voltage line VL2 to which a low potential voltage (hereinafter, a second power voltage) lower than a high potential voltage (hereinafter, a first power voltage) of the first voltage line VL1 is supplied.

The first transistor T1 adjusts a current flowing from the first voltage line VL1, to which the first power voltage is supplied, to the light emitting diode EL according to the voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VL1 to which the first power voltage is applied.

The second transistor T2 is turned on by a scan signal of a first scan line SL1 to connect the data line DTL to the gate electrode of the first transistor T1. The gate electrode of the second transistor T2 may be connected to the first scan line SL1, the source electrode thereof may be connected to the gate electrode of the first transistor T1, and the drain electrode thereof may be connected to the data line DTL.

The third transistor T3 is turned on by a scan signal of the second scan line SL2 to connect the initialization voltage line VIL to one end of the light emitting diode EL. The gate electrode of the third transistor T3 may be connected to the second scan line SL2, the drain electrode thereof may be connected to the initialization voltage line VIL, and the source electrode thereof may be connected to one end of the light emitting diode EL or to the source electrode of the first transistor T1.

In one or more embodiments, the source electrode and the drain electrode of each of the transistors T1, T2, and T3 are not limited to those described above, and vice versa. Further, each of the transistors T1, T2, and T3 may be formed of a thin film transistor. In addition, in FIG. 3, each of the transistors T1, T2, and T3 has been described as being formed of an N-type metal oxide semiconductor field effect transistor (MOSFET), but is not limited thereto. For example, each of the transistors T1, T2, and T3 may be formed of a P-type MOSFET. Alternatively, some of the transistors T1, T2, and T3 may be formed of an N-type MOSFET and the others may be formed of a P-type MOSFET.

The storage capacitor Cst is formed between the gate electrode and the source electrode of the first transistor T1. The storage capacitor Cst stores a difference voltage between a gate voltage and a source voltage of the first transistor T1.

Figure 4:
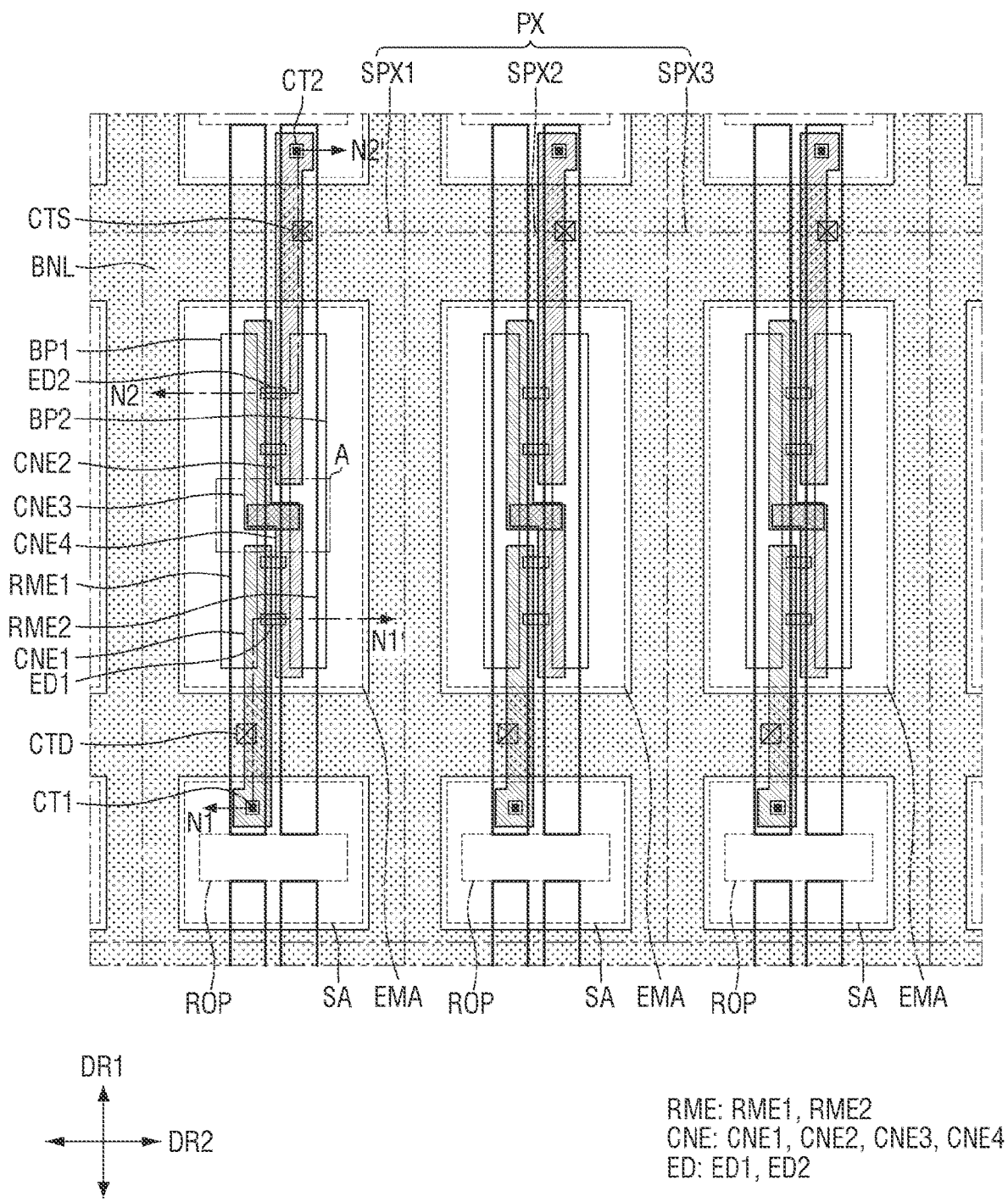
FIG. 4 is a plan view illustrating one pixel of a display device according to one or more embodiments.

FIG. 4 is a plan view illustrating one pixel of a display device according to one or more embodiments. FIG. 4 illustrates the planar arrangement of electrodes RME (RME1 and RME2), bank patterns BP1 and BP2, a bank layer BNL, a plurality of light emitting elements ED (ED1 and ED2), and connection electrodes CNE (CNE1, CNE2, CNE3, and CNE4) disposed in one pixel PX of the display device 10.

Referring to FIG. 4, each of the pixels PX of the display device 10 may include a plurality of sub-pixels SPXn. For example, one pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the present disclosure is not limited thereto, and the sub-pixels SPXn may emit light of the same color. In one or more embodiments, each of the sub-pixels SPXn may emit blue light. Although it is illustrated in the drawing that one pixel PX includes three sub-pixels SPXn, the present disclosure is not limited thereto, and the pixel PX may include a larger number of sub-pixels SPXn.

Each sub-pixel SPXn of the display device 10 may include an emission area EMA and a non-emission area. The emission area EMA may be an area in which the light emitting element ED is disposed to emit light of a specific wavelength band. The non-emission area may be a region in which the light emitting element ED is not disposed and a region from which light is not emitted because light emitted from the light emitting element ED does not reach it.

The emission area EMA may include the region in which the light emitting element ED is disposed, and a region adjacent to the light emitting element ED in which the lights emitted from the light emitting element ED are emitted. For example, the emission area EMA may further include a region in which the light emitted from the light emitting element ED is reflected or refracted by another member and emitted. The plurality of light emitting elements ED may be disposed in the respective sub-pixels SPXn, and the emission area EMA may be formed to include an area where the light emitting elements 30 are disposed and an area adjacent thereto.

Although it is shown in the drawing that the sub-pixels SPXn have the emission areas EMA that are substantially identical in size, the present disclosure is not limited thereto. In one or more embodiments, the emission areas EMA of the sub-pixels SPXn may have different sizes according to a color or wavelength band of light emitted from the light emitting element ED disposed in each sub-pixel.

Each sub-pixel SPXn may further include a sub-region SA disposed in the non-emission area. The sub-region SA of the corresponding sub-pixel SPXn may be disposed on the lower side of the emission area EMA, which is the other side in the first direction DR1. The emission area EMA and the sub-region SA may be alternately arranged along the first direction DR1, and the sub-region SA may be disposed between the emission areas EMA of different sub-pixels SPXn spaced from each other in the first direction DR1. For example, the emission area EMA and the sub-region SA may be alternately arranged along the first direction DR1, and each of the emission area EMA and the sub-region SA may be repeatedly arranged along the second direction DR2. However, the present disclosure is not limited thereto, and the arrangement of the emission areas EMA and the sub-regions SA in the plurality of pixels PX may be different from that shown in FIG. 4.

Light may not be emitted from the sub-region SA because the light emitting element ED is not disposed in the sub-region SA, but an electrode RME disposed in each sub-pixel SPXn may be partially disposed in the sub-region SA. The electrodes RME disposed in different sub-pixels SPXn may be disposed to be separated at a separation portion ROP of the sub-region SA.

The wires and the circuit elements of the circuit layer may be connected to the first to third sub-pixels SPX1, SPX2, and SPX3. However, the wires and the circuit elements may not be disposed to correspond to the area occupied by each sub-pixel SPXn or the emission area EMA, and may be disposed regardless of the position of the emission area EMA within one pixel PX.

The bank layer BNL may be disposed to be around (or surround) the plurality of sub-pixels SPXn, the emission area EMA, and the sub-region SA. The bank layer BNL may be disposed at the boundary between the sub-pixels SPXn adjacent in the first direction DR1 and the second direction DR2, and may also be disposed at the boundary between the emission area EMA and the sub-region SA. The sub-pixels SPXn, the emission area EMA, and the sub-region SA of the display device 10 may be the areas distinguished by the arrangement of the bank layer BNL. The gaps between the plurality of sub-pixels SPXn, the emission areas EMA, and the sub-regions SA may vary depending on the width of the bank layer BNL.

The bank layer BNL may include portions extending in the first direction DR1 and the second direction DR2 in a plan view to be arranged in a grid pattern over the entire surface of the display area DPA. The bank layer BNL may be disposed along the boundaries between the sub-pixels SPXn to delimit the neighboring sub-pixels SPXn. The bank layer BNL may also be arranged to be around (or surround) the emission area EMA and the sub-region SA disposed for each sub-pixel SPXn to delimit them from each other. Hereinafter, the structure of the display device 10 will be described in detail with reference to other drawings.

Figure 5:
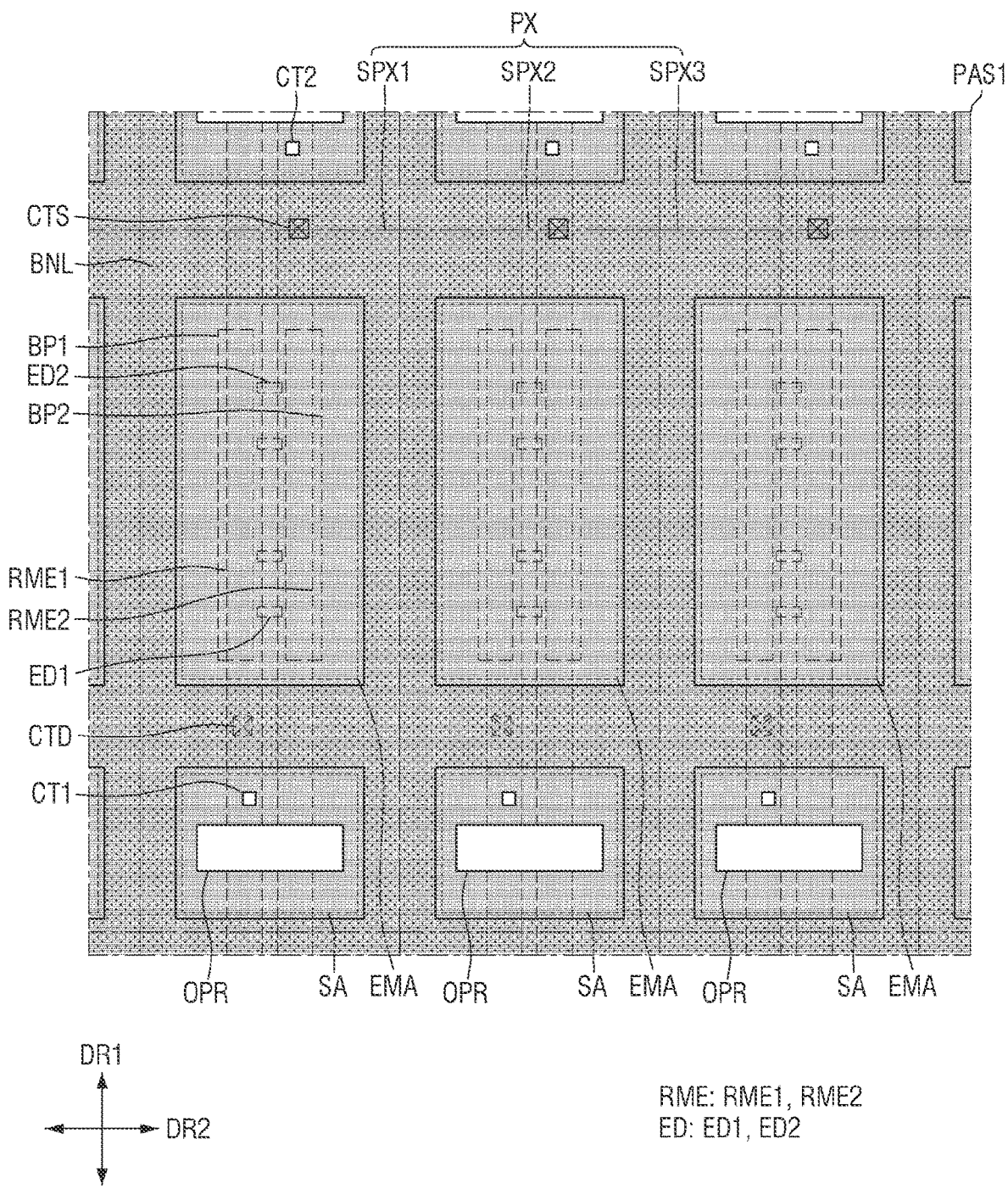
FIG. 5 is a plan view illustrating a first insulating layer disposed in one pixel of FIG. 4.
Figure 6:
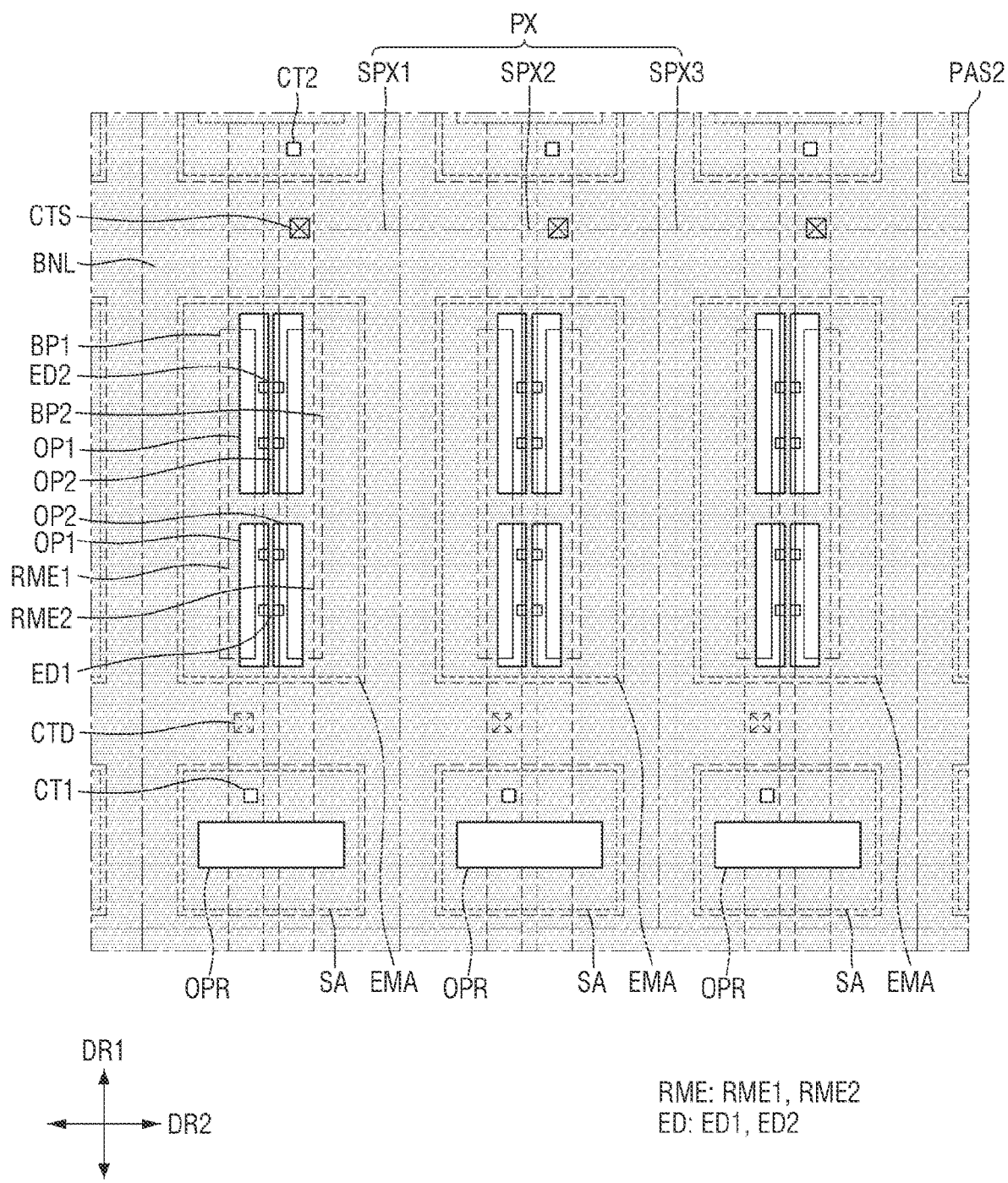
FIG. 6 is a plan view illustrating a second insulating layer disposed in one pixel of FIG. 4.
Figure 7:
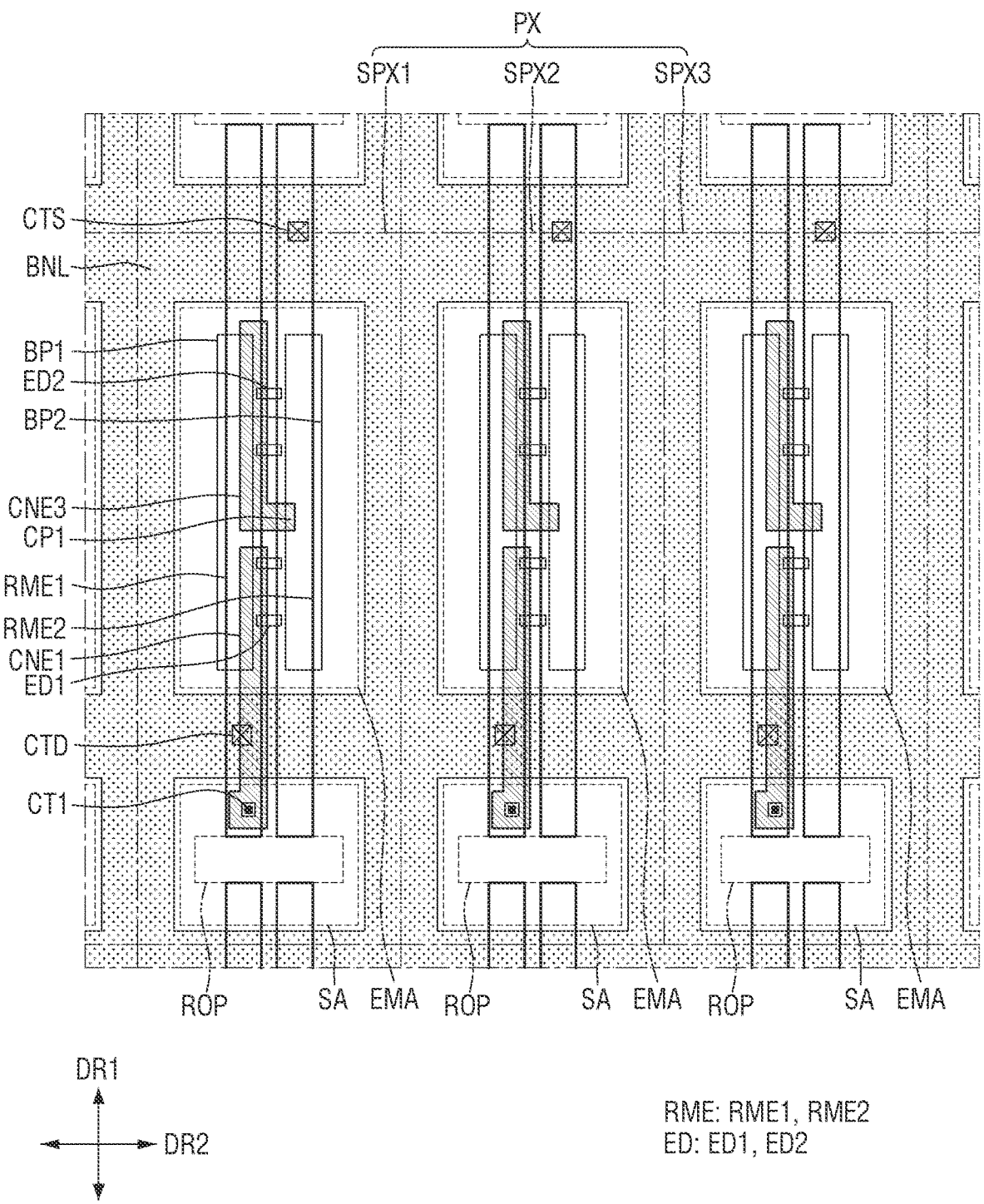
FIG. 7 is a plan view illustrating a first connection electrode layer disposed in one pixel of FIG. 4.
Figure 8:
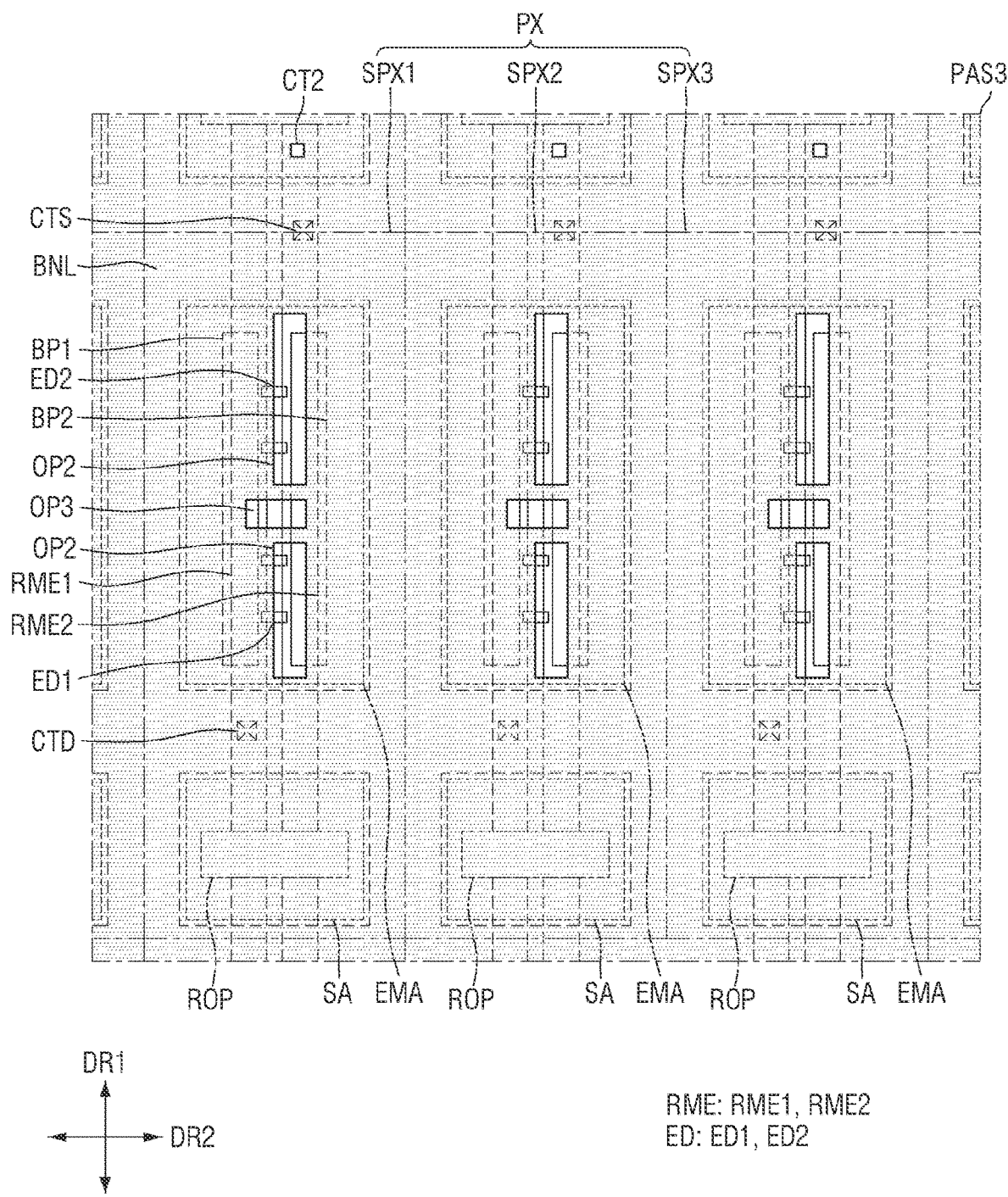
FIG. 8 is a plan view illustrating a third insulating layer disposed in one pixel of FIG. 4.
Figure 9:
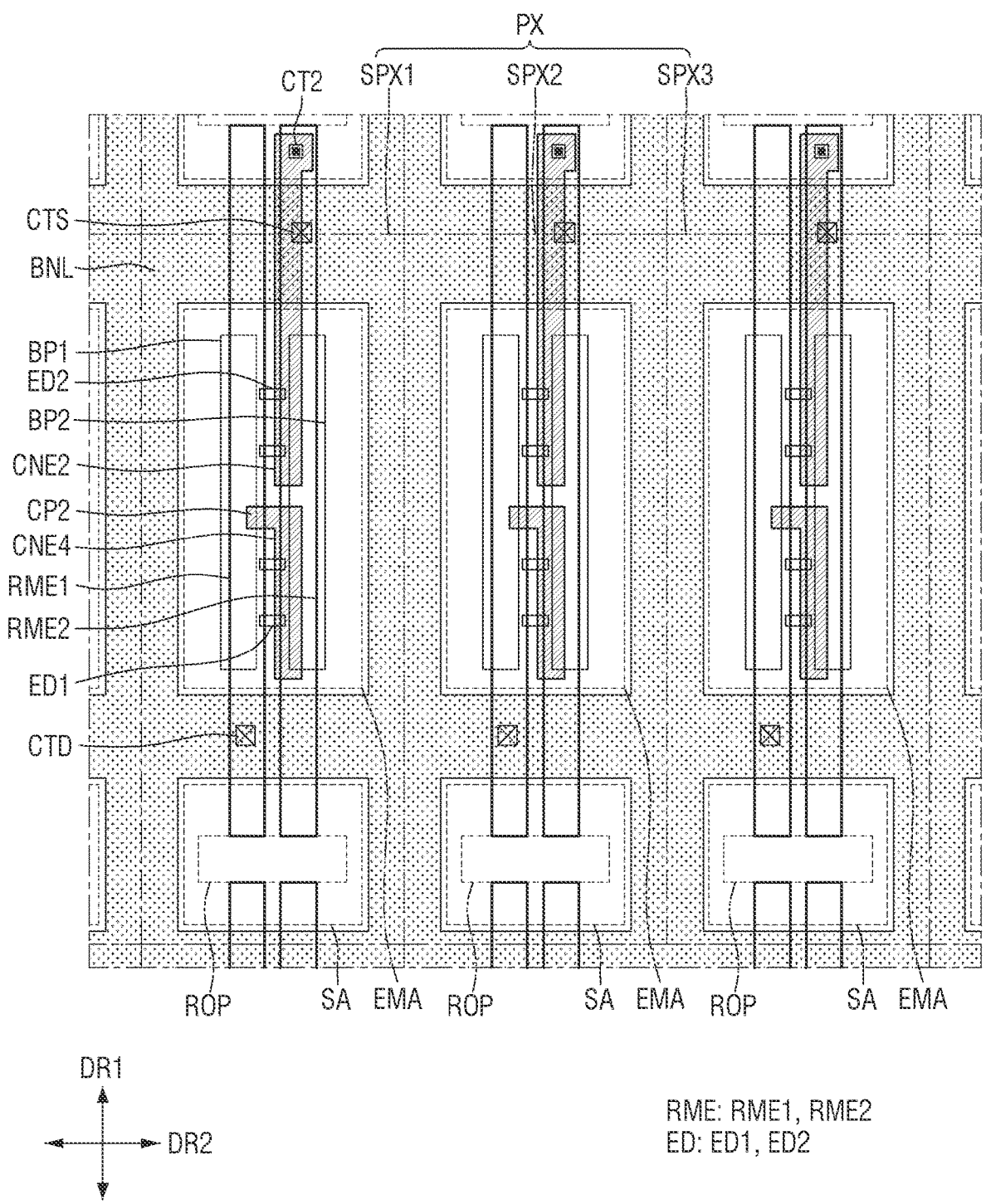
FIG. 9 is a plan view illustrating a second connection electrode layer disposed in one pixel of FIG. 4.
Figure 10:
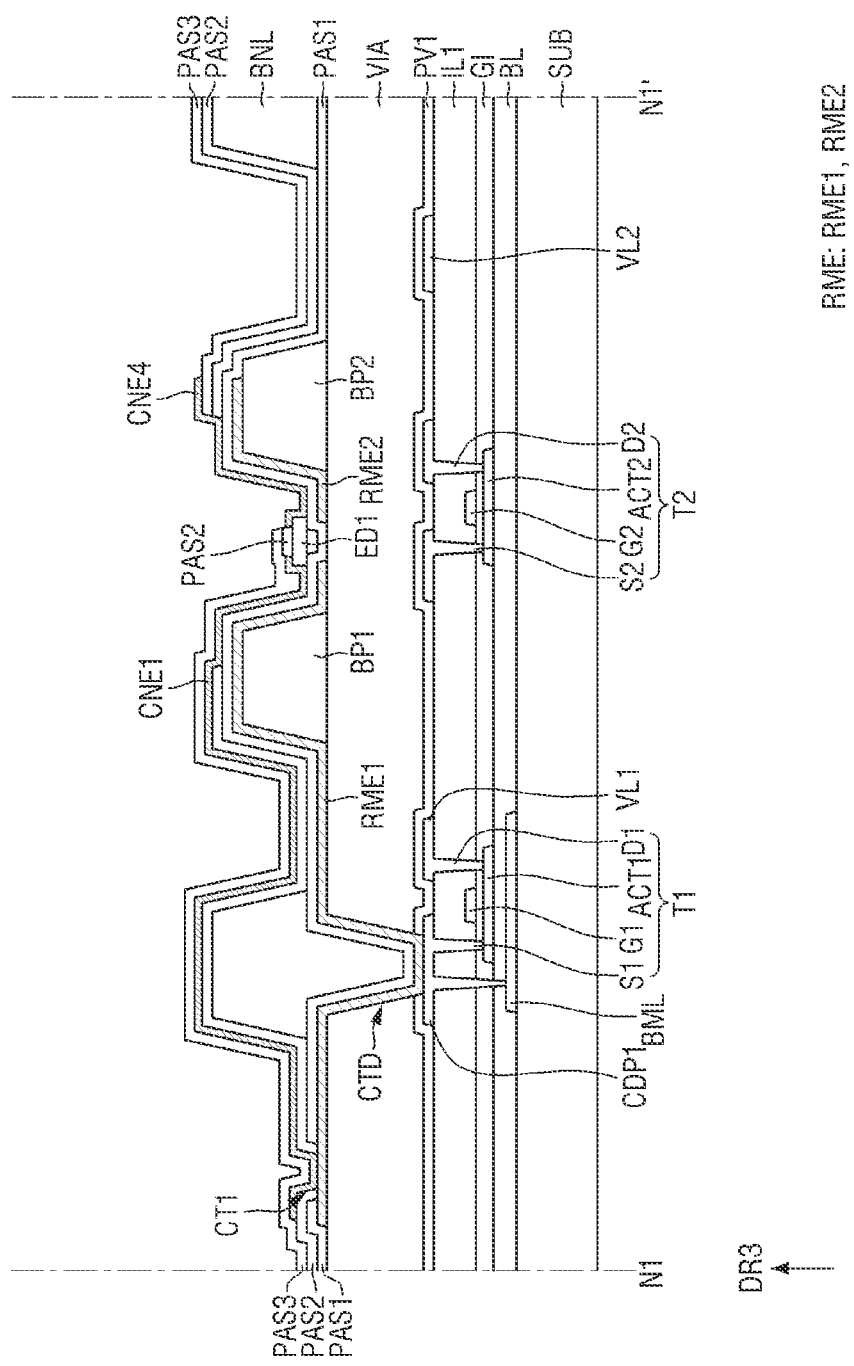
FIG. 10 is a cross-sectional view taken along the line N1-N1' of FIG. 4.
Figure 11:
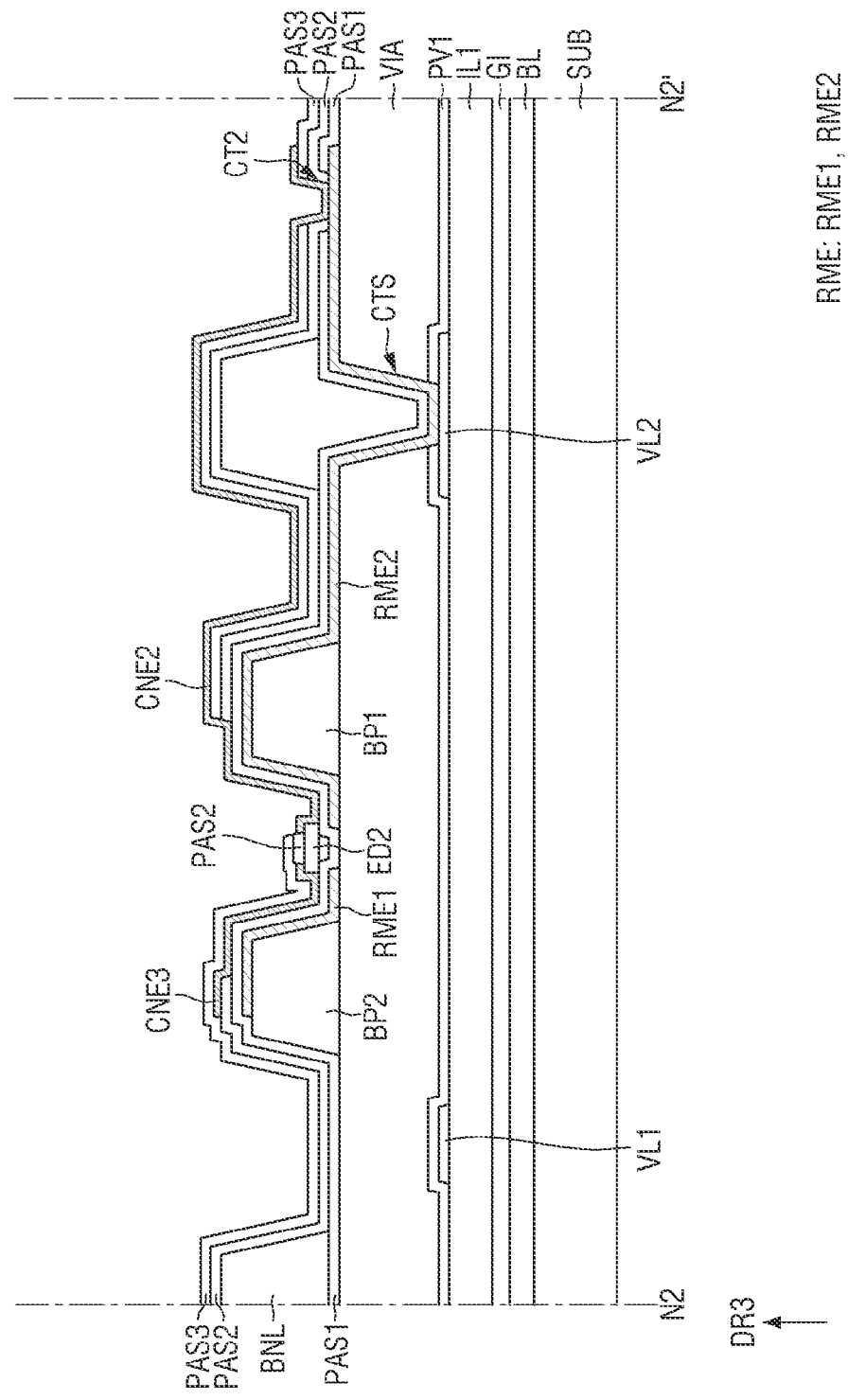
FIG. 11 is a cross-sectional view taken along the line N2-N2' of FIG. 4.

FIG. 5 is a plan view illustrating a first insulating layer disposed in one pixel of FIG. 4. FIG. 6 is a plan view illustrating a second insulating layer disposed in one pixel of FIG. 4. FIG. 7 is a plan view illustrating a first connection electrode layer disposed in one pixel of FIG. 4. FIG. 8 is a plan view illustrating a third insulating layer disposed in one pixel of FIG. 4. FIG. 9 is a plan view illustrating a second connection electrode layer disposed in one pixel of FIG. 4. FIG. 10 is a cross-sectional view taken along the line N1-N1' of FIG. 4. FIG. 11 is a cross-sectional view taken along the line N2-N2' of FIG. 4.

FIGS. 5 to 9 illustrate the planar arrangement of a plurality of insulating layers PAS1, PAS2, and PAS3 that are different layers disposed in one pixel PX, and the connection electrodes CNE1, CNE2, CNE3, and CNE4. FIG. 5 illustrates the planar arrangement of the first insulating layer PAS1 disposed under the bank layer BNL, and FIGS. 6 and 8 illustrate the planar arrangement of the second insulating layer PAS2 and the third insulating layer PAS3 disposed above the bank layer BNL. FIG. 10 illustrates a cross section across both ends of the first light emitting element ED1, a first electrode contact hole CTD, and a first contact portion CT1 disposed in the first sub-pixel SPX1, and FIG. 11 illustrates a cross section across both ends of the second light emitting element ED2, a second electrode contact hole CTS, and a second contact portion CT2 disposed in the first sub-pixel SPXn.

Referring to FIGS. 5 to 11 in conjunction with FIG. 4, the display device 10 may include a first substrate SUB and a semiconductor layer, a plurality of conductive layers, and a plurality of insulating layers disposed on the first substrate SUB. The semiconductor layer, the conductive layers, and the insulating layers may each constitute a circuit layer and a display element layer of the display device 10.

The first substrate SUB may be an insulating substrate. The first substrate SUB may be made of an insulating material such as glass, quartz, or polymer resin. Further, the first substrate SUB may be a rigid substrate, but may also be a flexible substrate which can be bent, folded and/or rolled. The first substrate SUB may include the display area DPA and the non-display area NDA around (or surrounding) the display area DPA, and the display area DPA may include the emission area EMA and the sub-region SA that is a part of the non-emission area.

A first conductive layer may be disposed on the first substrate SUB. The first conductive layer includes a lower metal layer BML that is disposed to overlap an active layer ACT1 of a first transistor T1 in a thickness direction of the substrate SUB (e.g., a third direction DR3). The lower metal layer BML may include a material of blocking light to prevent light from reaching the active layer ACT1 of the first transistor T1. However, the lower metal layer BML may be omitted.

The buffer layer BL may be disposed on the lower metal layer BML and the first substrate SUB. The buffer layer BL may be formed on the first substrate SUB to protect the transistors of the pixel PX from moisture permeating through the first substrate SUB susceptible to moisture permeation, and may perform a surface planarization function.

The semiconductor layer is disposed on the buffer layer BL. The semiconductor layer may include the first active layer ACT1 of the first transistor T1 and a second active layer ACT2 of the second transistor T2. The first active layer ACT1 and the second active layer ACT2 may be disposed to partially overlap a first gate electrode G1 and a second gate electrode G2 in the third direction DR3 of a second conductive layer to be described later, respectively.

The semiconductor layer may include polycrystalline silicon, monocrystalline silicon, oxide semiconductor, and the like. In one or more embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

Although it is illustrated in the drawing that one first transistor T1 and one second transistor T2 are disposed in the sub-pixel SPXn of the display device 10, the present disclosure is not limited thereto and the display device 10 may include a larger number of transistors.

The first gate insulating layer GI is disposed on the semiconductor layer and the buffer layer BL. The first gate insulating layer GI may serve as a gate insulating layer of each of the transistors T1 and T2.

The second conductive layer is disposed on the first gate insulating layer GI. The second conductive layer may include a first gate electrode G1 of the first transistor T1 and a second gate electrode G2 of the second transistor T2. The first gate electrode G1 may be disposed to overlap the channel region of the first active layer ACT1 in the third direction DR3 that is the thickness direction, and the second gate electrode G2 may be disposed to overlap the channel region of the second active layer ACT2 in the third direction DR3 that is the thickness direction. In one or more embodiments, the second conductive layer may further include one electrode of the storage capacitor.

A first interlayer insulating layer IL1 is disposed on the second conductive layer. The first interlayer insulating layer IL1 may function as an insulating film between the second conductive layer and other layers disposed thereon, and may protect the second conductive layer.

A third conductive layer is disposed on the first interlayer insulating layer IL1. The third conductive layer may include the first voltage line VL1 and the second voltage line VL2, a first conductive pattern CDP1, a source electrode S1 and a drain electrode D1 of the transistor T1, and a source electrode S2 and a drain electrode D2 of the transistor T2 that are disposed in the display area DPA. In one or more embodiments, the third conductive layer may further include the other electrode of the storage capacitor.

The first voltage line VL1 may be applied with a high potential voltage (or a first power voltage) transmitted to the first electrode RME1, and the second voltage line VL2 may be applied with a low potential voltage (or a second power voltage) transmitted to the second electrode RME2. A part of the first voltage line VL1 may be in contact with the first active layer ACT1 of the first transistor T1 through a contact hole penetrating the first interlayer insulating layer IL1 and the first gate insulating layer GI. The first voltage line VL1 may serve as a first drain electrode D1 of the first transistor T1. The second voltage line VL2 may be directly connected to the second electrode RME2 to be described later.

The first conductive pattern CDP1 may be in contact with the first active layer ACT1 of the first transistor T1 through a contact hole penetrating the first interlayer insulating layer IL1 and the first gate insulating layer GI. The first conductive pattern CDP1 may be in contact with the lower metal layer BML through another contact hole penetrating the first interlayer insulating layer IL1, the first gate insulating layer GI, and the buffer layer BL. The first conductive pattern CDP1 may serve as a first source electrode S1 of the first transistor T1. Further, the first conductive pattern CDP1 may be connected to the first electrode RME1 or the first connection electrode CNE1 to be described later. The first transistor T1 may transmit the first power voltage applied from the first voltage line VL1 to the first electrode RME1 or the first connection electrode CNE1.

The second source electrode S2 and the second drain electrode D2 may be in contact with the second active layer ACT2 of the second transistor T2 through respective contact holes penetrating the first interlayer insulating layer IL1 and the first gate insulating layer GI.

A first passivation layer PV1 is disposed on the third conductive layer. The first passivation layer PV1 may function as an insulating layer between the third conductive layer and other layers and may protect the third conductive layer.

The buffer layer BL, the first gate insulating layer GI, the first interlayer insulating layer IL1, and the first passivation layer PV1 described above may be formed of a plurality of inorganic layers stacked in an alternating manner. For example, the buffer layer BL, the first gate insulating layer GI, the first interlayer insulating layer IL1, and the first passivation layer PV1 may be formed as a double layer formed by stacking, or a multilayer formed by alternately stacking, inorganic layers including at least one of silicon oxide (SiOx), silicon nitride (SiNx), or silicon oxynitride (SiOxNy). However, the present disclosure is not limited thereto, and the buffer layer BL, the first gate insulating layer GI, the first interlayer insulating layer IL1, and the first passivation layer PV1 may be formed as a single inorganic layer containing the above-described insulating material. Further, in one or more embodiments, the first interlayer insulating layer IL1 may be made of an organic insulating material such as polyimide (PI) or the like.

The second conductive layer and the third conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, the present disclosure is not limited thereto.

A via layer VIA is disposed on the third conductive layer in the display area DPA. The via layer VIA may contain an organic insulating material, e.g., polyimide (PI), and may compensate the stepped portion formed by the conductive layers disposed thereunder to flatten the top surface. However, in one or more embodiments, the via layer VIA may be omitted.

A plurality of bank patterns BP1 and BP2, a plurality of electrodes RME (RME1 and RME2), the bank layer BNL, the plurality of light emitting elements ED, and a plurality of connection electrodes CNE (CNE1, CNE2, CNE3, CNE4) are disposed on the via layer VIA. Further, a plurality of insulating layers PAS1, PAS2, and PAS3 may be disposed on the via layer VIA.

The plurality of bank patterns BP1 and BP2 may be disposed in the emission area EMA of each sub-pixel SPXn. The bank patterns BP1 and BP2 may have a suitable width (e.g., a predetermined width) in the second direction DR2 and may have a shape extending in the first direction DR1.

For example, the bank patterns BP1 and BP2 may include a first bank pattern BP1 and a second bank pattern BP2 spaced from each other in the second direction DR2 in the emission area EMA of each sub-pixel SPXn. The first bank pattern BP1 may be disposed on the left side with respect to the center of the emission area EMA, which is one side in the second direction DR2, and the second bank patterns BP2 may be disposed on the right side with respect to the center of the emission area EMA, which is the other side in the second direction DR2, while being spaced from the first bank pattern BP1. The first bank pattern BP1 and the second bank pattern BP2 may be alternately disposed along the second direction DR2 and may be disposed in an island-shaped pattern in the display area DPA. The plurality of light emitting elements ED may be arranged between the first bank pattern BP1 and the second bank pattern BP2.

The lengths of the first bank pattern BP1 and the second bank pattern BP2 in the first direction DR1 may be the same, and may be smaller than the length of the emission area EMA surrounded by the bank layer BNL in the first direction DR1. The first bank pattern BP1 and the second bank pattern BP2 may be spaced from a portion of the bank layer BNL extending in the second direction DR2. However, the present disclosure is not limited thereto, and the bank patterns BP1 and BP2 may be integrated with the bank layer BNL, or may partially overlap the portion of the bank layer BNL extending in the second direction DR2. In this case, the lengths of the bank patterns BP1 and BP2 in the first direction DR1 may be greater than or equal to the length of the emission area EMA surrounded by the bank layer BNL in the first direction DR1.

The widths of the first bank pattern BP1 and the second bank pattern BP2 in the second direction DR2 may be the same. However, the present disclosure is not limited thereto, and they may have different widths. For example, one bank pattern may have a larger width than the other bank pattern, and the bank pattern having a larger width may be disposed across the emission areas EMA of different sub-pixels SPXn adjacent in the second direction DR2. In this case, in the bank pattern disposed across the plurality of emission areas EMA, a portion of the bank layer BNL extending in the first direction DR1 may overlap the second bank pattern BP2 in the thickness direction (e.g., the third direction DR3). Although it is illustrated in the drawing that two bank patterns BP1 and BP2 having the same width are arranged for each sub-pixel SPXn, the present disclosure is not limited thereto. The number and the shape of the bank patterns BP1 and BP2 may vary depending on the number or the arrangement structure of the electrodes RME.

The plurality of bank patterns BP1 and BP2 may be disposed on the via layer VIA. For example, each of the bank patterns BP1 and BP2 may be directly disposed on the via layer VIA, and may have a structure in which at least a part thereof protrudes with respect to the top surface of the via layer VIA. The protruding parts of the bank patterns BP1 and BP2 may have inclined or curved surfaces, and the light emitted from the light emitting element ED may be reflected by the electrode RME disposed on the bank patterns BP1 and BP2 and emitted in the upward direction of the via layer VIA. Unlike the example illustrated in the drawing, the bank patterns BP1 and BP2 may have a shape of a semi-circle whose outer surface is curved in cross-sectional view. The bank patterns BP1 and BP2 may include an organic insulating material such as polyimide (PI), but is not limited thereto.

The plurality of electrodes RME (RME1 and RME2) have a shape extending in one direction and are disposed for each sub-pixel SPXn. The plurality of electrodes RME1 and RME2 may extend in the first direction DR1 to be disposed across the emission area EMA of the sub-pixel SPXn and the sub-region SA, and may be disposed to be spaced from each other in the second direction DR2. The plurality of electrodes RME may be electrically connected to the light emitting element ED to be described later, but the present disclosure is not limited thereto. The plurality of electrodes RME may not be electrically connected to the light emitting element ED.

The display device 10 may include the first electrode RME1 and the second electrode RME2 arranged in each sub-pixel SPXn. The first electrode RME1 is located on the left side with respect to the center of the emission area EMA, and the second electrode RME2 is located on the right side with respect to the center of the emission area EMA while being spaced from the first electrode RME1 in the second direction DR2. A first electrode RME1 may be disposed on the first bank pattern BP1, and a second electrode RME2 may be disposed on the second bank pattern BP2. The first electrode RME1 and the second electrode RME2 may be partially arranged in the corresponding sub-pixel SPXn and the sub-region SA over the bank layer BNL. The first electrode RME1 and the second electrode RME2 of different sub-pixels SPXn may be separated with respect to the separation portion ROP located in the sub-region SA of one sub-pixel SPXn.

Although it is illustrated in the drawing that two electrodes RME have a shape extending in the first direction DR1 for each sub-pixel SPXn, the present disclosure is not limited thereto. For example, the display device 10 may have a shape in which a larger number of electrodes RME are disposed in one sub-pixel SPXn or the electrodes RME are partially bent and have different widths depending on positions.

The first electrode RME1 and the second electrode RME2 may be arranged at least on the inclined surfaces of the bank patterns BP1 and BP2. In one or more embodiments, the widths of the plurality of electrodes RME measured in the second direction DR2 may be smaller than the widths of the bank patterns BP1 and BP2 measured in the second direction DR2, and the gap between the first electrode RME1 and the second electrode RME2 in the second direction DR2 may be smaller than the gap between the bank patterns BP1 and BP2. At least a part of the first electrode RME1 and the second electrode RME2 may be directly arranged on the via layer VIA, so that the first electrode RME1 and the second electrode RME2 may be arranged on or at the same plane.

The light emitting element ED disposed between the bank patterns BP1 and BP2 may emit light toward both ends, and the emitted light may be directed toward the electrodes RME disposed on the bank patterns BP1 and BP2. The electrodes RME may have a structure in which portions thereof disposed on the bank patterns BP1 and BP2 may reflect the light emitted from the light emitting element ED. The first electrode RME1 and the second electrode RME2 may be arranged to cover at least one side surfaces of the bank patterns BP1 and BP2 and may reflect the light emitted from the light emitting element ED.

The electrodes RME may be in direct contact with the third conductive layer through the electrode contact holes CTD and CTS at the portions overlapping the bank layer BNL between the emission area EMA and the sub-region SA. The first electrode contact hole CTD may be formed in an area in which the bank layer BNL and the first electrode RME1 overlap, and the second electrode contact hole CTS may be formed in an area in which the bank layer BNL and the second electrode RME2 overlap. The first electrode RME1 may be in contact with the first conductive pattern CDP1 through the first electrode contact hole CTD penetrating the via layer VIA and the first passivation layer PV1. The second electrode RME2 may be in contact with the second voltage line VL2 through the second electrode contact hole CTS penetrating the via layer VIA and the first passivation layer PV1. The first electrode RME1 may be electrically connected to the first transistor T1 through the first conductive pattern CDP1, so that the first power voltage may be applied to the first electrode RME1, and the second electrode RME2 may be electrically connected to the second voltage line VL2, so that the second power voltage may be applied to the second electrode RME2. However, the present disclosure is not limited thereto. In one or more embodiments, the electrodes RME1 and RME2 may not be electrically connected to the voltage lines VL1 and VL2 of the third conductive layer, respectively, and the connection electrode CNE to be described later may be directly connected to the third conductive layer.

The plurality of electrodes RME may include a conductive material having high reflectivity. For example, the electrodes RME may contain a metal such as silver (Ag), copper (Cu), or aluminum (Al), or may contain an alloy including aluminum (Al), nickel (Ni), lanthanum (La), or the like. Alternatively, the electrodes RME may have a structure in which a metal layer such as titanium (Ti), molybdenum (Mo), and niobium (Nb) and the alloy are stacked. In one or more embodiments, the electrodes RME may be formed as a double layer or a multilayer formed by stacking at least one metal layer made of an alloy including aluminum (Al) and titanium (Ti), molybdenum (Mo), and niobium (Nb).

However, the present disclosure is not limited thereto, and each electrode RME may further include a transparent conductive material. For example, each electrode RME may include a material such as ITO, IZO, and ITZO. In one or more embodiments, each of the electrodes RME may have a structure in which at least one transparent conductive material and at least one metal layer having high reflectivity are stacked, or may be formed as one layer including them. For example, each electrode RME may have a stacked structure of ITO/Ag/ITO, ITO/Ag/IZO, ITO/Ag/ITZO/IZO, or the like. The electrodes RME may be electrically connected to the light emitting element ED, and may reflect some of the lights emitted from the light emitting element ED in an upward direction of the first substrate SUB.

The first insulating layer PAS1 may be disposed in the entire display area DPA and may be disposed on the via layer VIA and the plurality of electrodes RME. The first insulating layer PAS1 may protect the plurality of electrodes RME and insulate electrodes RME that are different from each other. For example, the first insulating layer PAS1 is disposed to cover the electrodes RME before the bank layer BNL is formed, so that it is possible to prevent the electrodes RME from being damaged in a process of forming the bank layer BNL. In addition, the first insulating layer PAS1 may prevent the light emitting element ED disposed thereon from being damaged by direct contact with other members.

In one or more embodiments, the first insulating layer PAS1 may have stepped portions such that the top surface thereof is partially depressed between the electrodes RME spaced in the second direction DR2. The light emitting element ED may be disposed on the top surface of the first insulating layer PAS1, where the stepped portions are formed, and thus a space may remain between the light emitting element ED and the first insulating layer PAS1.

In accordance with one or more embodiments, the first insulating layer PAS1 may include a plurality of openings OPR and the plurality of contact portions CT1 and CT2. The first insulating layer PAS1 may include the plurality of openings OPR formed to correspond to the separation portion ROP of the sub-region SA, and may include the plurality of contact portions CT1 and CT2 formed at the portion in which the connection electrode CNE to be described later and the electrode RME are connected. The first insulating layer PAS1 may be disposed on the entire via layer VIA, and may partially expose the layers disposed thereunder at the portions in which the plurality of openings OPR or the contact portions CT1 and CT2 are formed.

At the openings OPR formed to correspond to the separation portions ROP of the sub-regions SA, which are the openings formed in the first insulating layer PAS1, the process of separating the electrodes RME disposed thereunder may be performed. The plurality of electrodes RME may be disposed to extend in the first direction DR1, and may be separated into the plurality of electrodes RME by etching portions exposed by the openings OPR formed to correspond to the separation portions ROP among the openings of the first insulating layer PAS1.

The plurality of contact portions CT1 and CT2 formed in the first insulating layer PAS1 may be disposed to overlap different electrodes RME. For example, the plurality of contact portions CT1 and CT2 may be disposed in the sub-region SA, and may include the first contact portions CT1 disposed to overlap the first electrode RME1 and the second contact portions CT2 disposed in the sub-region SA to overlap the second electrode RME2. The plurality of first contact portions CT1 and the plurality of second contact portions CT2 may penetrate the first insulating layer PAS1 to partially expose the top surface of the first electrode RME1 or the second electrode RME2 thereunder. Each of the first contact portion CT1 and the second contact portion CT2 may further penetrate some of the other insulating layers disposed on the first insulating layer PAS1. The electrode RME exposed by each of the contact portions CT1 and CT2 may be in contact with the connection electrode CNE.

The bank layer BNL may be disposed on the first insulating layer PAS1. The bank layer BNL may include portions extending in the first direction DR1 and the second direction DR2, and may be around (or surround) the sub-pixels SPXn. The bank layer BNL may be around (or surround) and distinguish the emission area EMA and the sub-region SA of each sub-pixel SPXn, and may be around (or surround) the outermost part of the display area DPA and distinguish the display area DPA and the non-display area NDA. The bank layer BNL is disposed in the entire display area DPA to form a grid pattern, and the regions exposed by the bank layer BNL in the display area DPA may be the emission area EMA and the sub-region SA.

Similarly to the bank patterns BP1 and BP2, the bank layer BNL may have a certain height. In one or more embodiments, the top surface of the bank layer BNL may be higher than that of the bank patterns BP1 and BP2 in the third direction DR3, and the thickness of the bank layer BNL may be equal to or greater than that of the bank patterns BP1 and BP2. The bank layer BNL may prevent ink from overflowing to adjacent sub-pixels SPXn in an inkjet printing process during the manufacturing process of the display device 10. Similarly to the bank patterns BP1 and BP2, the bank layer BNL may include an organic insulating material such as polyimide.

The plurality of light emitting elements ED may be arranged in the emission area EMA. The light emitting elements ED may be disposed between the bank patterns BP1 and BP2, and may be arranged to be spaced from each other in the first direction DR1. In one or more embodiments, the plurality of light emitting elements ED may have a shape extending in one direction, and both ends thereof may be disposed on different electrodes RME. The length of the light emitting element ED may be greater than the gap between the electrodes RME spaced from each other in the second direction DR2. The extension direction of the light emitting elements ED may be substantially perpendicular to the first direction DR1 in which the electrodes RME extend. However, the present disclosure is not limited thereto, and the light emitting element ED may extend in the second direction DR2 or in a direction oblique to the second direction DR2.

The plurality of light emitting elements ED may be arranged on the first insulating layer PAS1. The light emitting element ED may have a shape extending in one direction, and may be disposed such that one direction in which the light emitting element ED extends is parallel to the top surface of the first substrate SUB. As will be described later, the light emitting element ED may include a plurality of semiconductor layers arranged along one direction in which the light emitting element ED extends, and the plurality of semiconductor layers may be sequentially arranged along the direction parallel to the top surface of the first substrate SUB. However, the present disclosure is not limited thereto, and the plurality of semiconductor layers may be arranged in the direction perpendicular to the first substrate SUB when the light emitting element ED has another structure.

The light emitting elements ED disposed in each sub-pixel SPXn may emit light of different wavelength bands depending on a material constituting the semiconductor layer. However, the present disclosure is not limited thereto, and the light emitting elements ED arranged in each sub-pixel SPXn may include the semiconductor layer of the same material and emit light of the same color.

The light emitting elements ED may be electrically connected to the electrode RME and the conductive layers below the via layer VIA while being in contact with the connection electrodes CNE (CNE1, CNE2, CNE3, CNE4), and may emit light of a specific wavelength band by receiving an electrical signal.

In accordance with one or more embodiments, the light emitting element ED may be classified into different light emitting elements ED1 and ED2, each having a first end disposed on the first electrode RME1 and a second end disposed on the second electrode RME2, the first end and the second end being in contact with different connection electrodes CNE. For example, the plurality of light emitting elements ED may include the first light emitting element ED1 and the second light emitting element ED2 having both ends in contact with one connection electrode CNE and another connection electrode CNE.

The different light emitting elements ED1 and ED2 may not be classified depending on the arrangement positions in the emission area EMA, but may be classified depending on the connection relationship with the connection electrode CNE. Both ends of each light emitting element ED may be in contact with different connection electrodes CNE according to an arrangement method of the connection electrodes CNE. The light emitting elements ED may be classified into different types of light emitting elements ED according to the type of the connection electrode CNE in contact therewith. In one or more embodiments, depending on the arrangement of the connection electrodes CNE in contact with both ends of the first light emitting element ED1 and the second light emitting element ED2, the first light emitting element ED1 may be disposed adjacent to the lower side of the emission area EMA of the corresponding sub-pixel SPXn or adjacent to the sub-region SA, and the second light emitting element ED2 may be disposed adjacent to the upper side of the emission area EMA of the corresponding sub-pixel SPXn. However, the present disclosure is not limited thereto.

The second insulating layer PAS2 may be disposed on the plurality of light emitting elements ED, the first insulating layer PAS1, and the bank layer BNL. The second insulating layer PAS2 may include a pattern portion disposed on the plurality of light emitting elements ED while extending in the first direction DR1 between the bank patterns BP1 and BP2. The pattern portion is disposed to partially surround the outer surface of the light emitting element ED, and may not cover both sides or both ends of the light emitting element ED. The pattern portion may form a linear or island-like pattern in each sub-pixel SPXn in a plan view. The pattern portion of the second insulating layer PAS2 may protect the light emitting element ED and fix the light emitting elements ED during a manufacturing process of the display device 10. Further, the second insulating layer PAS2 may be disposed to fill the space between the light emitting element ED and the second insulating layer PAS2 thereunder. Further, a part of the second insulating layer PAS2 may be disposed on the bank patterns BP1 and BP2, the bank layer BNL and in the sub-regions SA.

In accordance with one or more embodiments, the second insulating layer PAS2 may include a plurality of openings OP1, OP2, and OPR and the plurality of contact portions CT1 and CT2. The second insulating layer PAS2 may include the plurality of openings OPR formed to correspond to the separation portions ROP of the sub-regions SA, and the plurality of openings OP1 and OP2 partially overlapping the electrodes RME to expose the first ends and the second ends of the light emitting elements ED. Further, the second insulating layer PAS2 may include the plurality of contact portions CT1 and CT2 formed at the portions in which the connection electrode CNE and the electrode RME are connected. The second insulating layer PAS2 may be disposed on the entire first insulating layer PAS1, and may partially expose the layers disposed thereunder at the portions in which the plurality of openings are formed.

At the openings OPR formed to correspond to the separation portions ROP of the sub-regions SA, which are the openings formed in the second insulating layer PAS2, the process of separating the electrodes RME disposed thereunder may be performed. Similarly to the first insulating layer PAS1, the second insulating layer PAS2 may include the opening OPR exposing the top surface of the via layer VIA at the separation portion ROP in which the process of separating the electrodes RME is performed.

The second insulating layer PAS2 may include a plurality of first openings OP1 partially overlapping the first electrode RME1 and a plurality of second openings OP2 partially overlapping the second electrode RME2. The first openings OP1 and the second openings OP2 may be disposed in the emission area EMA, and may expose both ends of the light emitting elements ED. The first openings OP1 may expose or may not cover the first ends of the light emitting elements ED disposed on the first electrode RME1, and the second openings OP2 may expose or may not cover the second ends of the light emitting elements ED disposed on the second electrode RME2.

The plurality of first openings OP1 may be disposed to overlap one side of the first electrode RME1 that faces (or opposes) the second electrode RME2, and may have a shape extending in the first direction DR1. Further, the plurality of first openings OP1 disposed in one sub-pixel SPXn may be disposed to be spaced from each other in the first direction DR1 in the emission area EMA of the corresponding sub-pixel SPXn. One first opening OP1 may expose the first ends of the first light emitting elements ED1, and another first opening OP1 may expose the first ends of the second light emitting elements ED2.

Similarly, the plurality of second openings OP2 may be disposed to overlap one side of the second electrode RME2 that faces (or opposes) the first electrode RME1, and may have a shape extending in the first direction DR1. The plurality of second openings OP2 disposed in one sub-pixel SPXn may be spaced from each other in the first direction DR1 in the emission area EMA of the corresponding sub-pixel SPXn. One second opening OP2 may expose the second ends of the first light emitting elements ED1, and another second opening OP2 may expose the second ends of the second light emitting elements ED2. The plurality of second openings OP2 may also penetrate the third insulating layer PAS3 to be described later. The plurality of connection electrodes CNE may be in contact with both ends of the light emitting elements ED exposed through the plurality of first openings OP1 and the plurality of second openings OP2.

The second insulating layer PAS2 may include the first contact portions CT1 disposed in the sub-region SA to overlap the first electrode RME1, and the second contact portions CT2 disposed in the sub-region SA to overlap the second electrode RME2. The plurality of contact portions CT1 and CT2 may penetrate the second insulating layer PAS2 in addition to the first insulating layer PAS1. The plurality of first contact portions CT1 and the plurality of second contact portions CT2 may partially expose the top surface of the first electrode RME1 or the second electrode RME2 disposed thereunder.

The plurality of connection electrodes CNE (CNE1, CNE2, CNE3, and CNE4) may be disposed on the plurality of electrodes RME and the bank patterns BP1 and BP2. The plurality of connection electrodes CNE may have a shape extending in one direction, and may be disposed to be spaced from each other. Each of the connection electrodes CNE may be in contact with the light emitting element ED, and may be electrically connected to the third conductive layer.

The plurality of connection electrodes CNE may include the first connection electrode CNE1, a second connection electrode CNE2, a third connection electrode CNE3, and a fourth connection electrode CNE4 disposed in each sub-pixel SPXn. The first connection electrode CNE1 and the third connection electrode CNE3 may have a shape extending in the first direction DR1 and may be spaced from each other in the first direction DR1. The first connection electrode CNE1 and the third connection electrode CNE3 may be disposed on the first electrode RME1 or the first bank pattern BP1. The second connection electrode CNE2 and the fourth connection electrode CNE4 may have a shape extending in the first direction DR1 and may be spaced from each other in the first direction DR1. The second connection electrode CNE2 and the fourth connection electrode CNE4 may be disposed on the second electrode RME2 or the second bank pattern BP2.

The first connection electrode CNE1 and the fourth connection electrode CNE4 may be spaced from each other in the second direction DR2, and the third connection electrode CNE3 and the second connection electrode CNE2 may also be spaced from each other in the second direction DR2. The first connection electrode CNE1 and the fourth connection electrode CNE4 may be disposed below the center of the emission area EMA, and the second connection electrode CNE2 and the third connection electrode CNE3 may be disposed above the center of the emission area EMA in the first direction DR3.

The plurality of connection electrodes CNE may be in contact with the light emitting elements ED. For example, the first connection electrode CNE1 and the third connection electrode CNE3 may partially overlap the first electrode RME1 and may be in contact with the first ends of the light emitting elements ED. The first connection electrode CNE1 may be in contact with the first end of the first light emitting element ED1, and the third connection electrode CNE3 may be in contact with the first end of the second light emitting element ED2. The second connection electrode CNE2 and the fourth connection electrode CNE4 may partially overlap the second electrode RME2 and may be in contact with the second ends of the light emitting elements ED. The second connection electrode CNE2 may be in contact with the second end of the second light emitting element ED2, and the fourth connection electrode CNE4 may be in contact with the second end of the first light emitting element ED1.

The connection electrodes CNE may include a conductive material. For example, they may include ITO, IZO, ITZO, aluminum (Al), or the like. As an example, the connection electrodes CNE may include a transparent conductive material, and light emitted from the light emitting element ED may pass through the connection electrodes CNE to be emitted.

In accordance with one or more embodiments, the first connection electrode CNE1 and the third connection electrode CNE3, and the second connection electrode CNE2 and the fourth connection electrode CNE4 may be the connection electrodes disposed on different layers. The first connection electrode CNE1 and the third connection electrode CNE3 may be the first connection electrode layers disposed on the second insulating layer PAS2, and the second connection electrode CNE2 and the fourth connection electrode CNE4 may be the second connection electrode layers disposed on the third insulating layer PAS3.

The third insulating layer PAS3 is disposed on the first connection electrode layer and the second insulating layer PAS2. The third insulating layer PAS3 may be disposed on the entire second insulating layer PAS2 to cover the first connection electrode CNE1 and the third connection electrode CNE3 of the first connection electrode layer, and the connection electrodes CNE2 and CNE4 of the second connection electrode layer may be partially disposed on the third insulating layer PAS3. The third insulating layer PAS3 may insulate the connection electrodes CNE1 and CNE3 of the first connection electrode layer from the connection electrodes CNE2 and CNE4 of the second connection electrode layer to prevent direct contact therebetween.

Each of the first insulating layer PAS1, the second insulating layer PAS2, and the third insulating layer PAS3 described above may include an inorganic insulating material or an organic insulating material. For example, each of the first insulating layer PAS1, the second insulating layer PAS2, and the third insulating layer PAS3 may include an inorganic insulating material. Alternatively, the first insulating layer PAS1 and the third insulating layer PAS3 may include an inorganic insulating material, whereas the second insulating layer PAS2 may include an organic insulating material. Each or at least one of the first insulating layer PAS1, the second insulating layer PAS2, and the third insulating layer PAS3 may have a structure in which a plurality of insulating layers are stacked alternately or repeatedly. In one or more embodiments, the first insulating layer PAS1, the second insulating layer PAS2, and the third insulating layer PAS3 may be any one of silicon oxide (SiOx), silicon nitride (SiNx), and silicon oxynitride (SiOxNy). The first insulating layer PAS1, the second insulating layer PAS2, and the third insulating layer PAS3 may be made of the same material or different materials. Alternatively, some of them may be made of the same material and some of them may be made of different materials.

In accordance with one or more embodiments, the third insulating layer PAS3 may include the plurality of second openings OP2 and the plurality of third openings OP3, and the plurality of second contact portions CT2. The third insulating layer PAS3 may include the plurality of second openings OP2 partially overlapping the electrode RME to expose the second ends of the light emitting elements ED, the third opening OP3 disposed across the electrodes RME spaced from each other to partially expose the top surface of the first connection electrode layer, and the plurality of second contact portions CT2 formed at the portions in which the second connection electrode CNE2 and the second electrode RME2 are connected. The third insulating layer PAS3 may be disposed on the entire second insulating layer PAS2 and may partially expose the layers disposed thereunder at the portions in which the plurality of openings are formed.

The second openings OP2 of the third insulating layer PAS3 may partially overlap the second electrode RME2 in the emission area EMA, and may expose or may not cover the second ends of the light emitting elements ED that are disposed on the second electrode RME2. The plurality of second openings OP2 may be disposed to overlap one side of the second electrode RME2 that faces (or opposes) the first electrode RME1, and may have a shape extending in the first direction DR1. The plurality of second openings OP2 disposed in one sub-pixel SPXn may be spaced from each other in the first direction DR1 in the emission area EMA of the corresponding sub-pixel SPXn.

The plurality of second openings OP2 may be disposed to overlap one side of the second electrode RME2 that faces (or opposes) the first electrode RME1, and may have a shape extending in the first direction DR1. The plurality of second openings OP2 disposed in one sub-pixel SPXn may be spaced from each other in the first direction DR1 in the emission area EMA of the corresponding sub-pixel SPXn.

The third openings OP3 of the third insulating layer PAS3 may partially overlap the first electrode RME1 and the second electrode RME2 in the emission area EMA, and may expose or may not cover a part of the connection electrode of the first connection electrode layer disposed thereunder. At least one third opening OP3 may be formed in each sub-pixel SPXn. A plurality of third openings OP3 may be disposed between the region in which the first light emitting elements ED1 are disposed and the region in which the second light emitting elements ED2 are disposed. Alternatively, the third openings OP3 may be disposed in the space between the first openings OP1 spaced from each other in the first direction DR1 and the space between the second openings OP2 spaced from each other in the first direction DR1. Unlike the other openings OP1 and OP2, the third opening OP3 may have a shape in which the width measured in the second direction DR2 is greater than the width measured in the first direction DR1, and may be disposed across different electrodes RME1 and RME2.

The third insulating layer PAS3 may include the second contact portions CT2 disposed in the sub-region SA to overlap the second electrode RME2. The plurality of second contact portions CT2 may penetrate the third insulating layer PAS3 in addition to the first insulating layer PAS1 and the second insulating layer PAS2. The plurality of second contact portions CT2 may partially expose the top surface of the second electrode RME2 disposed thereunder.

The first connection electrode CNE1 and the second connection electrode CNE2 may be disposed from the emission area EMA to the sub-region SA over the bank layer BNL. Accordingly, the lengths of the first connection electrode CNE1 and the second connection electrode CNE2 measured in the first direction DR1 may be longer than the lengths of the third connection electrode CNE3 and the fourth connection electrode CNE4 measured in the first direction DR1, respectively. Each of the first connection electrode CNE1 and the second connection electrode CNE2 may be in contact with the light emitting elements ED, and may be electrically connected to the electrodes RME or the conductive layer disposed thereunder. For example, the first connection electrode CNE1 may be in contact with the first electrode RME1 through the first contact portion CT1 penetrating the first insulating layer PAS1 and the second insulating layer PAS2 in the sub-region SA. The second connection electrode CNE2 may be in contact with the second electrode RME2 through the second contact portion CT2 penetrating the first insulating layer PAS1, the second insulating layer PAS2, and the third insulating layer PAS3 in the sub-region SA. The first connection electrode CNE1 may be electrically connected to the first transistor T1, so that the first power voltage may be applied to the first connection electrode CNE1, and the second connection electrode CNE2 may be electrically connected to the second voltage line VL2, so that the second power voltage may be applied to the second connection electrode CNE2.

However, the present disclosure is not limited thereto. In one or more embodiments, the first connection electrode CNE1 and the second connection electrode CNE2 may be in direct contact with the third conductive layer, and may be electrically connected to the third conductive layer through patterns other than the electrode RME.

Figure 12:
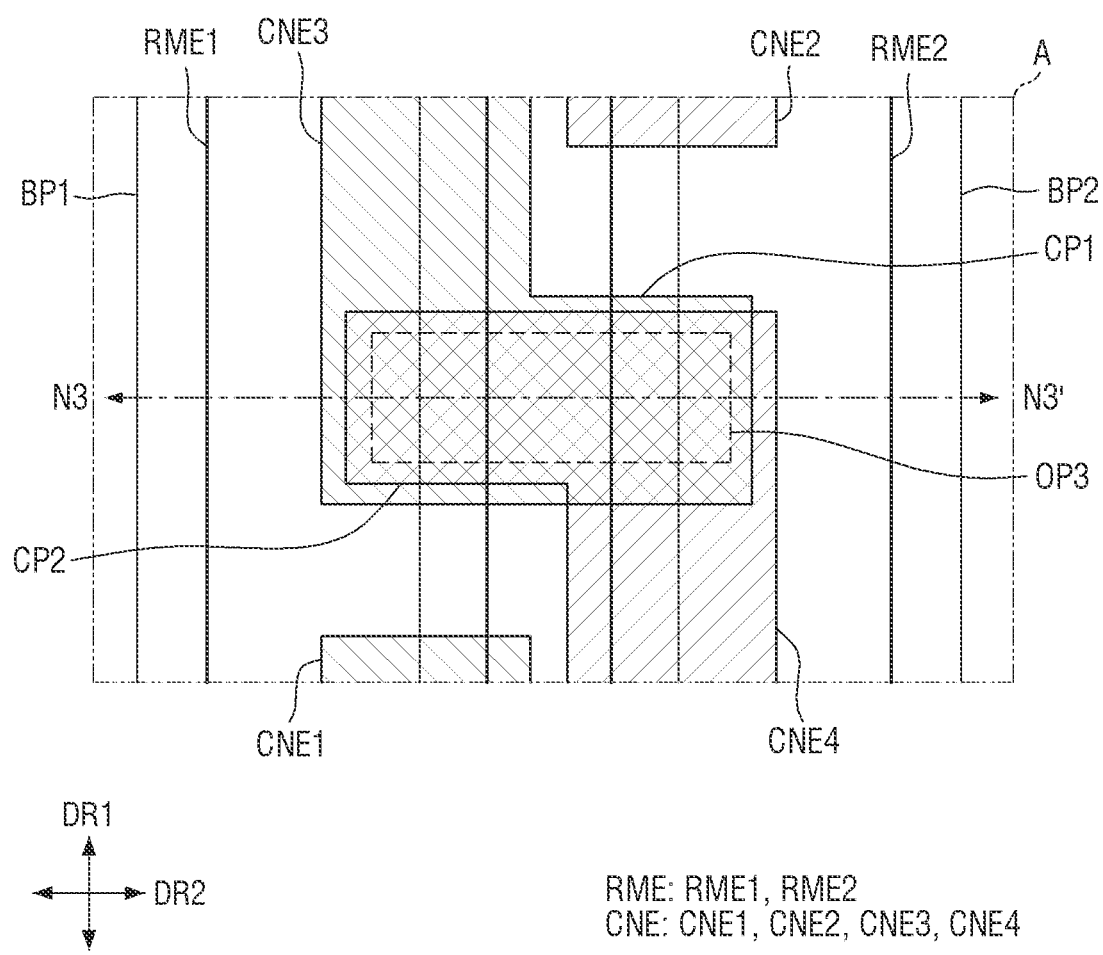
FIG. 12 is an enlarged view of a part A of FIG. 4.
Figure 13:
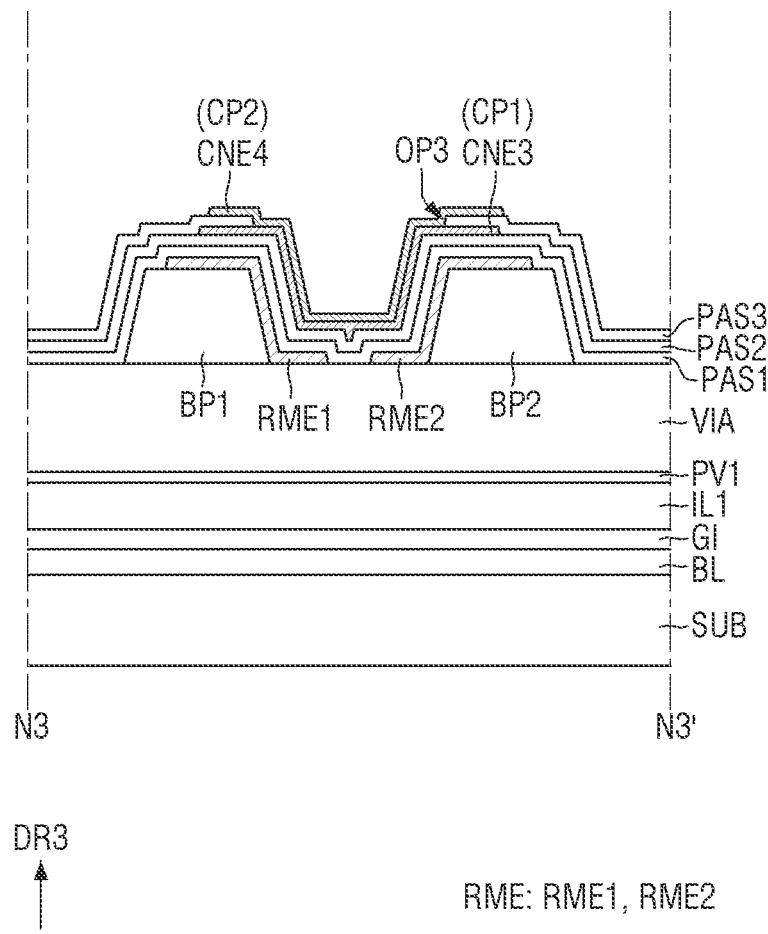
FIG. 13 is a cross-sectional view taken along the line N3-N3' in FIG. 12.

FIG. 12 is an enlarged view of part A of FIG. 4. FIG. 13 is a cross-sectional view taken along the line N3-N3' in FIG. 12. FIG. 13 illustrates a cross section across the third opening OP3 of the third insulating layer PAS3 in the second direction DR2.

Referring to FIGS. 12 and 13 in conjunction with FIGS. 4 to 11, in the display device 10 according to one or more embodiments, the third connection electrode CNE3 of the first connection electrode layer and the fourth connection electrode CNE4 of the second connection electrode layer may be connected to each other. The third connection electrode CNE3 may include a first connection portion CP1 disposed on one side facing the first connection electrode CNE1 in the first direction DR1, and the fourth connection electrode CNE4 may include a second connection portion CP2 disposed on one side facing the second connection electrode CNE2 in the first direction DR1. The third connection electrode CNE3 and the fourth connection electrode CNE4 may have a shape extending in the first direction DR1 and in which the first connection portion CP1 and the second connection portion CP2 are bent in the second direction DR2, and the first connection portion CP1 and the second connection portion CP2 may overlap each other in the thickness direction (e.g., a third direction DR3). The first connection portion CP1 may overlap the third opening OP3 of the third insulating layer PAS3, so that the top surface of the first connection portion CP1 may be exposed, and the second connection portion CP2 may be in direct contact with the first connection portion CP1 exposed by the third opening OP3.

The third opening OP3 of the third insulating layer PAS3 may be disposed to partially overlap the third connection electrode CNE3 of the first connection electrode layer, so that the third connection electrode CNE3 may be partially exposed. The third connection electrode CNE3 exposed by the third opening OP3 may be in contact with the fourth connection electrode CNE4 of the second connection electrode layer. In one or more embodiments, the width of the third opening OP3 of the third insulating layer PAS3 measured in the second direction DR2 may be smaller than the width of the first connection portion CP1 of the third connection electrode CNE3. However, the present disclosure is not limited thereto, and in one or more embodiments, the width of the third opening OP3 may be greater than the width of the first connection portion CP1.

In accordance with one or more embodiments, the second insulating layer PAS2 may overlap the first connection portion CP1 and the second connection portion CP2 and may not overlap the third insulating layer PAS3 at the portion in which the first connection portion CP1 and the second connection portion CP2 are in contact with each other. The first connection portion CP1 and the second connection portion CP2 may be disposed in the region in which the light emitting elements ED are not disposed, which is the region in which the first opening OP1 and the second opening OP2 of the second insulating layer PAS2 and the third insulating layer PAS3 are not disposed. At the third opening OP3, the second insulating layer PAS2, the first connection portion CP1 of the third connection electrode CNE3, and the second connection portion CP2 of the fourth connection electrode CNE4 that are disposed on different layers may overlap in the thickness direction (e.g., a third direction DR3).

The first connection electrode CNE1 and the second connection electrode CNE2 may be first type connection electrodes directly connected to the electrode RME, and the third connection electrode CNE3 and the fourth connection electrode CNE4 may be second type connection electrodes that are not connected to electrodes RME3 and RME4. The third connection electrode CNE3 and the fourth connection electrode CNE4 may be in contact with the light emitting elements ED without being connected to the electrode RME and may constitute an electrical connection circuit of the light emitting elements ED together with other connection electrodes CNE1 and CNE2.

The plurality of light emitting elements ED may be classified into different light emitting elements ED depending on the connection electrodes CNE to be in contact with both ends of the light emitting elements ED to correspond to the arrangement structure of the connection electrodes CNE. The first light emitting element ED1 may have first ends in contact with the first type connection electrodes and second ends in contact with the second type connection electrodes. The second light emitting element ED2 may have first ends in contact with the second type connection electrodes and second ends in contact with the first type connection electrodes. The first light emitting element ED1 may be in contact with the first connection electrode CNE1 and the fourth connection electrode CNE4, and the second light emitting element ED2 may be in contact with the second connection electrode CNE2 and the third connection electrode CNE3.

The plurality of light emitting elements ED may be connected in series through the plurality of connection electrodes CNE. The display device 10 according to the described embodiment may include the light emitting elements ED connected in series for each sub-pixel SPXn, and the light emission amount per unit area may be increased.

Further, in the display device 10 according to one or more embodiments, the plurality of connection electrodes CNE may be classified into the connection electrodes of different connection electrode layers depending on the layer disposed with respect to the second insulating layer PAS2 and the third insulating layer PAS3. In accordance with one or more embodiments, the connection electrodes CNE1, CNE2, CNE3, and CNE4 disposed on the same connection electrode layer may be in contact with the same end between both ends of the light emitting element ED. Such arrangement of the connection electrodes CNE may be desirable in that it may be possible to deal with misalignment of the overlay design between patterns by shifting the patterns of the connection electrodes CNE even if the patterns of the second insulating layer PAS2 and the third insulating layer PAS3 were shifted in the manufacturing process of the display device 10.

As shown in FIGS. 7 and 9, the first connection electrode CNE1 and the third connection electrode CNE3, which are the connection electrodes of the first connection electrode layer, are disposed between the second insulating layer PAS2 and the third insulating layer PAS3, and the second connection electrode CNE2 and the fourth connection electrode CNE4, which are the connection electrodes of the second connection electrode layer, are disposed on the third insulating layer PAS3.

The positions in which the connection electrodes CNE are disposed may be related to the pattern shapes and the positions of the second insulating layer PAS2 and the third insulating layer PAS3. The second insulating layer PAS2 and the third insulating layer PAS3 may include the plurality of openings OP1, OP2, and OP3 formed by a process of exposing one side and the other side of the light emitting element ED by partially removing the second insulating layer PAS2 and the third insulating layer PAS3 disposed on the entire first insulating layer PAS1. In the process of forming the second insulating layer PAS2, the plurality of first openings OP1 exposing the first ends of the plurality of light emitting elements ED may be formed, and in the process of forming the third insulating layer PAS, the plurality of second openings OP2 exposing the second ends of the plurality of light emitting elements ED may be formed. In the process of forming the second openings OP2, the second insulating layer PAS2 as well as the third insulating layer PAS3 may be penetrated, and the second openings OP2 may also be formed in the second insulating layer PAS2.

In accordance with one or more embodiments, in the display device 10, the connection electrodes CNE of the same connection electrode layer may be disposed to be in contact with the same one end between both ends of the light emitting element ED. For example, the first connection electrode CNE1 and the third connection electrode CNE3 of the first connection electrode layer may be formed after the formation of the second insulating layer PAS2 and may be disposed to correspond to the first openings OP1. The first connection electrode CNE1 and the third connection electrode CNE3 may be disposed to be in contact with the first end between both ends of the light emitting element ED. The second connection electrode CNE2 and the fourth connection electrode CNE4 of the second connection electrode layer may be formed after the formation of the third insulating layer PAS3 and may be disposed to correspond to the second openings OP2. The second connection electrode CNE2 and the fourth connection electrode CNE4 may be disposed to be in contact with the second end between both ends of the light emitting element ED.

The connection electrodes CNE of the same connection electrode layer may be disposed in parallel to each other in the first direction DR1. For example, the first connection electrode CNE1 may be aligned with to the third connection electrode CNE3 in the first direction DR1, and the second connection electrode CNE2 may be aligned with to the fourth connection electrode CNE4 in the first direction DR1.

In the process of forming the second insulating layer PAS2 and the third insulating layer PAS3, the positions of the openings OP1 and OP2 exposing both ends of the light emitting elements ED may be determined by the overlay design of a mask pattern. The display device 10 may be designed such that the plurality of connection electrodes CNE of the same connection electrode layer are in contact with the same one side or the same other side between both sides of the light emitting element ED, and may also be designed such that the mask pattern of the layers used in the process of forming the second insulating layer PAS2 and the third insulating layer PAS3 exposes the same one end or the same other end between both ends of the light emitting element ED.

For example, the first opening OP1 of the second insulating layer PAS2 may be formed to expose the first end of the light emitting element ED, and the second opening OP2 of the third insulating layer PAS3 may be formed to expose the second end of the light emitting element ED. Before the process of forming the third insulating layer PAS3, the second end of the light emitting element ED is covered by the material constituting the second insulating layer PAS2. Then, in the process of forming the second openings OP2, the second end may be exposed by removing the material constituting the second insulating layer PAS2. That is, in the process of forming the second insulating layer PAS2, the first ends of the light emitting elements ED may be concurrently (e.g., simultaneously) exposed, and in the process of forming the third insulating layer PAS3, the second ends of the light emitting elements ED may be concurrently (e.g., simultaneously) exposed.

Here, when the mask pattern for forming the first opening OP1 and the second opening OP2 is misaligned unlike an overlay design value with the layer disposed thereunder, the positions of the first opening OP1 and the second opening OP2 may be different from the design value. However, the display device 10 according to one or more embodiments may be desirable in that it may be possible to easily correct the overlay misalignment because the light emitting elements ED are exposed at one sides in the same direction in the process of forming the first opening OP1 and the second opening OP2. If one sides of some of the light emitting elements ED are exposed unlike the design value due to the misalignment of the mask pattern, one sides of other light emitting elements ED may also be exposed unlike the design value. In this case, one sides of the light emitting elements ED may be exposed according to the design value by rearranging the mask pattern or by an additional patterning process.

Similarly, in the process of forming the connection electrodes CNE, which is performed after the process of forming the first opening OP1 and the second opening OP2, the formation positions of the connection electrodes CNE may be determined by the overlay design of the mask pattern. When the first ends of the light emitting elements ED are exposed in the process of forming the second insulating layer PAS2, the connection electrodes CNE1 and CNE3 of the first connection electrode layer are formed, and when the second ends of the light emitting elements ED are exposed in the process of forming the third insulating layer PAS3, the connection electrodes CNE2 and CNE4 of the second connection electrode layer are formed.

Even if the mask pattern exposing one end or the other end of the light emitting element ED is misaligned, it is possible to perform the process by shifting the mask pattern forming the first connection electrode layer and the second connection electrode layer by the misaligned value. Because the mask pattern exposing one end of the light emitting element ED is shifted in the same direction, the connection electrodes CNE in contact with one end of the light emitting element ED may also be formed while being shifted in the same direction.

In the display device 10 according to one or more embodiments, the patterns of the insulating layers PAS1, PAS2, and PAS3 and the connection electrodes CNE disposed on the same layer in the manufacturing process may be moved and aligned in the same direction with respect to the light emitting element ED. The display device 10 may be desirable in that it may be easy to deal with the misalignment of the pattern design, and it may be possible to prevent non-contact between the connection electrodes CNE and the light emitting elements ED and a short circuit between the connection electrodes CNE.

Figure 14:
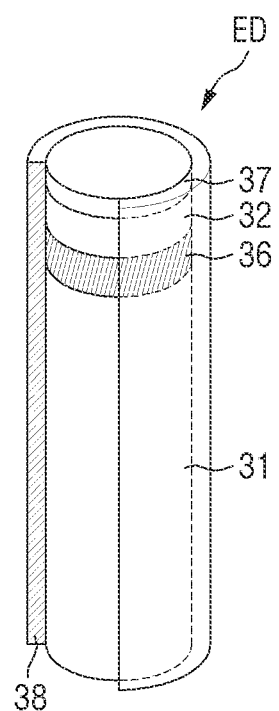
FIG. 14 is a schematic diagram illustrating a perspective cutaway view of a light emitting element according to one or more embodiments.

FIG. 14 is a schematic perspective cutaway view of a light emitting element according to one or more embodiments.

Referring to FIG. 14, the light emitting element ED may be a light emitting diode. For example, the light emitting element ED may be an inorganic light emitting diode that has a nanometer or micrometer size, and is made of an inorganic material. The light emitting element ED may be aligned between two electrodes having polarity when an electric field is formed in a specific direction between two electrodes facing (or opposing) each other.

The light emitting element ED according to one or more embodiments may have a shape elongated in one direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in one direction and having an outer surface partially inclined.

The light emitting element ED may include a semiconductor layer doped with any conductivity type (e.g., p-type or n-type) dopant. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37 and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN and InN doped with an n-type dopant. The n-type dopant doped into the first semiconductor layer 31 may be Si, Ge, Sn, or the like.

The second semiconductor layer 32 is disposed on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN and InN doped with a p-type dopant. The p-type dopant doped into the second semiconductor layer 32 may be Mg, Zn, Ca, Ba, or the like.

Although it is illustrated in the drawing that the first semiconductor layer 31 and the second semiconductor layer 32 are configured as one layer, the present disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer.

The light emitting layer 36 is disposed between the first semiconductor layer 31 and the second semiconductor layer 32. The light emitting layer 36 may include a material having a single or multiple quantum well structure. When the light emitting layer 36 includes a material having a multiple quantum well structure, a plurality of quantum layers and well layers may be stacked alternately. The light emitting layer 36 may emit light by coupling of electron-hole pairs according to an electrical signal applied through the first semiconductor layer 31 and the second semiconductor layer 32. The light emitting layer 36 may include a material such as AlGaN or AlGaInN. For example, when the light emitting layer 36 has a structure in which quantum layers and well layers are alternately stacked in a multiple quantum well structure, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy are alternately stacked, and may include other Group III to Group V semiconductor materials according to the wavelength band of the emitted light. The light emitted by the light emitting layer 36 is not limited to light of a blue wavelength band, but the active layer 36 may also emit light of a red or green wavelength band in some cases.

The electrode layer 37 may be an ohmic connection electrode. However, the present disclosure is not limited thereto, and it may be a Schottky connection electrode. The light emitting element ED may include at least one electrode layer 37. The light emitting element ED may include one or more electrode layers 37, but the present disclosure is not limited thereto, and the electrode layer 37 may be omitted.

When the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 is arranged around (or to surround) the outer surfaces (e.g., the outer peripheral or circumferential surfaces) of the plurality of semiconductor layers and electrode layers described above. For example, the insulating film 38 may be disposed around (or to surround) at least the outer surface (e.g., the outer peripheral or circumferential surface) of the light emitting layer 36, and may be formed to expose both ends of the light emitting element ED in the longitudinal direction. Further, in cross-sectional view, the insulating film 38 may have a top surface, which is rounded in a region adjacent to at least one end of the light emitting element ED.

The insulating film 38 may include a material having insulating properties, such as silicon oxide (SiOx), silicon nitride (SiNx), silicon oxynitride (SiOxNy), aluminum nitride (AlNx), and aluminum oxide (AlOx). It is illustrated in the drawing that the insulating film 38 is formed as a single layer, but the present disclosure is not limited thereto. In one or more embodiments, the insulating film 38 may be formed in a multilayer structure having a plurality of layers stacked therein.

The insulating film 38 may perform a function of protecting the semiconductor layers and the electrode layer of the light emitting element ED. The insulating film 38 may prevent an electrical short circuit that is likely to occur at the light emitting layer 36 when an electrode to which an electrical signal is transmitted is in direct contact with the light emitting element ED. In addition, the insulating film 38 may prevent a decrease in luminous efficiency of the light emitting element ED.

Further, the insulating film 38 may have an outer surface (e.g., an outer peripheral or circumferential surface) which is surface-treated. The light emitting elements ED may be aligned in such a way of spraying the ink in which the light emitting elements ED are dispersed on the electrodes. Here, the surface of the insulating film 38 may be treated in a hydrophobic or hydrophilic manner in order to keep the light emitting elements ED in a dispersed state without aggregation with other light emitting elements ED adjacent in the ink.

Hereinafter, other embodiments of the display device 10 will be described with reference to other drawings.

Figure 15:
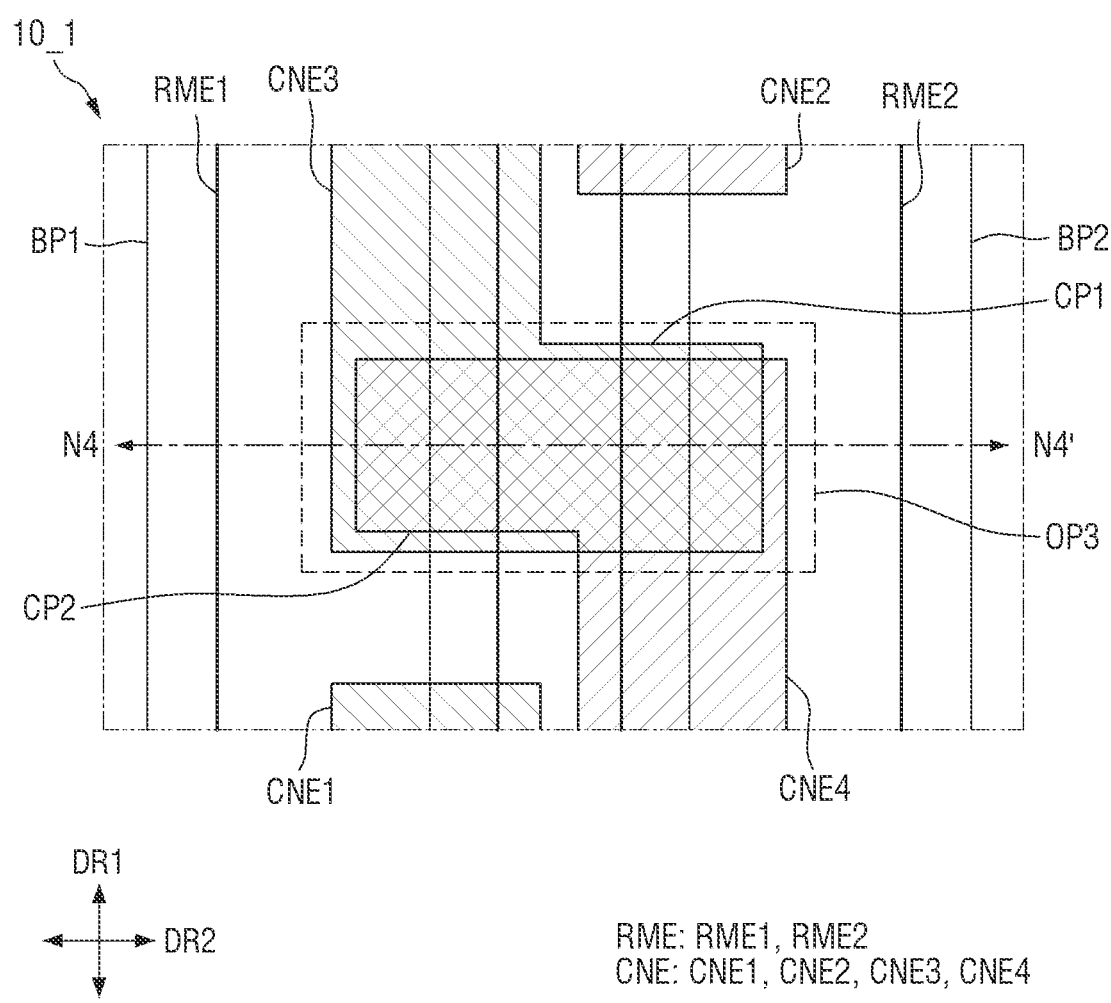
FIG. 15 is a plan view illustrating connection portions of connection electrodes of a display device according to one or more embodiments.
Figure 16:
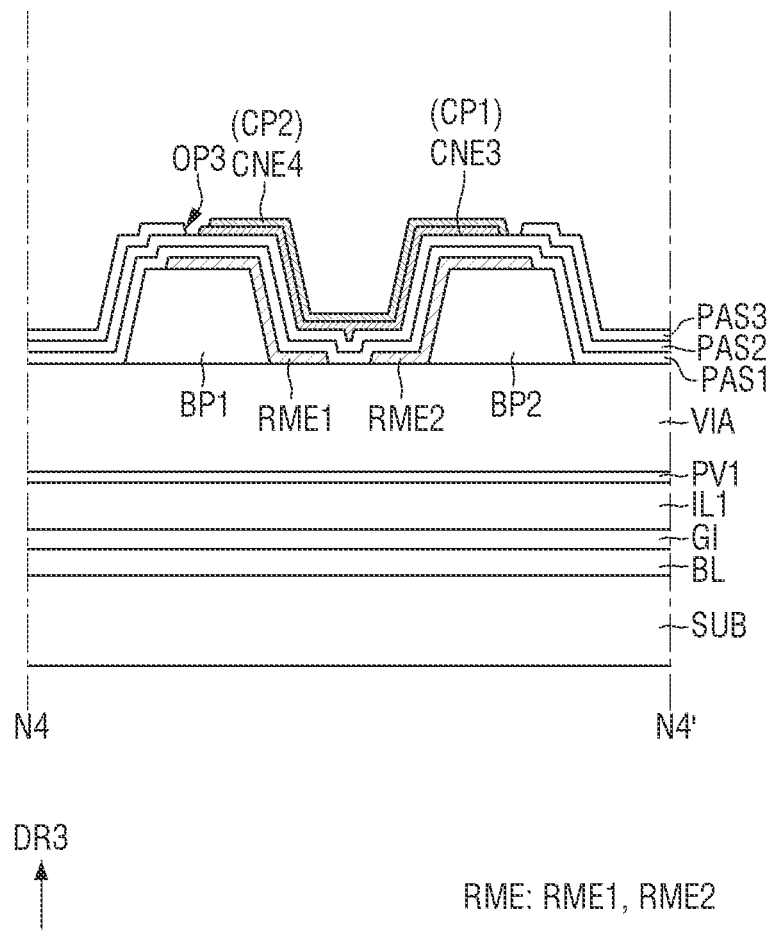
FIG. 16 is a cross-sectional view taken along the line N4-N4' of FIG. 15.

FIG. 15 is a plan view illustrating connection portions of connection electrodes of a display device according to one or more embodiments. FIG. 16 is a cross-sectional view taken along the line N4-N4' of FIG. 15. FIG. 16 illustrates a cross section across the third opening OP3 of the third insulating layer PAS3 in the second direction DR2.

Referring to FIGS. 15 and 16, in a display device 10_1 according to one or more embodiments, the third opening OP3 of the third insulating layer PAS3 may have a width greater than those of the first connection portion CP1 of the third connection electrode CNE3 and the second connection portion CP2 of the fourth connection electrode CNE4. Further, the planar area of the third opening OP3 may be greater than those of the first connection portion CP1 and the second connection portion CP2. Accordingly, the first connection portion CP1 and the second connection portion CP2 may be in contact with each other inside the third opening OP3.

Figure 17:
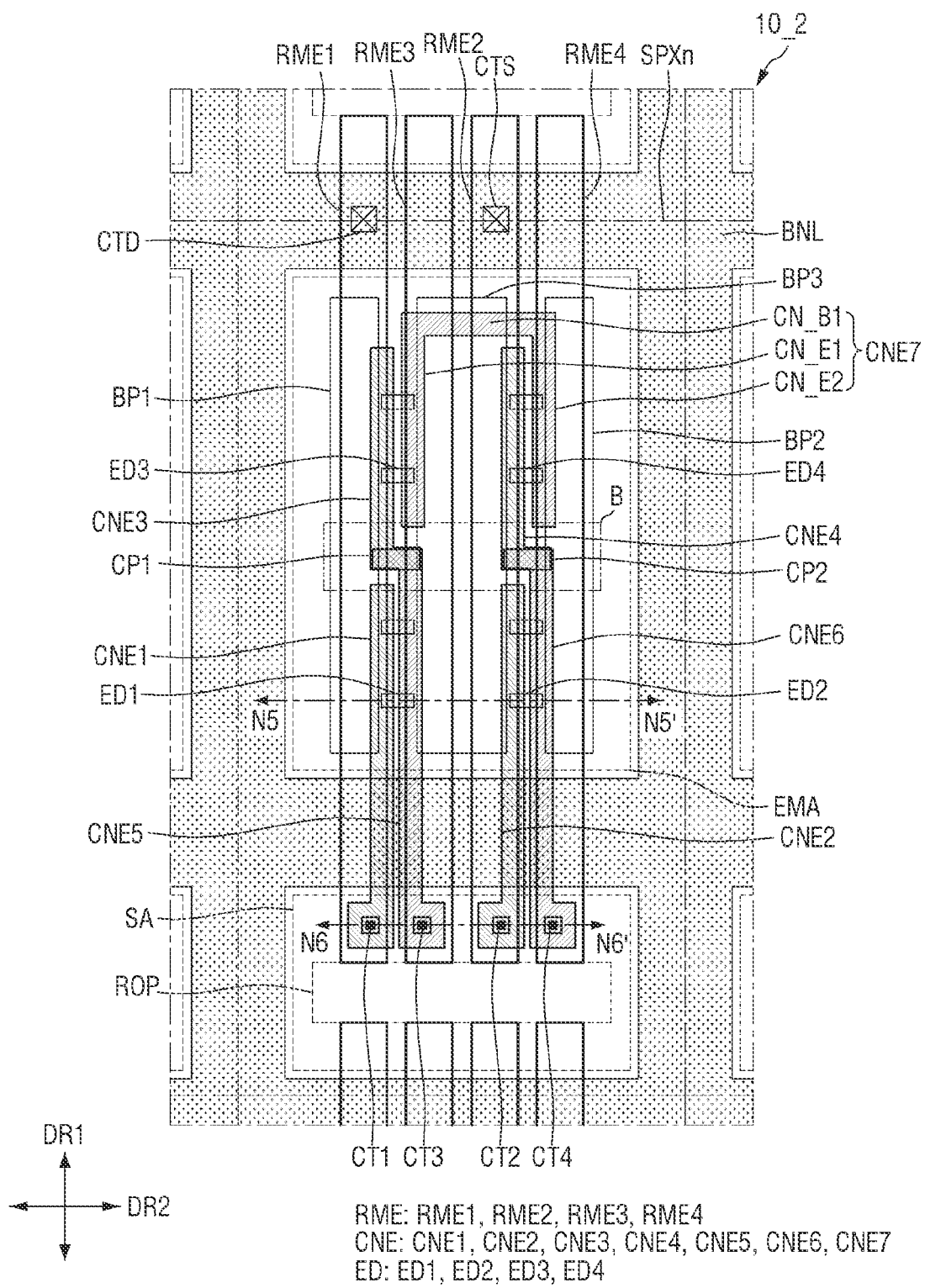
FIG. 17 is a plan view illustrating a sub-pixel of a display device according to one or more embodiments.

FIG. 17 is a plan view illustrating a sub-pixel of a display device according to one or more embodiments. FIG. 17 illustrates the planar arrangement of the electrodes RME (RME1, RME2, RME3, and RME4), the bank patterns BP1, BP2, and BP3, the bank layer BNL, the plurality of light emitting elements ED, and the connection electrodes CNE (CNE1, CNE2, CNE3, CNE4, CNE5, CNE6, and CNE7) disposed in one sub-pixel PXn of a display device 10_2.

Referring to FIG. 17, the display device 10_2 according to one or more embodiments may include a larger number of electrodes RME (RME1, RME2, RME3, and RME4), a larger number of bank patterns BP1, BP2, and BP3, and a larger number of light emitting elements ED (ED1, ED2, ED3, and ED4), and a larger number of connection electrodes CNE (CNE1, CNE2, CNE3, CNE4, CNE5, CNE6, and CNE7). The display device 10_2 according to the described embodiment is different from the embodiment of FIG. 4 in that a larger number of electrodes and a larger number of light emitting elements are included in each sub-pixel SPXn. In the following description, redundant description will be omitted while focusing on differences.

Figure 18:
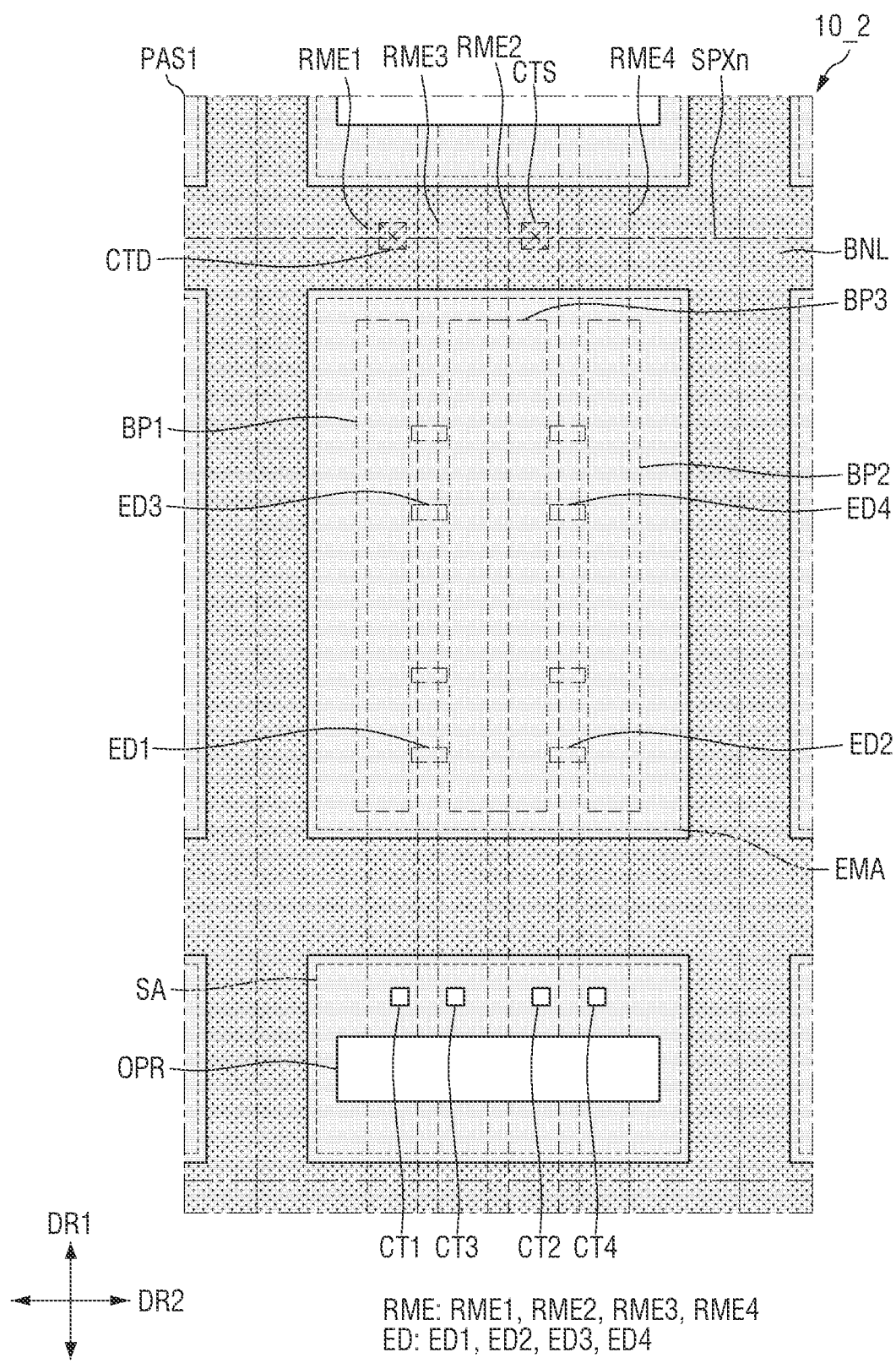
FIG. 18 is a plan view illustrating a first insulating layer disposed in one sub-pixel of FIG. 17.
Figure 19:
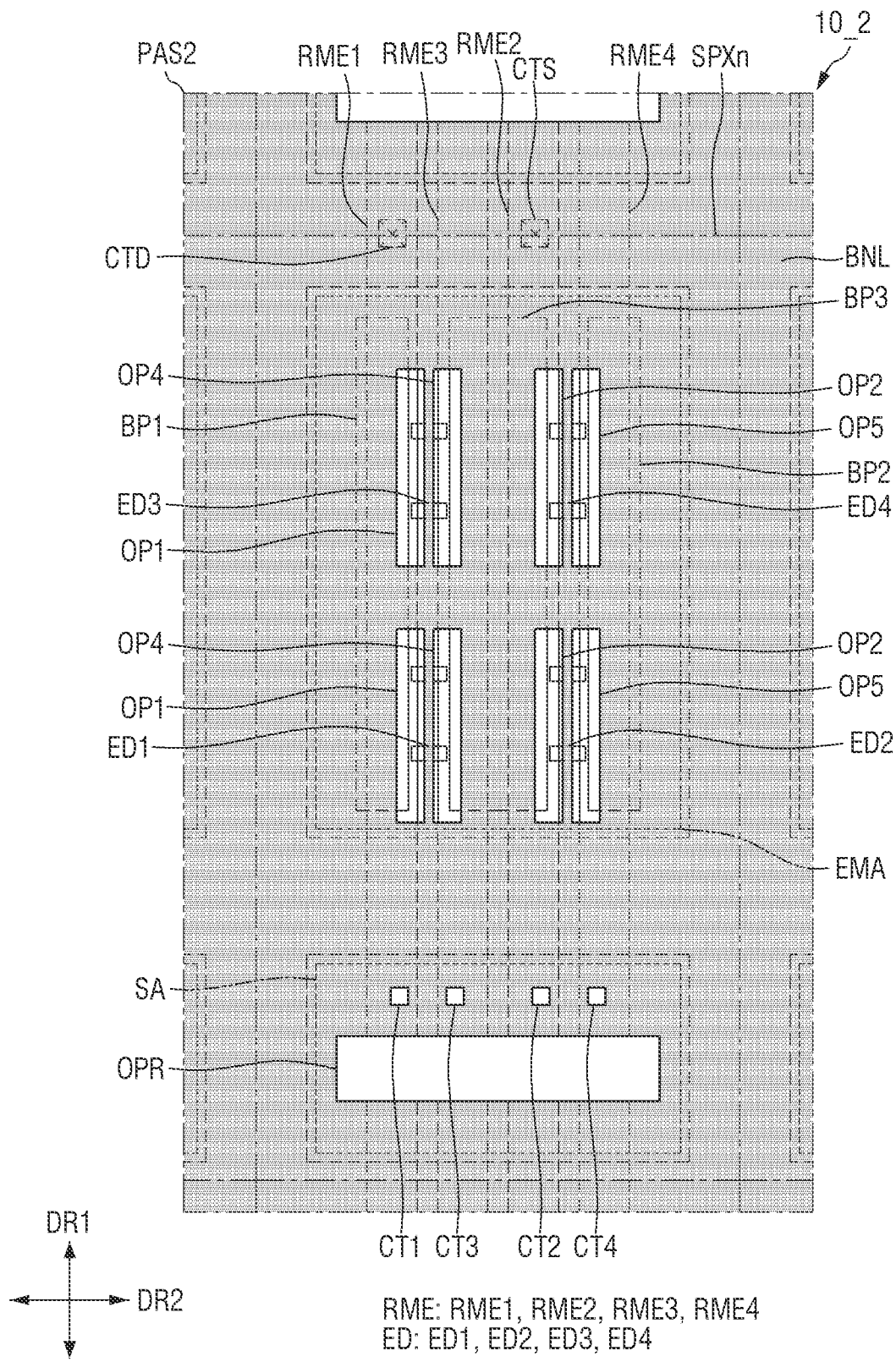
FIG. 19 is a plan view illustrating a second insulating layer disposed in one sub-pixel of FIG. 17.
Figure 20:
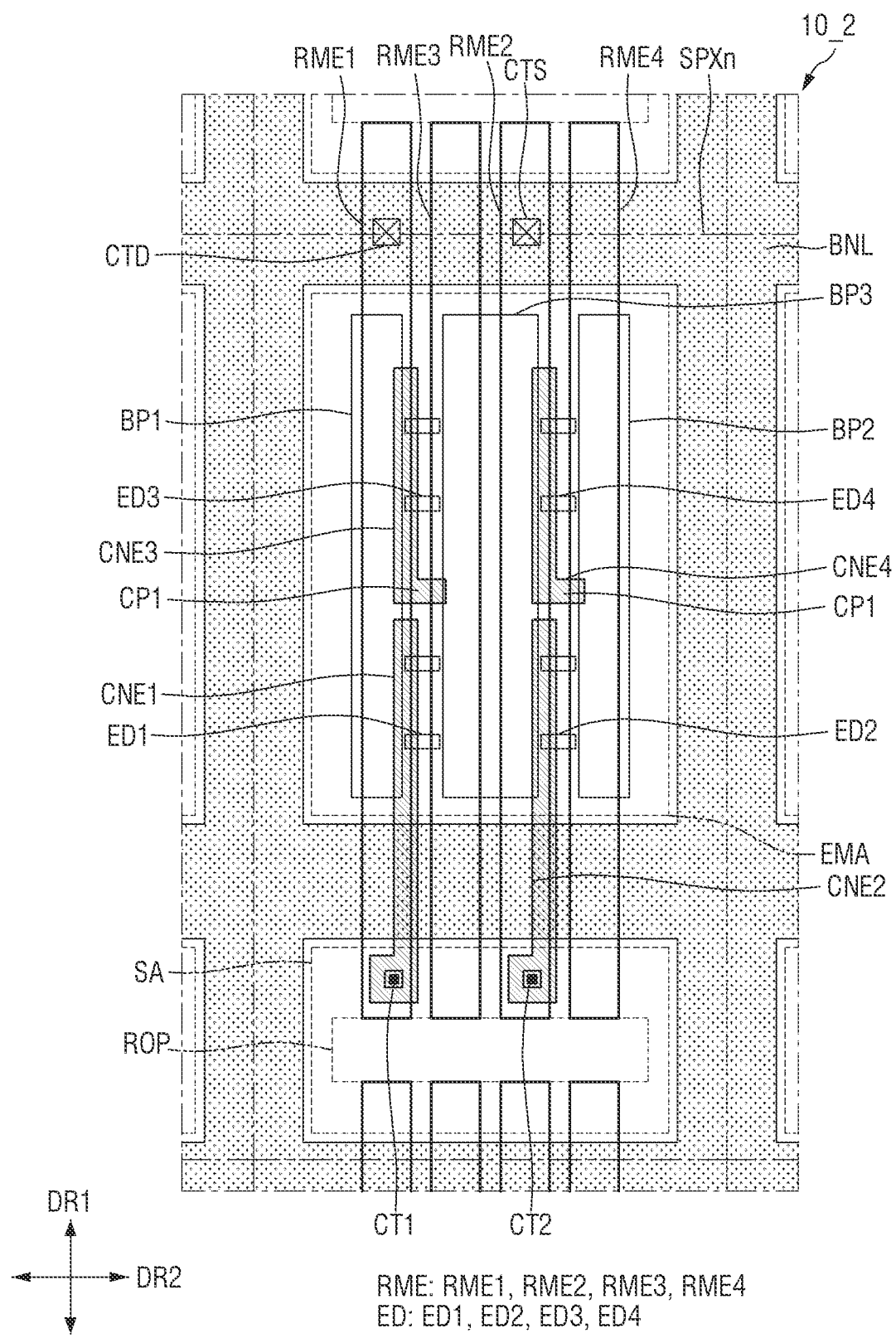
FIG. 20 is a plan view illustrating a first connection electrode layer disposed in one sub-pixel of FIG. 17.
Figure 21:
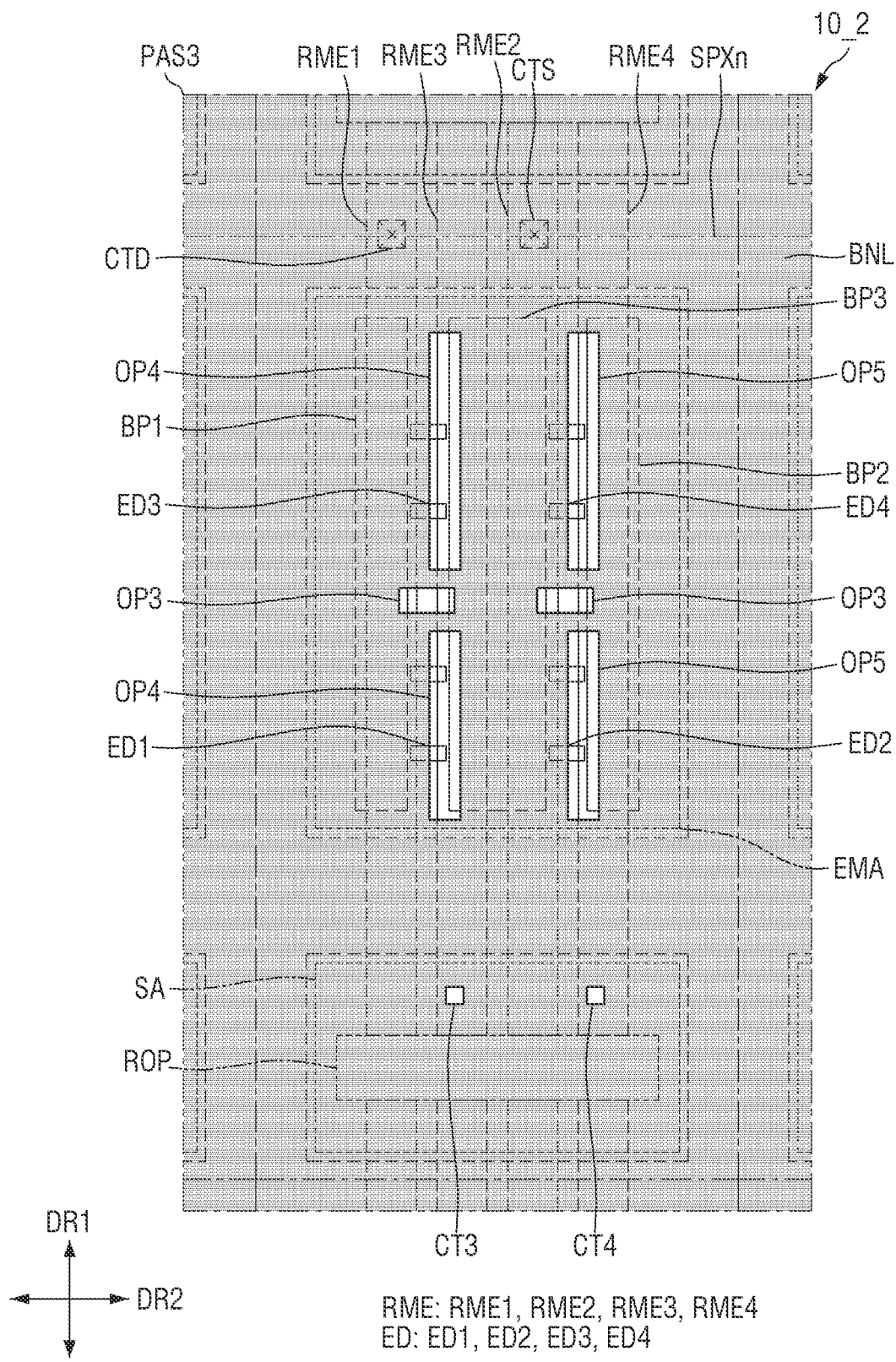
FIG. 21 is a plan view illustrating a third insulating layer disposed in one sub-pixel of FIG. 17.
Figure 22:
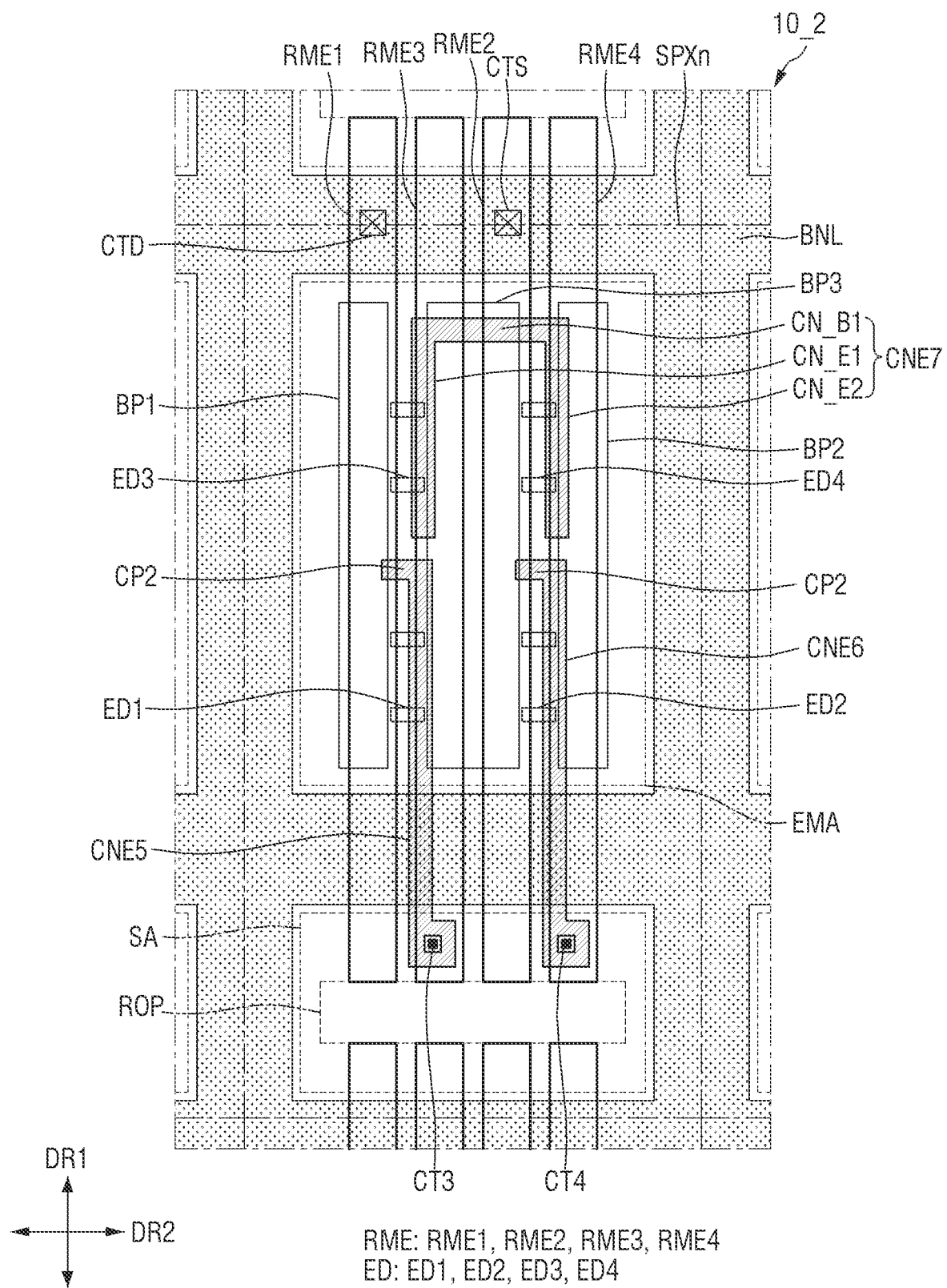
FIG. 22 is a plan view illustrating a second connection electrode layer disposed in one sub-pixel of FIG. 17.
Figure 23:
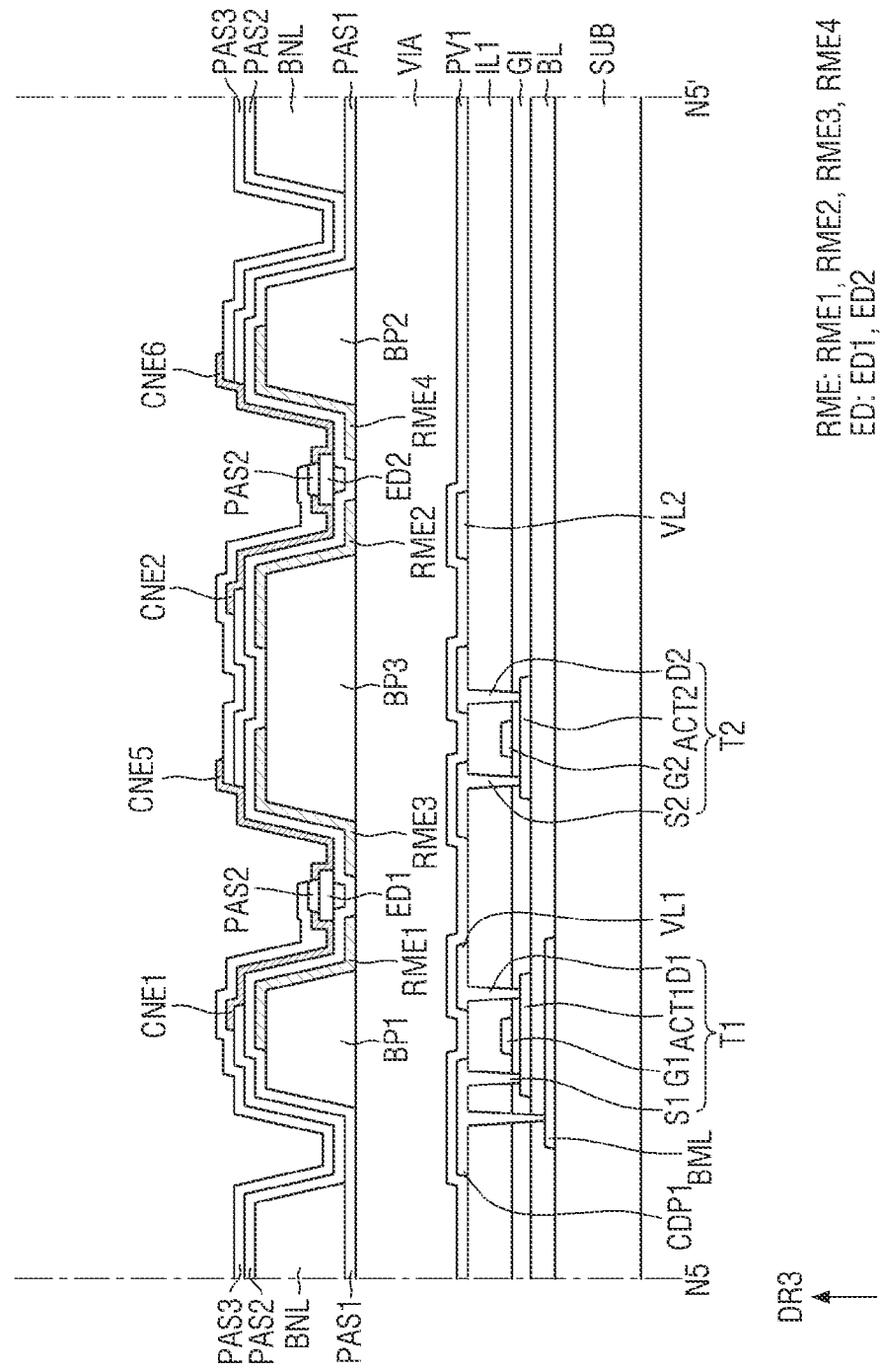
FIG. 23 is a cross-sectional view taken along the line N5-N5' of FIG. 17.
Figure 24:
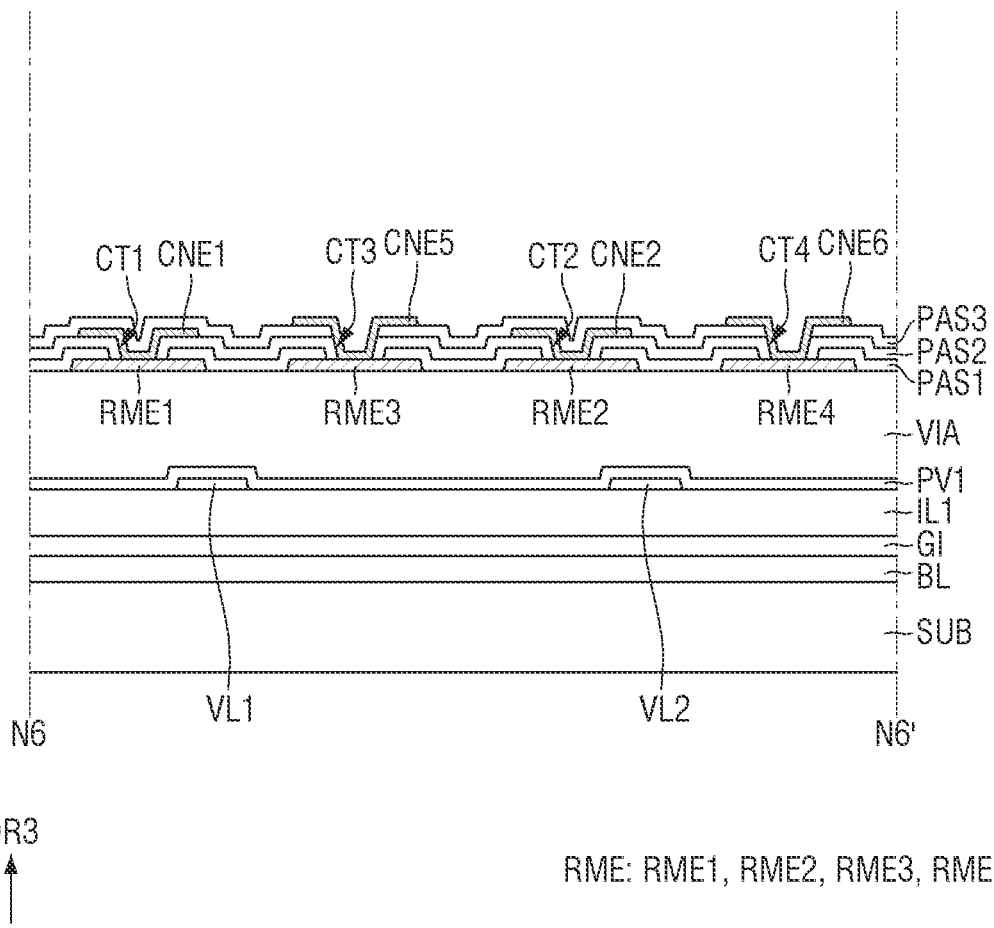
FIG. 24 is a cross-sectional view taken along the line N6-N6' of FIG. 17.

FIG. 18 is a plan view illustrating a first insulating layer PAS1 disposed in one sub-pixel of FIG. 17. FIG. 19 is a plan view illustrating a second insulating layer PAS2 disposed in one sub-pixel of FIG. 17. FIG. 20 is a plan view illustrating a first connection electrode layer disposed in one sub-pixel of FIG. 17. FIG. 21 is a plan view illustrating a third insulating layer PAS3 disposed in one sub-pixel of FIG. 17. FIG. 22 is a plan view illustrating a second connection electrode layer disposed in one sub-pixel of FIG. 17. FIG. 23 is a cross-sectional view taken along line N5-N5' of FIG. 17. FIG. 24 is a cross-sectional view taken along line N6-N6' of FIG. 17.

FIGS. 18 to 22 illustrate the planar arrangement of the plurality of insulating layers PAS1, PAS2, and PAS3 that are different layers disposed in one pixel PX, and the connection electrodes CNE1, CNE2, CNE3, CNE4, CNE5, CNE6, and CNE7. FIG. 18 illustrates the planar arrangement of the first insulating layer PAS1 disposed under the bank layer BNL, and in FIGS. 19 and 21 illustrate the planar arrangement of the second insulating layer PAS2 and the third insulating layer PAS3 disposed above the bank layer BNL. FIG. 23 illustrates a cross section across both ends of the first light emitting element ED1 and the second light emitting element ED2 disposed in one sub-pixel SPXn, and FIG. 24 illustrates a cross section across a plurality of contact portions CT1, CT2, CT3, and CT4 disposed in one sub-pixel SPXn.

Referring to FIGS. 18 to 24 in conjunction with FIG. 17, the bank patterns BP1, BP2, and BP3 may further include a third bank pattern BP3 disposed between the first bank pattern BP1 and the second bank pattern BP2. The first bank pattern BP1 may be located on the left side with respect to the center of the emission area EMA, the second bank pattern BP2 may be located on the right side with respect to the center of the emission area EMA, and the third bank pattern BP3 may be located at the center (or the central region) of the emission area EMA. The width of the third bank pattern BP3 measured in the second direction DR2 may be greater than those of the first bank pattern BP1 and the second bank pattern BP2 measured in the second direction DR2. The gap between the bank patterns BP1, BP2, and BP3 in the second direction DR2 may be greater than the gap between the electrodes RME. The first bank pattern BP1 may be disposed to partially overlap the first electrode RME1, and the second bank pattern BP2 may be disposed to partially overlap the fourth electrode RME4. The third bank pattern BP3 may be disposed to partially overlap the second electrode RME2 and the third electrode RME3. At least parts of the electrodes RME may be arranged without overlapping the bank patterns BP1, BP2, and BP3.

The plurality of electrodes RME arranged for each sub-pixel SPXn may further include a third electrode RME3 and a fourth electrode RME4 in addition to a first electrode RME1 and a second electrode RME2.

The third electrode RME3 may be disposed between the first electrode RME1 and the second electrode RME2, and the fourth electrode RME4 may be spaced from the third electrode RME3 in the second direction DR2 with the second electrode RME2 interposed therebetween. The plurality of electrodes RME may be sequentially arranged in the order of the first electrode RME1, the third electrode RME3, the second electrode RME2, and the fourth electrode RME4 from the left side to the right side of the sub-pixel SPXn. The electrodes RME may face (or oppose) and may be spaced from each other in the second direction DR2. The plurality of electrodes RME may be spaced from the electrodes RME of another sub-pixel SPXn adjacent in the first direction DR1 at the separation portion ROP of the sub-region SA.

Among the plurality of electrodes RME, the first electrode RME1 and the second electrode RME2 may be in contact with the first conductive pattern CDP1 and the second voltage line VL2 disposed thereunder through the electrode contact holes CTD and CTS disposed under the bank layer BNL, respectively, whereas the third electrode RME3 and the fourth electrode RME4 may not be in contact with them.

The first insulating layer PAS1 may be disposed in a structure similar to that of the above-described embodiment. The first insulating layer PAS1 may be disposed in the entire display area DPA and may cover the plurality of electrodes RME and the bank patterns BP1, BP2, and BP3.

In accordance with one or more embodiments, the first insulating layer PAS1 may include the plurality of openings OPR and the plurality of contact portions CT1, CT2, CT3, and CT4. The opening OPR disposed to correspond to the separation portion ROP, which is the opening of the first insulating layer PAS1, is the same as that described above with reference to FIG. 5. The plurality of contact portions CT1, CT2, CT3, and CT4 formed in the first insulating layer PAS1 may be disposed to overlap different electrodes RME in the third direction DR3. For example, the plurality of contact portions CT1, CT2, CT3, and CT4 may be disposed in the sub-region SA, and may include the first contact portion CT1 disposed to overlap the first electrode RME1, the second contact portion CT2 disposed to overlap the second electrode RME2, the third contact portion CT3 disposed to overlap the third electrode RME3, and the fourth contact portion CT4 disposed to overlap the fourth electrode RME4. The plurality of contact portions CT1, CT2, CT3, and CT4 may penetrate the first insulating layer PAS1 to partially expose the top surfaces of the electrodes RME1, RME2, RME3, and RME4 disposed thereunder, respectively. Each of the contact portions CT1, CT2, CT3, and CT4 may further penetrate some of the other insulating layers disposed on the first insulating layer PAS1.

The plurality of light emitting elements ED may be arranged between the bank patterns BP1, BP2, and BP3 or on different electrodes RME. Some of the light emitting elements ED may be arranged between the first bank pattern BP1 and the third bank pattern BP3, and some other light emitting elements ED may be arranged between the third bank pattern BP3 and the second bank pattern BP2. In accordance with one or more embodiments, the light emitting element ED may include a first light emitting element ED1 and a third light emitting element ED3 arranged between the first bank pattern BP1 and the third bank pattern BP3, and a second light emitting element ED2 and a fourth light emitting element ED4 arranged between the third bank pattern BP3 and the second bank pattern BP2. Each of the first light emitting element ED1 and the third light emitting element ED3 may be disposed above the first electrode RME1 and the third electrode RME3, and each of the second light emitting element ED2 and the fourth light emitting element ED4 may be disposed above the second electrode RME2 and the fourth electrode RME4. The first light emitting element ED1 and the second light emitting element ED2 may be arranged adjacent to the lower side of the emission area EMA of the corresponding sub-pixel SPXn or adjacent to the sub-region SA, and the third light emitting element ED3 and the fourth light emitting element ED4 may be arranged adjacent to the upper side of the emission area EMA of the corresponding sub-pixel SPXn.

However, the light emitting elements ED may not be classified according to the arrangement position in the emission area EMA, but may be classified according to a connection relationship with the connection electrode CNE, which will be described later. Both ends of each light emitting element ED may be in contact with different connection electrodes CNE according to an arrangement method of the connection electrodes CNE. The light emitting elements ED may be classified into different types of light emitting elements ED according to the type of the connection electrode CNE in contact therewith.

The second insulating layer PAS2 may be disposed in a structure similar to that of the above-described embodiment. The second insulating layer PAS2 may be disposed on the plurality of light emitting elements ED, the first insulating layer PAS1, the plurality of electrodes RME1, RME2, RME3, and RME4, and the bank layer BNL.

In accordance with one or more embodiments, the second insulating layer PAS2 may include a plurality of openings OP1, OP2, OP4, OP5, and OPR and the plurality of contact portions CT1, CT2, CT3, and CT4. The opening OPR formed to correspond to the separation portion ROP of the sub-region SA, which is the opening of the second insulating layer PAS2, is the same as that described above with reference to FIG. 6.

The second insulating layer PAS2 may include, in addition to the plurality of first openings OP1 partially overlapping the first electrode RME1 and the plurality of second openings OP2 partially overlapping the second electrode RME2, a plurality of fourth openings OP4 partially overlapping the third electrode RME3 and a plurality of fifth openings OP5 partially overlapping the fourth electrode RME4. The first openings OP1 and the second openings OP2 may be disposed in the emission area EMA, and may respectively expose one ends of corresponding ones of the light emitting elements ED. The first openings OP1 may expose or may not cover the first ends of the light emitting elements ED that are disposed on the first electrodes RME1, and the second openings OP2 may expose or may not cover the second ends of the light emitting elements ED that are disposed on the second electrode RME2.

The plurality of first openings OP1 may be disposed to overlap one side of the first electrode RME1 that faces (or opposes) the third electrode RME3, and the plurality of first openings OP1 disposed in one sub-pixel SPXn may be disposed to be spaced from each other in the first direction DR1 in the emission area EMA of the corresponding sub-pixel SPXn. One first opening OP1 may expose the first ends of the first light emitting elements ED1, and another first opening OP1 may expose the first ends of the third light emitting elements ED3.

The plurality of second openings OP2 may be disposed to overlap one side of the second electrode RME2 that faces (or opposes) the fourth electrode RME4, and the plurality of second openings OP2 disposed in one sub-pixel SPXn may be disposed to be spaced from each other in the first direction DR1 in the emission area EMA of the corresponding sub-pixel SPXn. One second opening OP2 may expose the first ends of the second light emitting elements ED2, and another second opening OP2 may expose the first ends of the fourth light emitting elements ED4.

Similarly, the plurality of fourth openings OP4 may be disposed to overlap one side of the third electrode RME3 that faces (or opposes) the first electrode RME1, and the plurality of fourth openings OP4 disposed in one sub-pixel SPXn may be disposed to be spaced from each other in the first direction DR1 in the emission area EMA of the corresponding sub-pixel SPXn. One fourth opening OP4 may expose the second ends of the first light emitting elements ED1, and another fourth opening OP4 may expose the second ends of the third light emitting elements ED3.

The plurality of fifth openings OP5 may be disposed to overlap one side of the fourth electrode RME4 that faces (or opposes) the second electrode RME2, and the plurality of fifth openings OP5 disposed in one sub-pixel SPXn may be disposed to be spaced from each other in the first direction DR1 in the emission area EMA of the corresponding sub-pixel SPXn. One fifth opening OP5 may expose the second ends of the second light emitting elements ED2, and another fifth opening OP5 may expose the second ends of the fourth light emitting elements ED4.

The plurality of contact portions CT1, CT2, CT3, and CT4 formed on the second insulating layer PAS2 may be disposed to overlap different electrodes RME. For example, the plurality of contact portions CT1, CT2, CT3, and CT4 may be disposed in the sub-region SA, and may include the first contact portion CT1 disposed to overlap the first electrode RME1, the second contact portion CT2 disposed to overlap the second electrode RME2, the third contact portion CT3 disposed to overlap the third electrode RME3, and the fourth contact portion CT4 disposed to overlap the fourth electrode RME4. The plurality of contact portions CT1, CT2, CT3, and CT4 may penetrate the second insulating layer PAS2 to partially expose the top surfaces of the electrodes RME1, RME2, RME3, and RME4 disposed thereunder, respectively. Some of the contact portions CT1, CT2, CT3, and CT4 may further penetrate another insulating layer disposed on the second insulating layer PAS2.

The plurality of connection electrodes CNE may include, in addition to the first connection electrode CNE1 and the third connection electrode CNE3 disposed on the first electrode RME1 and the second connection electrode CNE2 and the fourth connection electrode CNE4 disposed on the second electrode RME2, a fifth connection electrode CNE5 disposed on the third electrode RME3, a sixth connection electrode CNE6 disposed on the fourth electrode RME4, and a seventh connection electrode CNE7 disposed across the plurality of electrodes RME (e.g., RME2, RME3, RME4).

The first connection electrode CNE1 and the third connection electrode CNE3 may be disposed on the first electrode RME1 and may be spaced from each other in the first direction DR1. The second connection electrode CNE2 and the fourth connection electrode CNE4 may be disposed on the second electrode RME2 and may be spaced from each other in the first direction DR1. The first connection electrode CNE1 and the second connection electrode CNE2 may be disposed below the center of the emission area EMA in the first direction DR1, and the third connection electrode CNE3 and the fourth connection electrode CNE4 may be disposed above the center of the emission area EMA in the first direction DR1. The first connection electrode CNE1 and the second connection electrode CNE2 may be disposed across the emission area EMA and the sub-region SA of the corresponding sub-pixel SPXn, and may be in direct contact with the first electrode RME1 and the second electrode RME2 through the first contact portion CT1 and the second contact portion CT2 formed in the sub-region SA, respectively. The first connection electrode CNE1 may be in direct contact with the first electrode RME1 through the first contact portion CT1 penetrating the first insulating layer PAS1 and the second insulating layer PAS2 in the sub-region SA, and the second connection electrode CNE2 may be in contact with the second electrode RME2 through the second contact portion CT2 penetrating the first insulating layer PAS1 and the second insulating layer PAS2 in the sub-region SA.

The fifth connection electrode CNE5 may face (or oppose) and may be spaced from the first connection electrode CNE1 in the second direction DR2, and may be disposed on the third electrode RME3. The sixth connection electrode CNE6 may be spaced from the second connection electrode CNE2 in the second direction DR2, and may be disposed on the fourth electrode RME4. The fifth connection electrode CNE5 and the sixth connection electrode CNE6 may be disposed below the center of the emission area EMA in the first direction DR1, and may be disposed across the emission area EMA and the sub-region SA of the corresponding sub-pixel SPXn. The fifth connection electrode CNE5 and the sixth connection electrode CNE6 may be in direct contact with the third electrode RME3 and the fourth electrode RME4 through the third contact portion CT3 and the fourth contact portion CT4 formed in the sub-region SA, respectively. The fifth connection electrode CNE5 may be in direct contact with the third electrode RME3 through the third contact portion CT3 penetrating the first insulating layer PAS1, the second insulating layer PAS2, and the third insulating layer PAS3 in the sub-region SA, and the sixth connection electrode CNE6 may be in contact with the fourth electrode RME4 through the fourth contact portion CT4 penetrating the first insulating layer PAS1, the second insulating layer PAS2, and the third insulating layer PAS3 in the sub-region SA.

The seventh connection electrode CNE7 may include a first electrode extension portion CN_E1 disposed on the third electrode RME3, a second electrode extension portion CN_E2 disposed on the fourth electrode RME4, and a first electrode connection portion CN_B1 that connects the first electrode extension portion CN_E1 to the second electrode extension portion CN_E2. The first electrode extension portion CN_E1 may face (or oppose) and may be spaced from the third connection electrode CNE3 in the second direction DR2, and may be spaced from the fifth connection electrode CNE5 in the first direction DR1. The second electrode extension portion CN_E2 may face (or oppose) and may be spaced from the fourth connection electrode CNE4 in the second direction DR2, and may be spaced from the sixth connection electrode CNE6 in the first direction DR1. The first electrode connection portion CN_B1 may be disposed across the third electrode RME3, the second electrode RME2, and the fourth electrode RME4 on the bank layer BNL. The seventh connection electrode CNE7 may be disposed to be around (or surround) the fourth connection electrode CNE4 in a plan view.

The first connection electrode CNE1, the second connection electrode CNE2, the third connection electrode CNE3, and the fourth connection electrode CNE4 may be the connection electrodes of the first connection electrode layer disposed on the second insulating layer PAS2, and the fifth connection electrode CNE5, the sixth connection electrode CNE6, and the seventh connection electrode CNE7 may be the connection electrodes of the second connection electrode layer disposed on the third insulating layer PAS3. The third insulating layer PAS3 may be disposed between the first connection electrode layer and the second connection electrode layer.

The third insulating layer PAS3 may be disposed in a structure similar to that of the above-described embodiment. The third insulating layer PAS3 may be disposed on the second insulating layer PAS2 except the region in which the second connection electrode layer is disposed.

In accordance with one or more embodiments, the third insulating layer PAS3 may include the plurality of openings OP3, OP4, OP5, and the plurality of contact portions CT3 and CT4. The third insulating layer PAS3 may include the third opening OP3 disposed across the electrodes RME spaced from each other and partially exposing the top surface of the first connection electrode layer, the plurality of fourth openings OP4 partially overlapping the third electrode RME3 in the third direction DR3, and the plurality of fifth openings OP5 partially overlapping the fourth electrode RME4 in the third direction DR3.

The third openings OP3 of the third insulating layer PAS3 may partially overlap the first electrode RME1 and the third electrode RME3 or partially overlap the second electrode RME2 and the fourth electrode RME4 in the emission area EMA, and may expose or may not cover a part of the connection electrode of the first connection electrode layer disposed thereunder. The plurality of third openings OP3 spaced from each other may be disposed in each sub-pixel SPXn. The plurality of third openings OP3 may be disposed between the region in which the first light emitting elements ED1 are disposed and the region in which the third light emitting elements ED3 are disposed, or between the region in which the second light emitting elements ED2 are disposed and the region in which the fourth light emitting elements ED4 are disposed. Alternatively, the third openings OP3 may be disposed in a space between the first openings OP1 and the fourth openings OP4 that are respectively spaced from each other in the first direction DR1, or in a space between the second openings OP2 and the fifth openings OP5 that are respectively spaced from each other in the first direction DR1. Unlike the other openings OP1, OP2, OP4, and OP5, the third opening OP3 may have a shape in which the width measured in the second direction DR2 is greater than the width measured in the first direction DR1, may be disposed across different electrodes RME1, RME2, RME3, and RME4. Different third openings OP3 may be disposed to be spaced from each other in the second direction DR2, and one third opening OP3 may be disposed across the first electrode RME1 and the third electrode RME3 and another third opening OP3 may be disposed across the second electrode RME2 and the fourth electrode RME4.

The plurality of fourth openings OP4 may be disposed to overlap one side of the third electrode RME3 that faces (or opposes) the first electrode RME1, and the plurality of fourth openings OP4 disposed in one sub-pixel SPXn may be disposed to be spaced from each other in the first direction DR1 in the emission area EMA of the corresponding sub-pixel SPXn. One fourth opening OP4 may expose the second ends of the first light emitting elements ED1, and another fourth opening OP4 may expose the second ends of the third light emitting elements ED3.

The plurality of fifth openings OP5 may be disposed to overlap one side of the fourth electrode RME4 that faces (or opposes) the second electrode RME2, and the plurality of fifth openings OP5 disposed in one sub-pixel SPXn may be disposed to be spaced from each other in the first direction DR1 in the emission area EMA of the corresponding sub-pixel SPXn. One fifth opening OP5 may expose the second ends of the second light emitting elements ED2, and another fifth opening OP5 may expose the second ends of the fourth light emitting elements ED4.

The plurality of contact portions CT3 and CT4 formed in the third insulating layer PAS3 may be disposed to overlap different electrodes RME. For example, the third insulating layer PAS3 may include the third contact portion CT3 disposed to overlap the third electrode RME3, and the fourth contact portion CT4 disposed to overlap the fourth electrode RME4. The third contact portion CT3 and the fourth contact portion CT4 may penetrate the third insulating layer PAS3, the second insulating layer PAS2, and the first insulating layer PAS1, to partially expose the top surfaces of the third electrode RME3 and the fourth electrode RME4 disposed thereunder.

Figure 25:
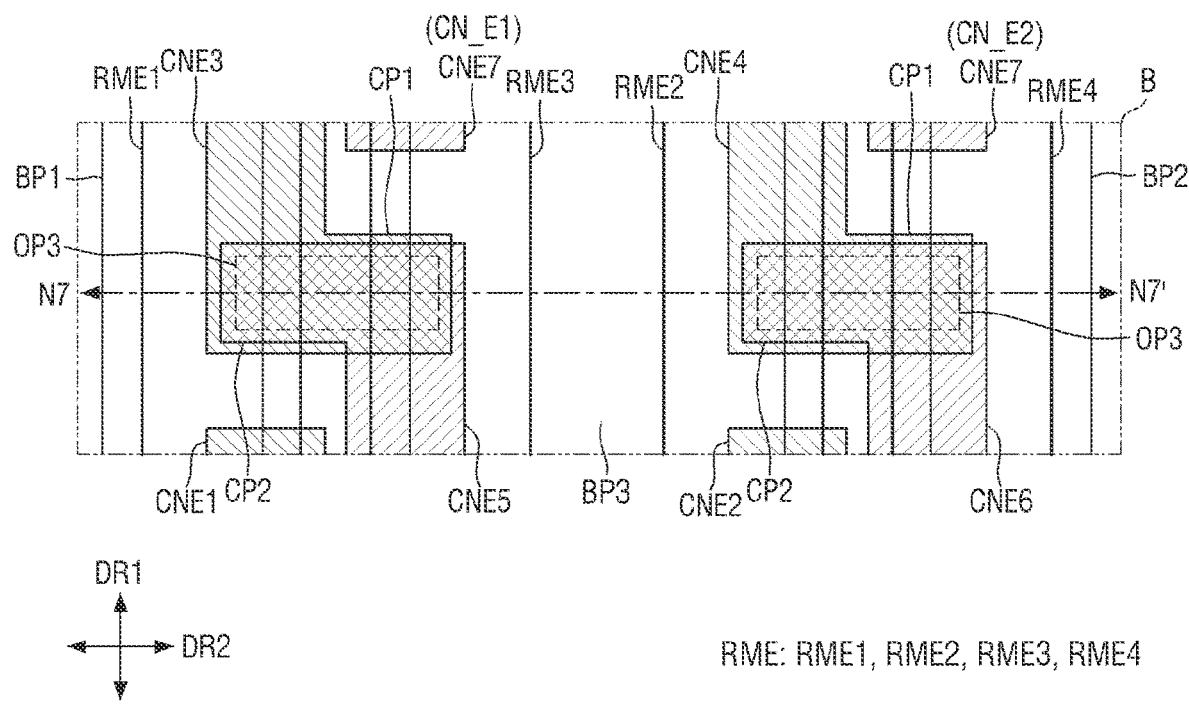
FIG. 25 is an enlarged view of a part B of FIG. 17.
Figure 26:
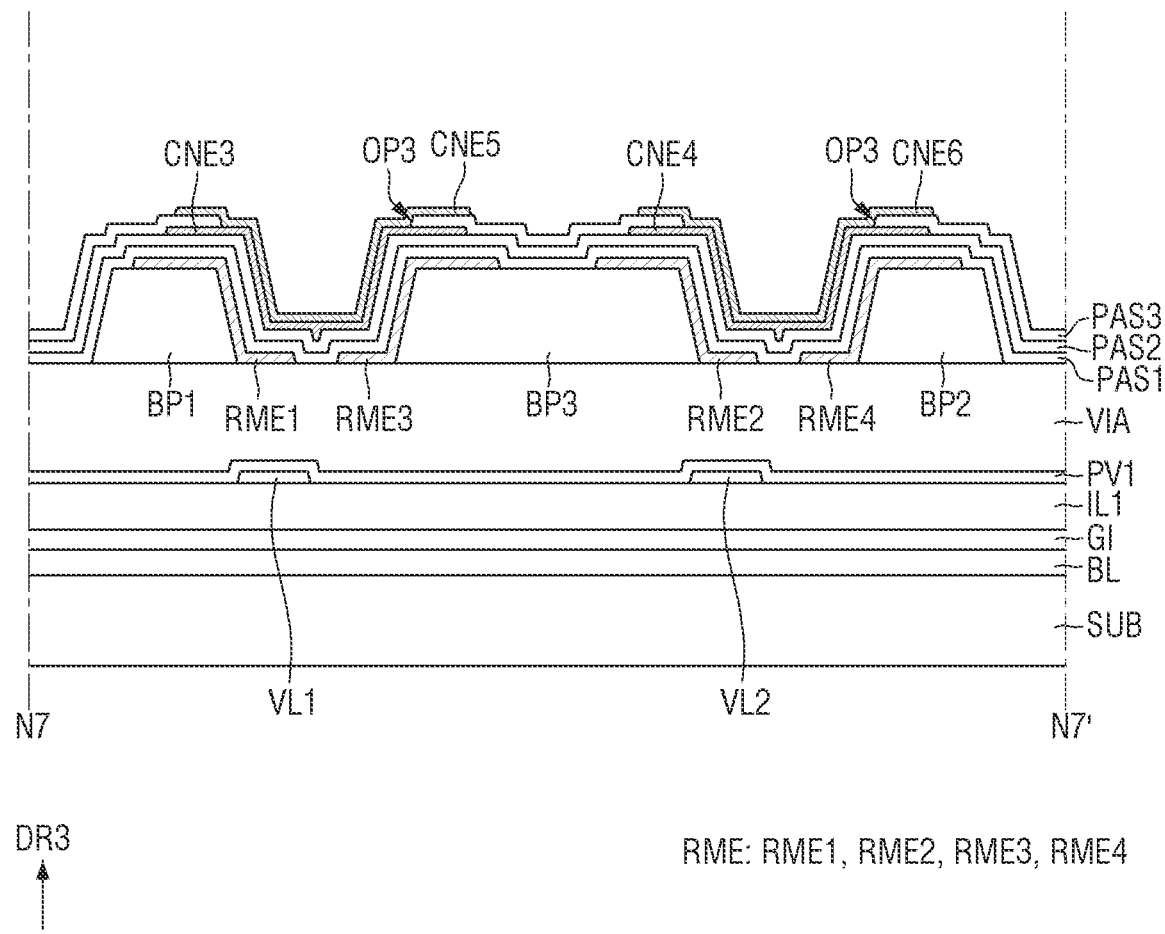
FIG. 26 is a cross-sectional view taken along the line N7-N7' in FIG. 25.

FIG. 25 is an enlarged view of part B of FIG. 17. FIG. 26 is a cross-sectional view taken along the line N7-N7' in FIG. 25. FIG. 26 illustrates a cross section across the third openings OP3 of the third insulating layer PAS3 in the second direction DR2.

Referring to FIGS. 25 and 26 in conjunction with FIGS. 17 to 24, in a display device 10_2 according to one or more embodiments, the third connection electrode CNE3 of the first connection electrode layer and the fifth connection electrode CNE5 of the second connection electrode layer may be connected to each other, and the fourth connection electrode CNE4 of the first connection electrode layer and the sixth connection electrode CNE6 of the second connection electrode layer may be connected to each other. The third connection electrode CNE3 and the fourth connection electrode CNE4 may include the first connection portion CP1 disposed on one side facing (or opposing) the first connection electrode CNE1 or the second connection electrode CNE2 in the first direction DR1, and the fifth connection electrode CNE5 and the sixth connection electrode CNE6 may include the second connection portion CP2 disposed on one side facing (or opposing) the seventh connection electrode CNE7 in the first direction DR1. Each of the third connection electrode CNE3 and the fourth connection electrode CNE4 may have a shape extending in the first direction DR1 and in which the first connection portion CP1 is bent in the second direction DR2, and each of the fifth connection electrode CNE5 and the sixth connection electrode CNE6 may have a shape extending in the first direction DR1 and in which the second connection portion CP2 is bent in the second direction DR2. The first connection portion CP1 and the second connection portion CP2 of different connection electrodes CNE3, CNE4, CNE5, and CNE6 may overlap each other in the thickness direction (e.g., a third direction DR3). The first connection portions CP1 may overlap the third opening OP3 of the third insulating layer PAS3, so that the top surfaces of the first connection portions CP1 may be exposed, and the second connection portions CP2 may be in direct contact with the first connection portion CP1 exposed by the third opening OP3.

The first connection electrode CNE1 and the second connection electrode CNE2 may be the first type connection electrodes connected to the electrodes RME1 and RME2 directly connected to the third conductive layer, the fifth connection electrode CNE5 and the sixth connection electrode CNE6 may be the second type connection electrodes connected to the electrodes RME3 and RME4 that are not connected to the third conductive layer, and the third connection electrode CNE3, the fourth connection electrode CNE4, and the seventh connection electrode CNE7 may be third type connection electrodes that are not connected to the electrode RME. The third type connection electrode may be in contact with the light emitting elements ED without being connected to the electrode RME, and may constitute an electrical connection circuit of the light emitting elements ED together with other connection electrodes CNE.

The plurality of light emitting elements ED may be classified into different light emitting elements ED depending on the connection electrodes CNE to be in contact with both ends of the light emitting elements ED to correspond to the arrangement structure of the connection electrodes CNE. The first light emitting element ED1 and the second light emitting element ED2 may have first ends in contact with the first type connection electrodes and second ends in contact with the second type connection electrodes. The first light emitting element ED1 may be in contact with the first connection electrode CNE1 and the fifth connection electrode CNE5, and the second light emitting element ED2 may be in contact with the second connection electrode CNE2 and the sixth connection electrode CNE6. The third light emitting element ED3 and the fourth light emitting element ED4 may have both ends in contact with the third type connection electrodes. The third light emitting element ED3 may be in contact with the third connection electrode CNE3 and the seventh connection electrode CNE7, and the fourth light emitting element ED4 may be in contact with the fourth connection electrode CNE4 and the seventh connection electrode CNE7.

The plurality of light emitting elements ED may be connected in series through the plurality of connection electrodes CNE. Because the display device 10_2 according to the described embodiment includes a larger number of light emitting elements ED for each sub-pixel SPXn and the light emitting elements ED are connected in series, the light emission amount per unit area may be further increased.

Further, in the display device 10 according to one or more embodiments, the plurality of connection electrodes CNE may be classified into the connection electrodes of different connection electrode layers depending on the layer disposed with respect to the second insulating layer PAS2 and the third insulating layer PAS3. In accordance with one or more embodiments, the connection electrodes CNE1, CNE2, CNE3, CNE4, CNE5, CNE6, and CNE7 disposed on or at the same connection electrode layer may be in contact with the same end between both ends of the light emitting element ED. Such arrangement of the connection electrodes CNE is desirable in that it is possible to deal with the misalignment of the overlay design between the patterns by shifting the patterns of the connection electrodes CNE even if the patterns of the second insulating layer PAS2 and the third insulating layer PAS3 are shifted in the manufacturing process of the display device 10_2.

As described above, the first connection electrode CNE1, the second connection electrode CNE2, the third connection electrode CNE3, and the fourth connection electrode CNE4 disposed on the first connection electrode layer may be in contact with the first ends of the light emitting elements ED, and the fifth connection electrode CNE5, the sixth connection electrode CNE6, and the seventh connection electrode CNE7 disposed on or at the second connection electrode layer may be in contact with the second ends of the light emitting elements ED. Because the connection electrodes disposed on or at the same connection electrode layer are disposed to be in contact with the same one end with respect to the light emitting element ED, the display device 10_2 is desirable in that it is easy to deal with the overlay misalignment.

For example, the seventh connection electrode CNE7 is disposed across the plurality of electrodes RME and is disposed to be in contact with different light emitting elements ED3 and ED4. Because, however, the seventh connection electrodes CNE7 are designed to be in contact with only the same one end between both ends of the different light emitting elements ED3 and ED4, it is possible to prevent a problem that only any one of the different light emitting elements ED3 and ED4 is in contact with the connection electrode CNE and the other light emitting element is not in contact with the connection electrode CNE. Further, even if the seventh connection electrode CNE7 disposed across the plurality of electrodes RME is formed while being shifted during overlay alignment, the electrode extension portions CN_E1 and CN_E2 of the seventh connection electrodes CNE7 move in the same direction and, thus, it is possible to maintain the same distance between the electrode extension portions CN_E1 and CN_E2 and another connection electrode CNE.

Figure 27:
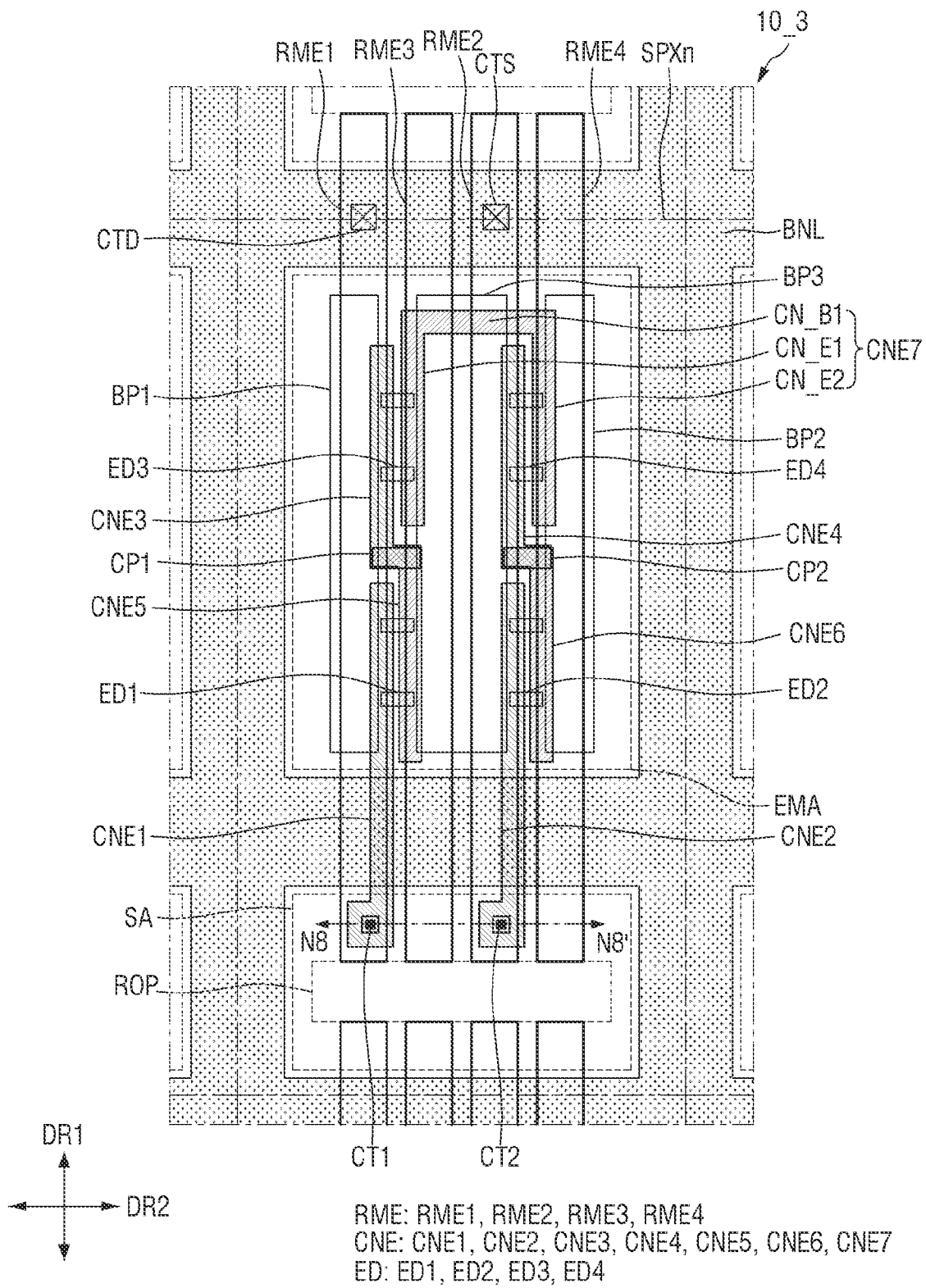
FIG. 27 is a plan view illustrating one sub-pixel of a display device according to one or more embodiments.
Figure 28:
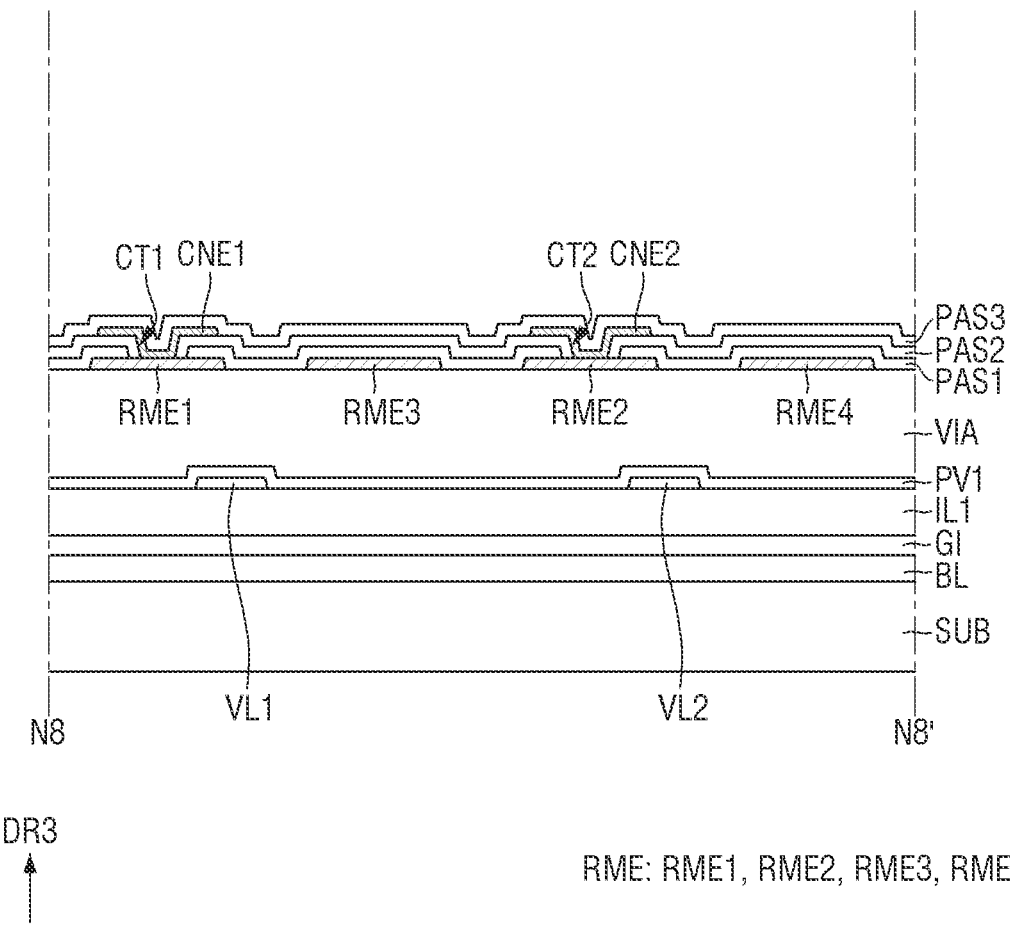
FIG. 28 is a cross-sectional view taken along the line N8-N8' in FIG. 27.

FIG. 27 is a plan view illustrating one sub-pixel of a display device according to one or more embodiments. FIG. 28 is a cross-sectional view taken along the line N8-N8' in FIG. 27. FIG. 28 illustrates a cross section across the contact portions CT1 and CT2 and the electrodes RME in the second direction DR2 in the sub-region SA of one sub-pixel SPXn.

Referring to FIGS. 27 and 28, a display device 10_3 according to one or more embodiments may include four electrodes for each sub-pixel SPXn, and only the first electrode RME1 and the second electrode RME2 may be in contact with the connection electrode CNE. The first electrode RME1 and the second electrode RME2 may be electrically connected to the first connection electrode CNE1 and the second connection electrode CNE2 through the first contact portion CT1 and the second contact portion CT2, respectively, and the third electrode RME3 and the fourth electrode RME4 may not be connected to the fifth connection electrode CNE5 and the sixth connection electrode CNE6. The described embodiment is different from the embodiment of FIG. 17 in that the connection between the third electrode RME3 and the fifth connection electrode CNE5 and the connection between the fourth electrode RME4 and the sixth connection electrode CNE6 are different.

As described in the embodiment of FIG. 27, the first connection electrode CNE1 and the second connection electrode CNE2, which are the first type connection electrodes electrically connected to the first electrode RME1 and the second electrode RME2 respectively, are the connection electrodes to which the voltages applied from the voltage lines VL1 and VL2 are directly transmitted through the electrode RME. On the other hand, the third connection electrode CNE3, the fourth connection electrode CNE4, the fifth connection electrode CNE5, the sixth connection electrode CNE6, and the seventh connection electrode CNE7, which are the connection electrodes in contact with different light emitting elements ED1 and ED2, ED3 and ED4, may form the connection path between the light emitting elements ED even if they are not necessarily directly electrically connected to the electrode RME. Accordingly, the first connection electrode CNE1 and the second connection electrode CNE2 may be electrically connected to the electrode RME through the contact portions CT1 and CT2, and other connection electrodes (e.g., CNE3, CNE4, CNE5, CNE6, and CNE7) may be in contact with and connected to only the light emitting elements ED.

The lengths of the fifth connection electrode CNE5 and the sixth connection electrode CNE6 extending in the first direction DR1 may be smaller than those of the embodiment of FIG. 17, and the fifth connection electrode CNE5 and the sixth connection electrode CNE6 may be disposed only in the emission area EMA similarly to the third connection electrode CNE3 and the fourth connection electrode CNE4. Because only the first contact portion CT1 and the second contact portion CT2 are disposed in the sub-region SA, the third electrode RME3 and the fourth electrode RME4 may be covered by the first insulating layer PAS1, the second insulating layer PAS2, and the third insulating layer PAS3.

Figure 29:
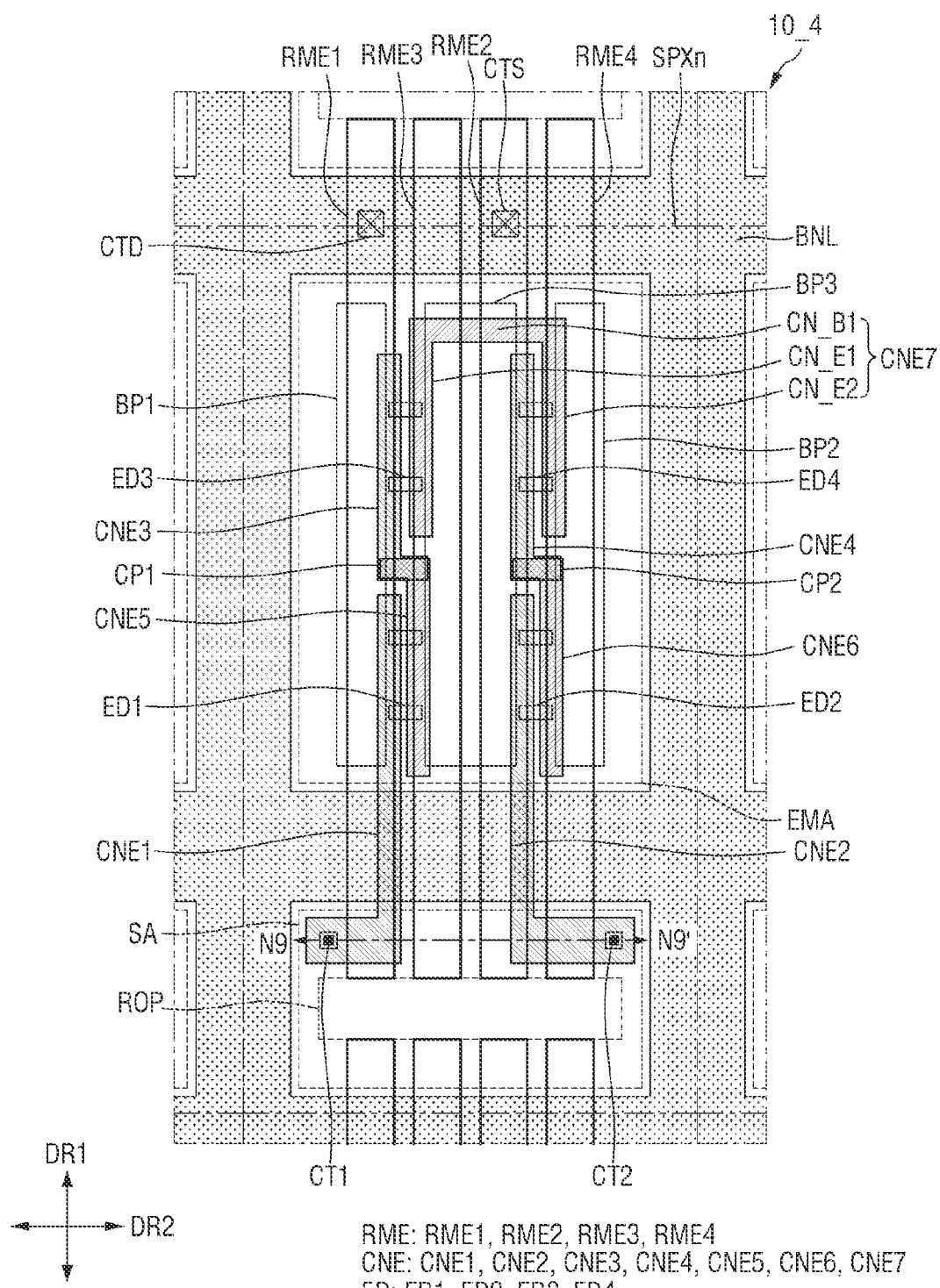
FIG. 29 is a plan view illustrating a sub-pixel of a display device according to one or more embodiments.
Figure 30:
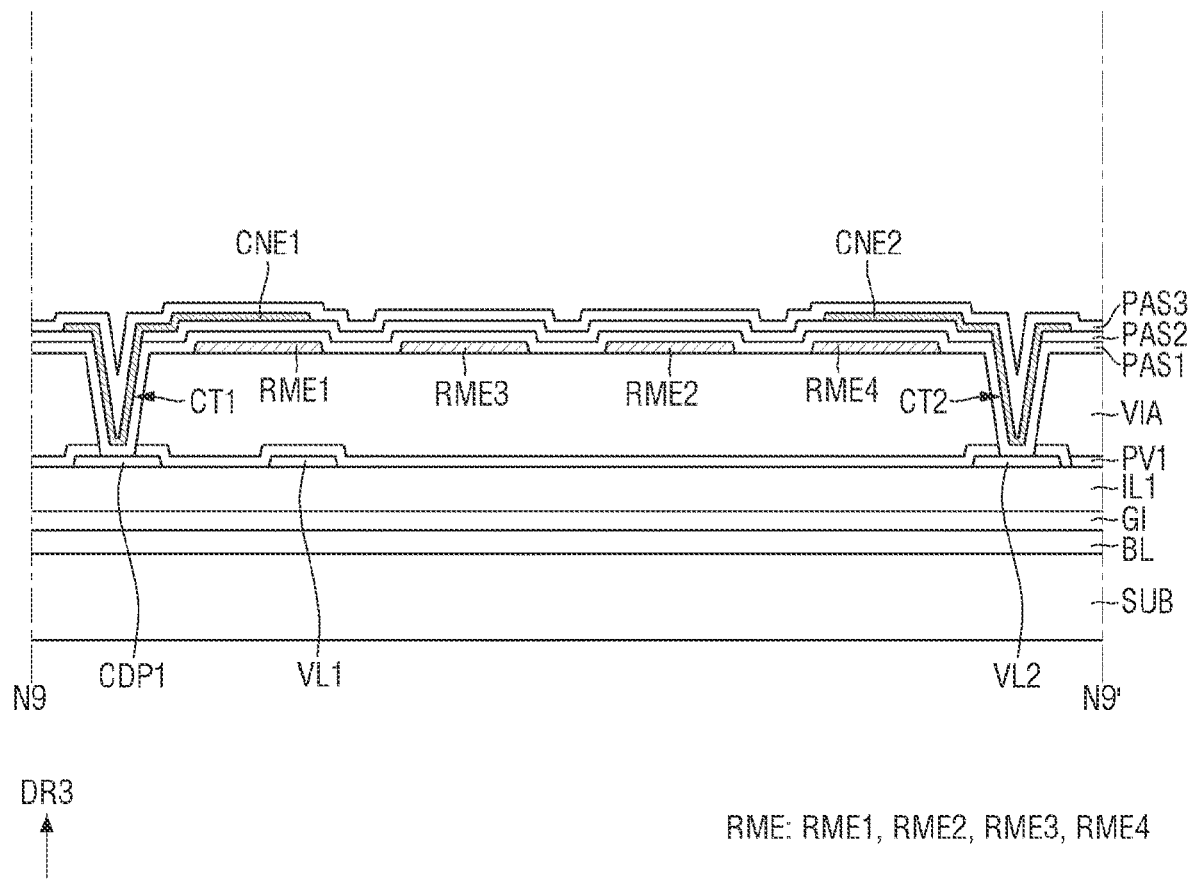
FIG. 30 is a cross-sectional view taken along the line N9-N9' in FIG. 29.

FIG. 29 is a plan view illustrating a sub-pixel of a display device according to one or more embodiments. FIG. 30 is a cross-sectional view taken along line N9-N9' in FIG. 29. FIG. 30 illustrates a cross section across the contact portions CT1 and CT2 and the electrodes RME in the second direction DR2 in the sub-region SA of one sub-pixel SPXn.

Referring to FIGS. 29 and 30, in a display device 10_4 according to one or more embodiments, each of the first connection electrode CNE1 and the second connection electrode CNE2 may not be connected to the electrode RME and may be directly connected to the third conductive layer. The first connection electrode CNE1 may be in direct contact with the first conductive pattern CDP1 through the first contact portion CT1 penetrating the first passivation layer PV1, the via layer VIA, the first insulating layer PAS1, and the second insulating layer PAS2, and the second connection electrode CNE2 may be in direct contact with the second voltage line VL2 through the second contact portion CT2 penetrating the first passivation layer PV1, the via layer VIA, the first insulating layer PAS1, and the second insulating layer PAS2. Because the first contact portion CT1 and the second contact portion CT2 are formed to penetrate the via layer VIA and the first passivation layer PV1, they do not overlap the electrodes RME unlike the above-described embodiments. Because the first connection electrode CNE1 and the second connection electrode CNE2 are directly connected to the third conductive layer and electrically connected to the first voltage line VL1 and the second voltage line VL2, respectively, each of the first electrode RME1, the second electrode RME2, the third electrode RME3, and the fourth electrode RME4 may be covered by the first to third insulating layers PAS1, PAS2, and PAS3 in the sub-region SA. The described embodiment is different from the embodiment of FIG. 27 in that the first connection electrode CNE1 and the second connection electrode CNE2 are not directly connected to the electrode RME. In the following description, redundant description will be omitted.

Figure 31:
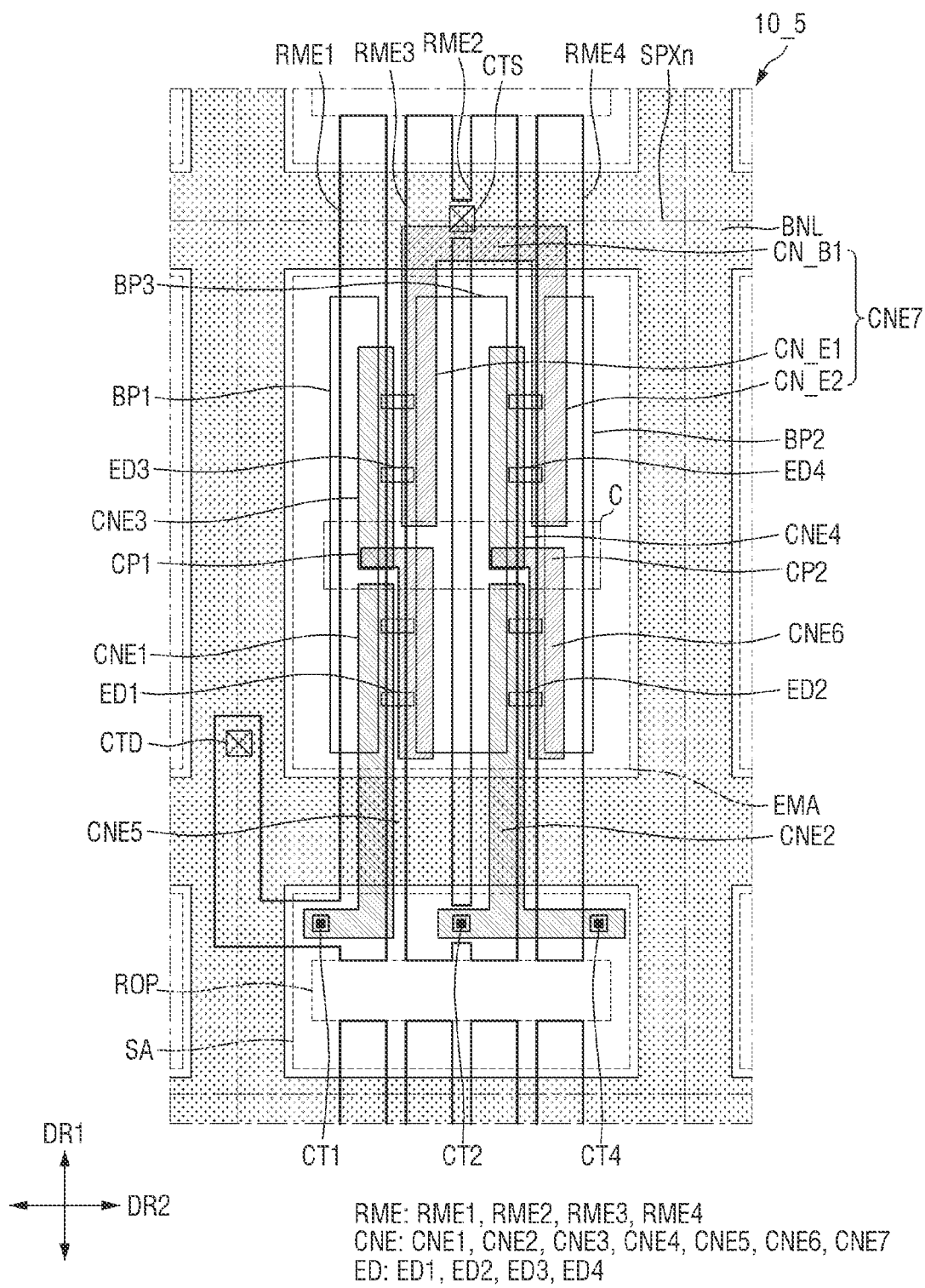
FIG. 31 is a plan view illustrating one sub-pixel of a display device according to one or more embodiments.

FIG. 31 is a plan view illustrating one sub-pixel of a display device according to another embodiment. FIG. 31 illustrates the planar arrangement of the electrodes RME (RME1, RME2, RME3, and RME4), the bank patterns BP1, BP2, and BP3, the bank layer BNL, the plurality of light emitting elements ED, and the connection electrodes CNE (CNE1, CNE2, CNE3, CNE4, CNE5, CNE6, and CNE7) disposed in one sub-pixel PXn of a display device 10_4.

Referring to FIG. 31, a display device 10_5 according to one or more embodiments differs from the embodiment of FIG. 17 in that the structures of some of the respective electrodes RME1, RME2, RME3, and RME4 and the structures of the respective connection electrodes CNE (CNE1, CNE2, CNE3, CNE4, CNE5, CNE6, and CNE7) are different. For example, some of the plurality of electrodes RME1, RME2, RME3, and RME4 may be connected to each other, and others may include a portion extending in the first direction DR1 and a portion bent in the second direction DR2 therefrom. The plurality of connection electrodes CNE (CNE1, CNE2, CNE3, CNE4, CNE5, CNE6, and CNE7) may include connection electrodes (e.g., the first connection electrode CNE1 and the second connection electrode CNE2) connected to the electrode RME, and connection electrodes (e.g., the fifth connection electrode CNE5 and the sixth connection electrode CNE6) including a connection portion electrically connected to another connection electrode CNE. In the following description, redundant description will be omitted while focusing on differences.

Figure 32:
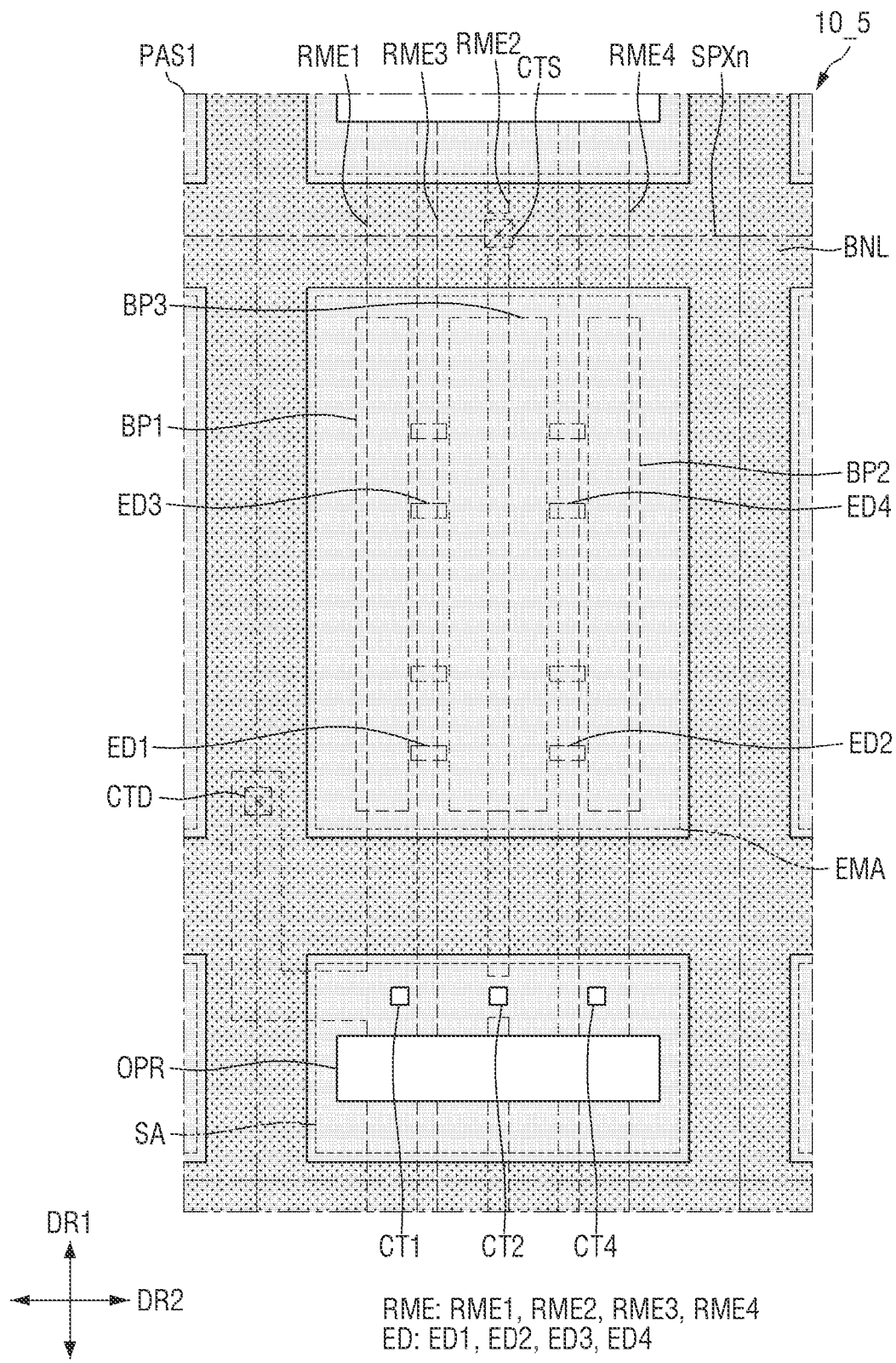
FIG. 32 is a plan view illustrating a first insulating layer disposed in one sub-pixel of FIG. 31.
Figure 33:
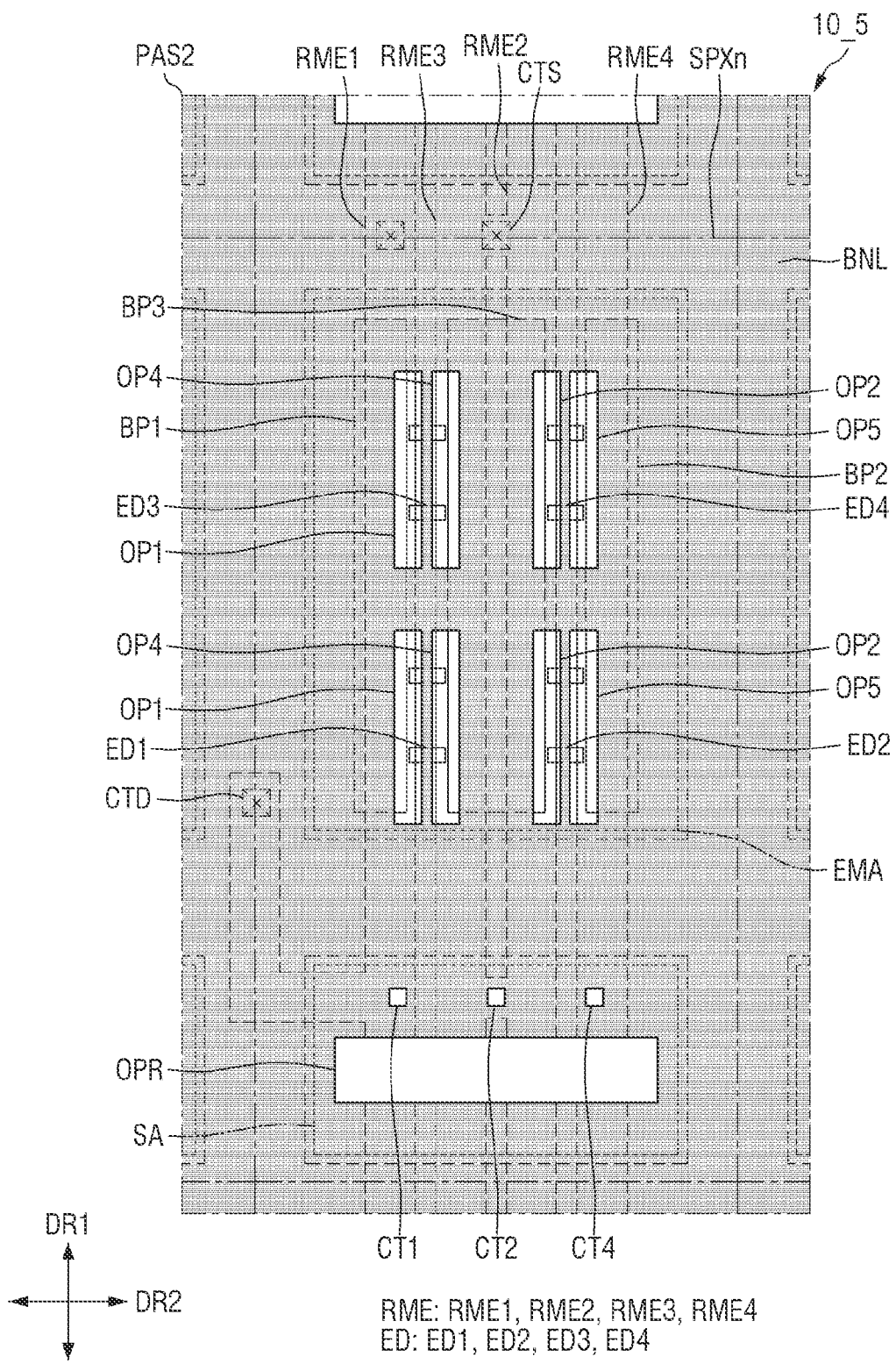
FIG. 33 is a plan view illustrating a second insulating layer disposed in one sub-pixel of FIG. 31.
Figure 34:
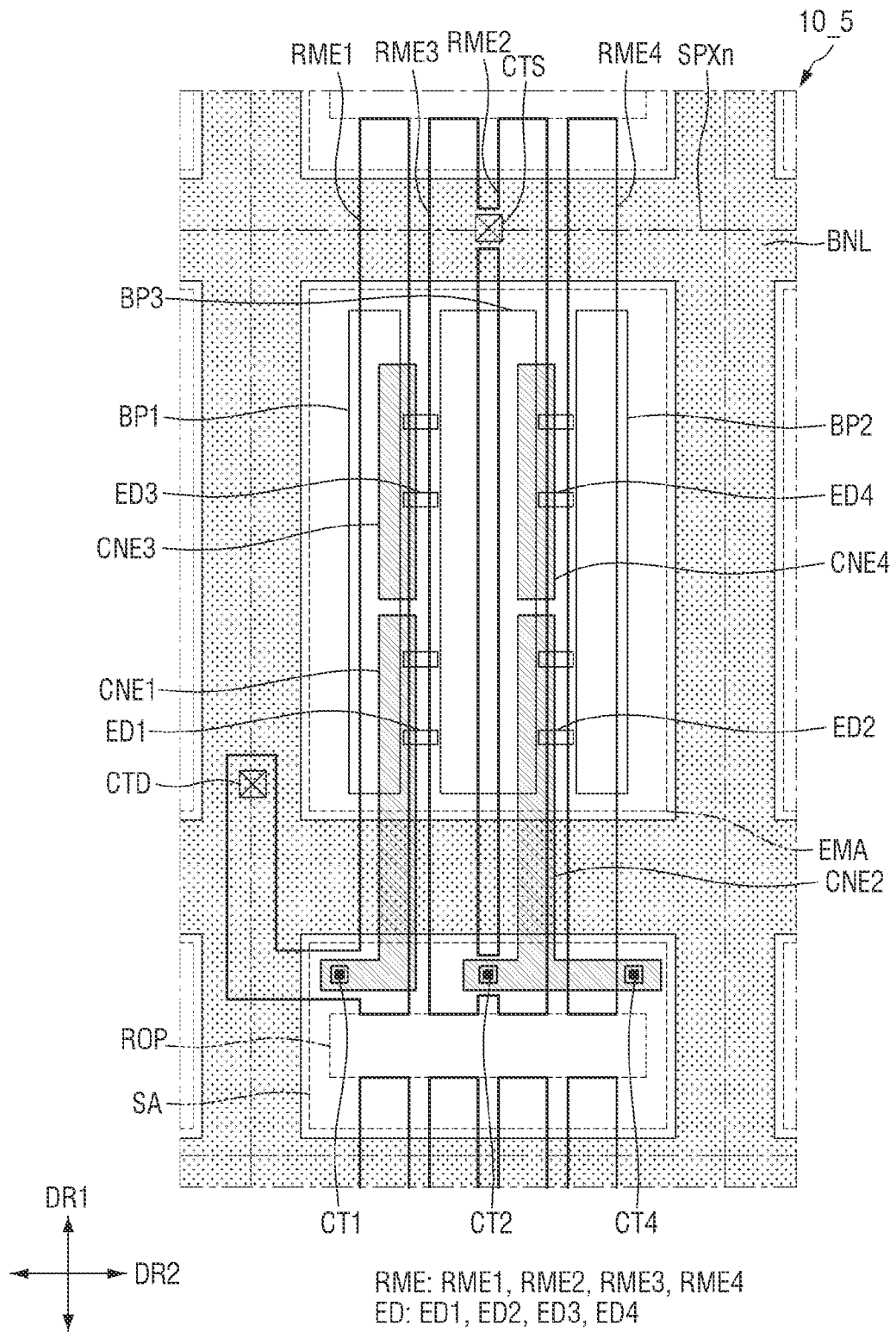
FIG. 34 is a plan view illustrating a first connection electrode layer disposed in one sub-pixel of FIG. 31.
Figure 35:
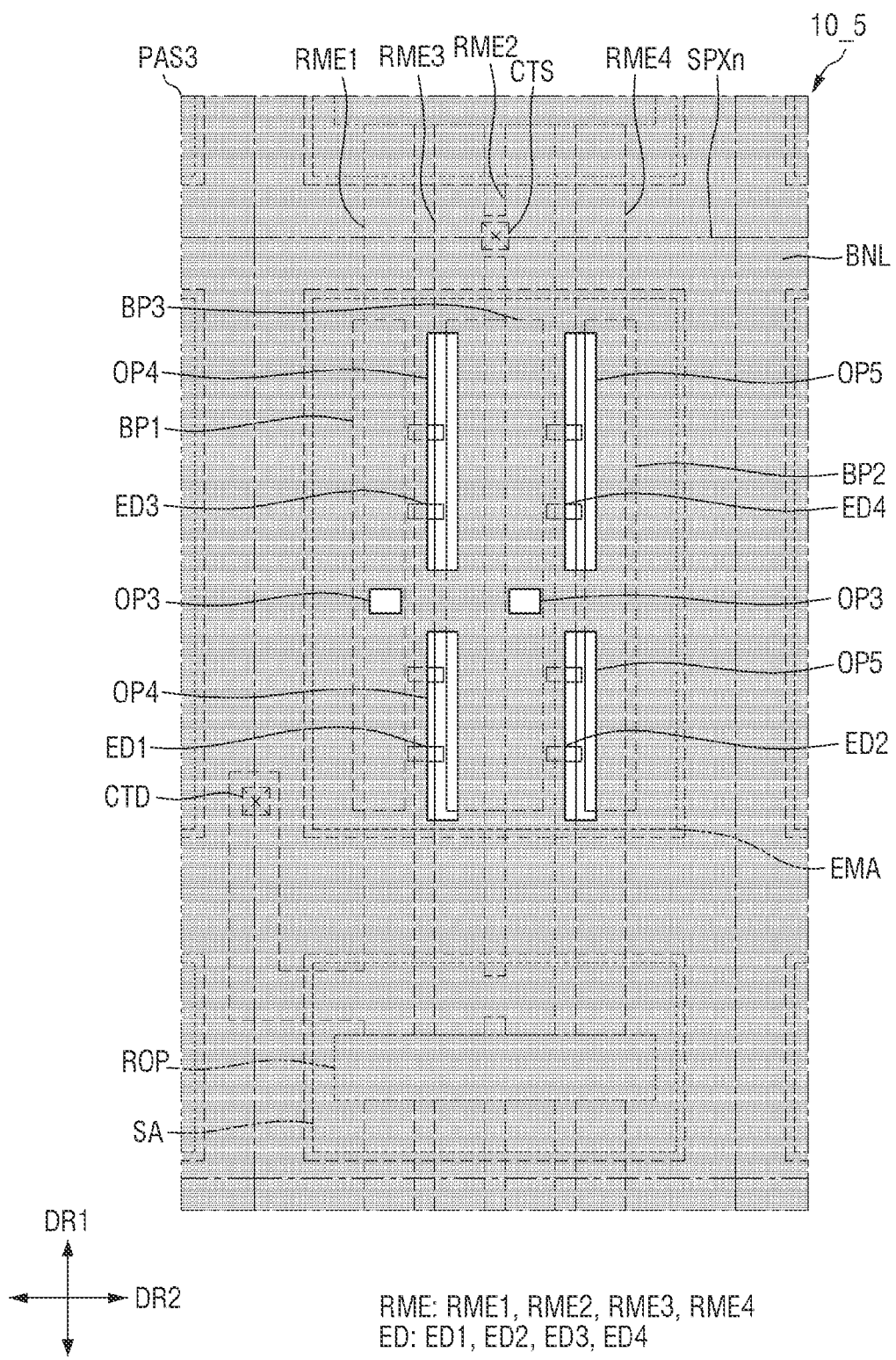
FIG. 35 is a plan view illustrating a third insulating layer disposed in one sub-pixel of FIG. 17.
Figure 36:
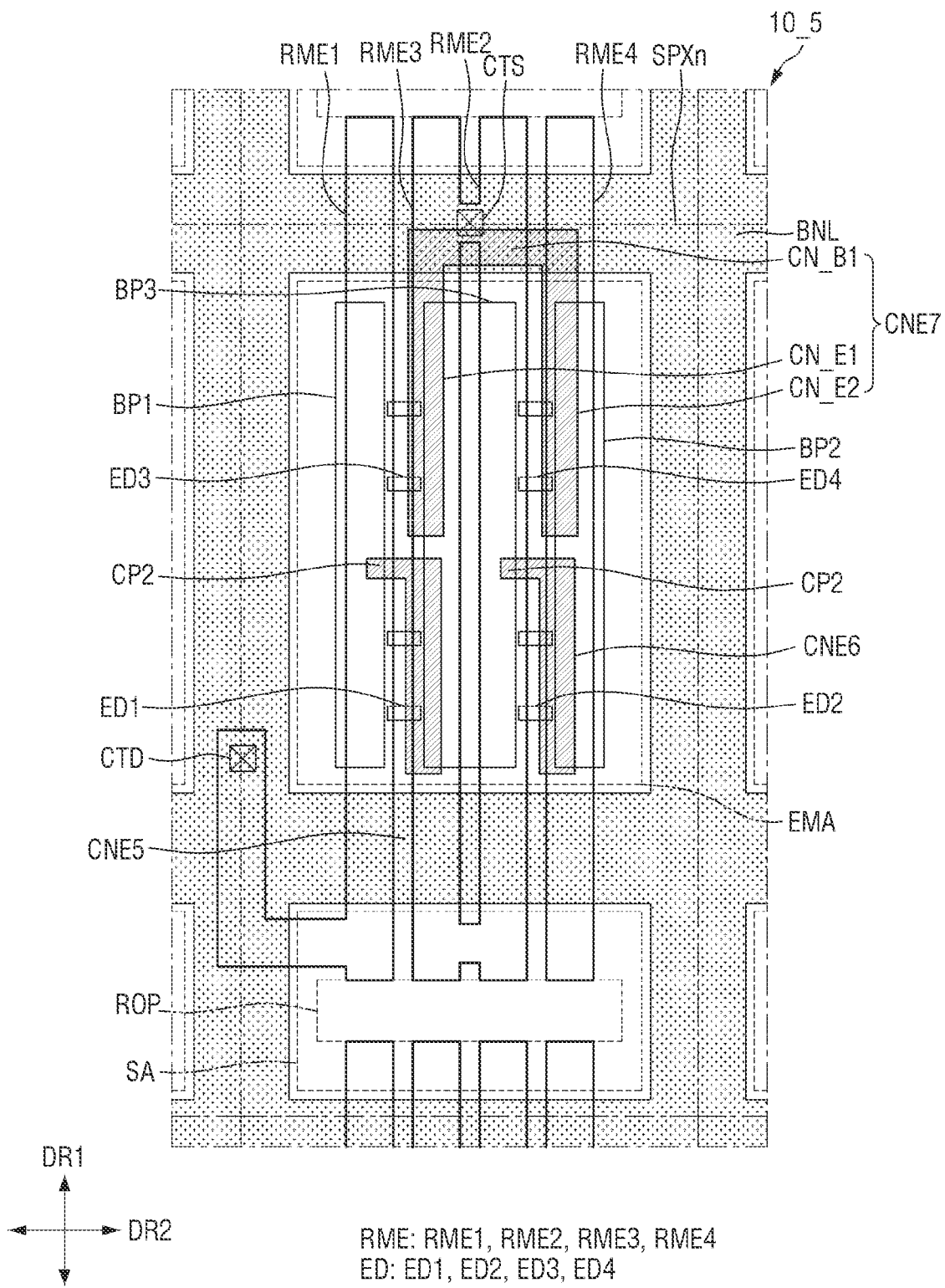
FIG. 36 is a plan view illustrating a second connection electrode layer disposed in one sub-pixel of FIG. 31.

FIG. 32 is a plan view illustrating a first insulating layer PAS1 disposed in one sub-pixel of FIG. 31. FIG. 33 is a plan view illustrating a second insulating layer PAS2 disposed in one sub-pixel of FIG. 31. FIG. 34 is a plan view illustrating a first connection electrode layer disposed in one sub-pixel of FIG. 31. FIG. 35 is a plan view illustrating a third insulating layer PAS3 disposed in one sub-pixel of FIG. 31. FIG. 36 is a plan view illustrating a second connection electrode layer disposed in one sub-pixel of FIG. 31.

FIGS. 32 to 36 illustrate the planar arrangement of the plurality of insulating layers PAS1, PAS2, and PAS3 that are different layers disposed in one sub-pixel SPXn, and the connection electrodes CNE1, CNE2, CNE3, CNE4, CNE5, CNE6, and CNE7. FIG. 32 illustrates the planar arrangement of the first insulating layer PAS1 disposed under the bank layer BNL, and FIGS. 33 and 35 illustrate the planar arrangement of the second insulating layer PAS2 and the third insulating layer PAS3 disposed above the bank layer BNL.

Referring to FIGS. 32 to 36 in conjunction with FIG. 31, the plurality of electrodes RME disposed in each sub-pixel SPXn include the first electrode RME1, the second electrode RME2, the third electrode RME3, and the fourth electrode RME4.

The electrodes RME (RME1, RME2, RME3, and RME4) may each extend substantially in the first direction DR1 and may be disposed to be spaced from each other. The first electrode RME1 may be disposed on the left side of the emission area EMA of each sub-pixel SPXn, which is one side in the second direction DR2. The second electrode RME2 may be disposed to be spaced apart from the first electrode RME1 in the second direction DR2, the third electrode RME3 may be disposed between the first electrode RME1 and the second electrode RME2, and the fourth electrode RME4 may be disposed to be spaced from the third electrode RME3 in the second direction DR2 with the second electrode RME2 interposed therebetween. The electrodes RME may face (or oppose) and may be spaced from each other in the second direction DR2. The plurality of electrodes RME may be spaced from the electrodes RME of another sub-pixel SPXn adjacent in the first direction DR1 at the separation portion ROP of the sub-region SA.

According to one or more embodiments, the first electrode RME1 may include a main portion extending in the first direction DR1, and a protrusion portion that is bent in the second direction DR2 therefrom and then is bent again in the first direction DR1. The main portion of the first electrode RME1 may be disposed to cross the emission area EMA and the sub-region SA of each sub-pixel SPXn, and may be partially disposed on the first bank pattern BP1. The protrusion portion of the first electrode RME1 may be connected to a portion of the main portion disposed in the sub-region SA and may be disposed to overlap a portion of the bank layer BNL extending in the first direction DR1. The protrusion portion of the first electrode RME1 may be in electrical contact with the first conductive pattern CDP1 through the first electrode contact hole CTD.

The second electrode RME2 and the third electrode RME3 may be partially connected to each other. For example, the second electrode RME2 and the third electrode RME3 may be connected to each other in a portion disposed in the sub-region SA, and a portion located above the emission area EMA in the first direction DR1 and overlapping the bank layer BNL. In the portions where the second electrode RME2 and the third electrode RME3 are connected, the portion disposed under the bank layer BNL may be in electrical contact with the second voltage line VL2 through the second electrode contact hole CTS. In the portions where the second electrode RME2 and the third electrode RME3 are connected, the portion disposed in the sub-region SA may be electrically connected to the second connection electrode CNE2 to be described later. The fourth electrode RME4 may have a shape extending in the first direction DR1 and may not be directly connected to the other electrode RME.

The first insulating layer PAS1 may be disposed in a structure similar to that of the above-described embodiments. The first insulating layer PAS1 may be disposed in the entire display area DPA and may cover the plurality of electrodes RME and the bank patterns BP1, BP2, and BP3.

According to one or more embodiments, the first insulating layer PAS1 may include a plurality of openings OPR and a plurality of contact portions CT1, CT2, and CT4. The opening OPR disposed to correspond to the separation portion ROP, which is the opening of the first insulating layer PAS1, is the same as that described above with reference to FIG. 5. The plurality of contact portions CT1, CT2, and CT4 formed in the first insulating layer PAS1 may be disposed to overlap different electrodes RME. For example, the plurality of contact portions CT1, CT2, and CT4 may each be disposed in the sub-region SA, and may include the first contact portion CT1 disposed to overlap the first electrode RME1, the second contact portion CT2 disposed to overlap the portion where the second electrode RME2 and the third electrode RME3 are connected, and the fourth contact portion CT4 disposed to overlap the fourth electrode RME4. The plurality of contact portions CT1, CT2, and CT4 may penetrate the first insulating layer PAS1 to partially expose the top surfaces of the electrodes RME1, RME2, RME3, and RME4 disposed thereunder. Each of the contact portions CT1, CT2, and CT4 may further penetrate some of the other insulating layers disposed on the first insulating layer PAS1.

The plurality of light emitting elements ED may be arranged between the bank patterns BP1, BP2, and BP3 or on different electrodes RME. Some of the light emitting elements ED may be arranged between the first bank pattern BP1 and the third bank pattern BP3, and some other light emitting elements ED may be arranged between the third bank pattern BP3 and the second bank pattern BP2. In accordance with one or more embodiments, the light emitting element ED may include a first light emitting element ED1 and a third light emitting element ED3 arranged between the first bank pattern BP1 and the third bank pattern BP3, and a second light emitting element ED2 and a fourth light emitting element ED4 arranged between the third bank pattern BP3 and the second bank pattern BP2. Descriptions of the different light emitting elements ED1, ED2, ED3, and ED4 are the same as described above with reference to FIGS. 17 to 24.

The second insulating layer PAS2 may be disposed in a structure similar to that of the above-described embodiment. The second insulating layer PAS2 may be disposed on the plurality of light emitting elements ED, the first insulating layer PAS1, and the bank layer BNL.

In accordance with one embodiment, the second insulating layer PAS2 may include the plurality of openings OP1, OP2, OP4, OP5, and OPR and the plurality of contact portions CT1, CT2, and CT4. The opening OPR formed to correspond to the separation portion ROP of the sub-region SA, which is the opening of the second insulating layer PAS2, is the same as that described above with reference to FIG. 6.

The second insulating layer PAS2 may include, in addition to the plurality of first openings OP1 partially overlapping the first electrode RME1 and the plurality of second openings OP2 partially overlapping the second electrode RME2, the plurality of fourth openings OP4 partially overlapping the third electrode RME3 and the plurality of fifth openings OP5 partially overlapping the fourth electrode RME4. Descriptions of the first openings OP1, the second openings OP2, the fourth openings OP4, and the fifth openings OP5 of the second insulating layer PAS2 are the same as described above with reference to FIGS. 17 to 24.

The plurality of contact portions CT1, CT2, and CT4 formed in the second insulating layer PAS2 may be disposed to overlap different electrodes RME. For example, the plurality of contact portions CT1, CT2, and CT4 may each be disposed in the sub-region SA, and may include the first contact portion CT1 disposed to overlap the first electrode RME1, the second contact portion CT2 disposed to overlap the portion where the second electrode RME2 and the third electrode RME3 are connected, and the fourth contact portion CT4 disposed to overlap the fourth electrode RME4. The plurality of contact portions CT1, CT2, and CT4 may penetrate the second insulating layer PAS2 to partially expose the top surfaces of the electrodes RME1, RME2, RME3, and RME4 disposed thereunder. Some of the contact portions CT1, CT2, and CT4 may further penetrate another insulating layer disposed on the second insulating layer PAS2.

The plurality of connection electrodes CNE may include the first connection electrode CNE1 and the third connection electrode CNE3 disposed on the first electrode RME1, the second connection electrode CNE2 and the fourth connection electrode CNE4 disposed on the second electrode RME2, the fifth connection electrode CNE5 disposed on the third electrode RME3, the sixth connection electrode CNE6 disposed on the fourth electrode RME4, and the seventh connection electrode CNE7 disposed across the plurality of electrodes RME.

The first connection electrode CNE1 and the third connection electrode CNE3 may be disposed on the first electrode RME1 and may be spaced from each other in the first direction DR1. The second connection electrode CNE2 and the fourth connection electrode CNE4 may be disposed on the second electrode RME2 and may be spaced from each other in the first direction DR1. The first connection electrode CNE1 and the second connection electrode CNE2 may be disposed below the center of the emission area EMA in the first direction DR1, and the third connection electrode CNE3 and the fourth connection electrode CNE4 may be disposed above the center of the emission area EMA in the first direction DR1. The first connection electrode CNE1 and the second connection electrode CNE2 may be disposed across the emission area EMA and the sub-region SA of the corresponding sub-pixel SPXn, and may be in direct contact with the first electrode RME1, the second electrode RME2, and the fourth electrode RME4 through the first contact portion CT1, the second contact portion CT2 and the fourth contact portion CT4 formed in the sub-region SA, respectively. The first connection electrode CNE1 may be in direct contact with the first electrode RME1 through the first contact portion CT1 penetrating the first insulating layer PAS1 and the second insulating layer PAS2 in the sub-region SA. The first connection electrode CNE1 may be in contact with the protrusion portion protruding from the main portion of the first electrode RME1. The second connection electrode CNE2 may be in contact with the second electrode RME2 and the fourth electrode RME4 through the second contact portion CT2 and the fourth contact portion CT4 penetrating the first insulating layer PAS1 and the second insulating layer PAS2 in the sub-region SA. The second contact portion CT2 may be formed in the portion where the second electrode RME2 and the third electrode RME3 are connected, and the fourth contact portion CT4 may be formed on the fourth electrode RME4. The second connection electrode CNE2 may be electrically connected to the second electrode RME2, the third electrode RME3, and the fourth electrode RME4. As described above, the second electrode RME2 and the third electrode RME3 may be connected to each other and electrically connected to the second voltage line VL2 through the second electrode contact hole CTS, and the fourth electrode RME4 may be electrically connected to the second electrode RME2, the third electrode RME3, and the second voltage line VL2 through the second connection electrode CNE2.

The fifth connection electrode CNE5 may face (or oppose) and may be spaced from the first connection electrode CNE1 in the second direction DR2, and may be disposed on the third electrode RME3. The sixth connection electrode CNE6 may be spaced apart from the second connection electrode CNE2 in the second direction DR2, and may be disposed on the fourth electrode RME4. The fifth connection electrode CNE5 and the sixth connection electrode CNE6 may be disposed below the center of the emission area EMA in the first direction DR1, and may be disposed across the emission area EMA and the sub-region SA of the corresponding sub-pixel SPXn.

The seventh connection electrode CNE7 may include a first electrode extension portion CN_E1 disposed on the third electrode RME3, a second electrode extension portion CN_E2 disposed on the fourth electrode RME4, and a first electrode connection portion CN_B1 that connects the first electrode extension portion CN_E1 to the second electrode extension portion CN_E2. The first electrode extension portion CN_E1 may face (or oppose) and be spaced from the third connection electrode CNE3 in the second direction DR2, and may be spaced from the fifth connection electrode CNE5 in the first direction DR1. The second electrode extension portion CN_E2 may face (or oppose) and be spaced from the fourth connection electrode CNE4 in the second direction DR2, and may be spaced from the sixth connection electrode CNE6 in the first direction DR1. The first electrode connection portion CN_B1 may be disposed across the third electrode RME3, the second electrode RME2, and the fourth electrode RME4 on the bank layer BNL. The seventh connection electrode CNE7 may be disposed to be around (or surround) the fourth connection electrode CNE4 in a plan view.

The first connection electrode CNE1, the second connection electrode CNE2, the third connection electrode CNE3, and the fourth connection electrode CNE4 may be the connection electrodes of the first connection electrode layer disposed on the second insulating layer PAS2, and the fifth connection electrode CNE5, the sixth connection electrode CNE6, and the seventh connection electrode CNE7 may be the connection electrodes of the second connection electrode layer disposed on the third insulating layer PAS3. The third insulating layer PAS3 may be disposed between the first connection electrode layer and the second connection electrode layer.

The third insulating layer PAS3 may be disposed in a structure similar to that of the above-described embodiment. The third insulating layer PAS3 may be disposed on the second insulating layer PAS2 except the region in which the second connection electrode layer is disposed.

In accordance with one or more embodiments, the third insulating layer PAS3 may include the plurality of openings OP3, OP4, and OP5 The third insulating layer PAS3 may include the third opening OP3 disposed across the electrodes RME spaced from each other and partially exposing the top surface of the first connection electrode layer, the plurality of fourth openings OP4 partially overlapping the third electrode RME3, and the plurality of fifth openings OP5 partially overlapping the fourth electrode RME4.

The third openings OP3 of the third insulating layer PAS3 may be disposed on the first electrode RME1 and the second electrode RME2 in the emission area EMA, and may expose or may not cover a part of the connection electrode of the first connection electrode layer disposed under the third insulating layer PAS3. The plurality of third openings OP3 spaced from each other may be disposed in each sub-pixel SPXn. The plurality of third openings OP3 may be disposed between the second openings OP2 or between the first openings OP1 of the second insulating layer PAS2. Unlike the above-described embodiments, the third opening OP3 may have a relatively short width measured in the second direction DR2, and may overlap the first electrode RME1 or the second electrode RME2 without overlapping the third electrode RME3 and the fourth electrode RME4.

Unlike the other openings OP1, OP2, OP4, and OP5, the third opening OP3 may have a shape in which a width measured in the second direction DR2 is similar to a width measured in the first direction DR1. Different third openings OP3 may be disposed to be spaced from each other in the second direction DR2, and one third opening OP3 may be disposed to overlap the first electrode RME1 and another third opening OP3 may be disposed to overlap the second electrode RME2.

The plurality of fourth openings OP4 may be disposed to overlap one side of the third electrode RME3 that faces (or opposes) the first electrode RME1, and the plurality of fourth openings OP4 disposed in one sub-pixel SPXn may be disposed to be spaced from each other in the first direction DR1 in the emission area EMA of the corresponding sub-pixel SPXn. The plurality of fifth openings OP5 may be disposed to overlap one side of the fourth electrode RME4 that faces (or opposes) the second electrode RME2, and the plurality of fifth openings OP5 disposed in one sub-pixel SPXn may be disposed to be spaced from each other in the first direction DR1 in the emission area EMA of the corresponding sub-pixel SPXn.

Figure 37:
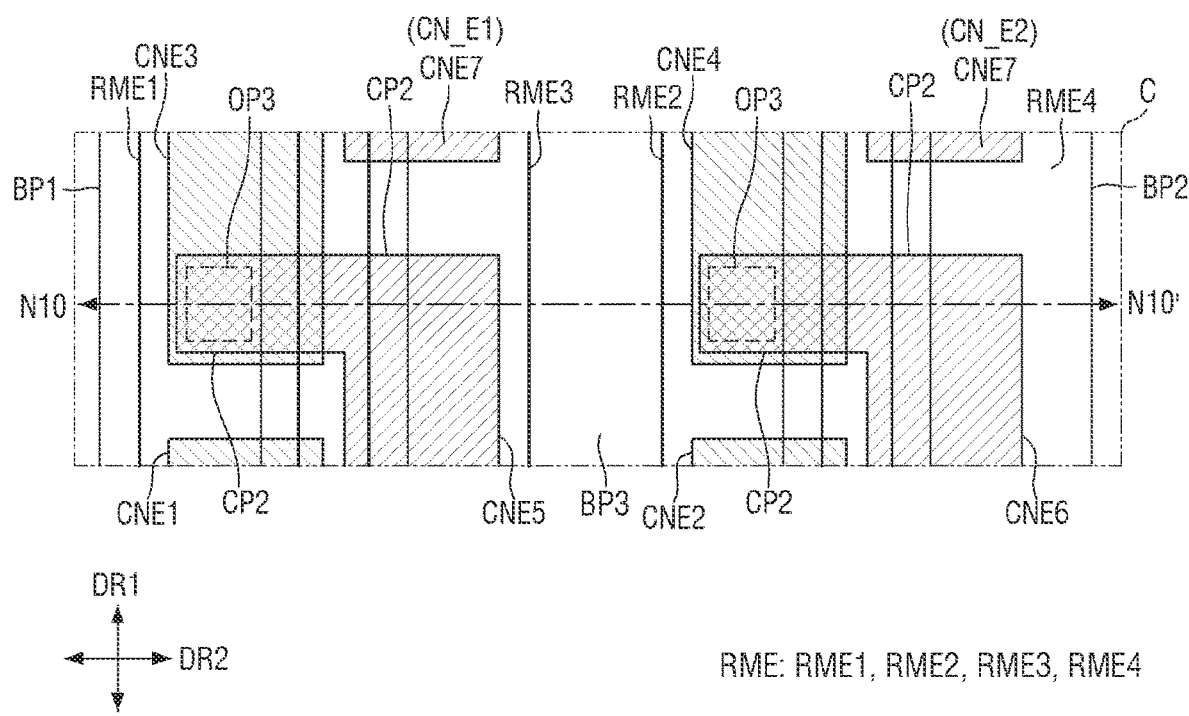
FIG. 37 is an enlarged view of a part C of FIG. 31.
Figure 38:
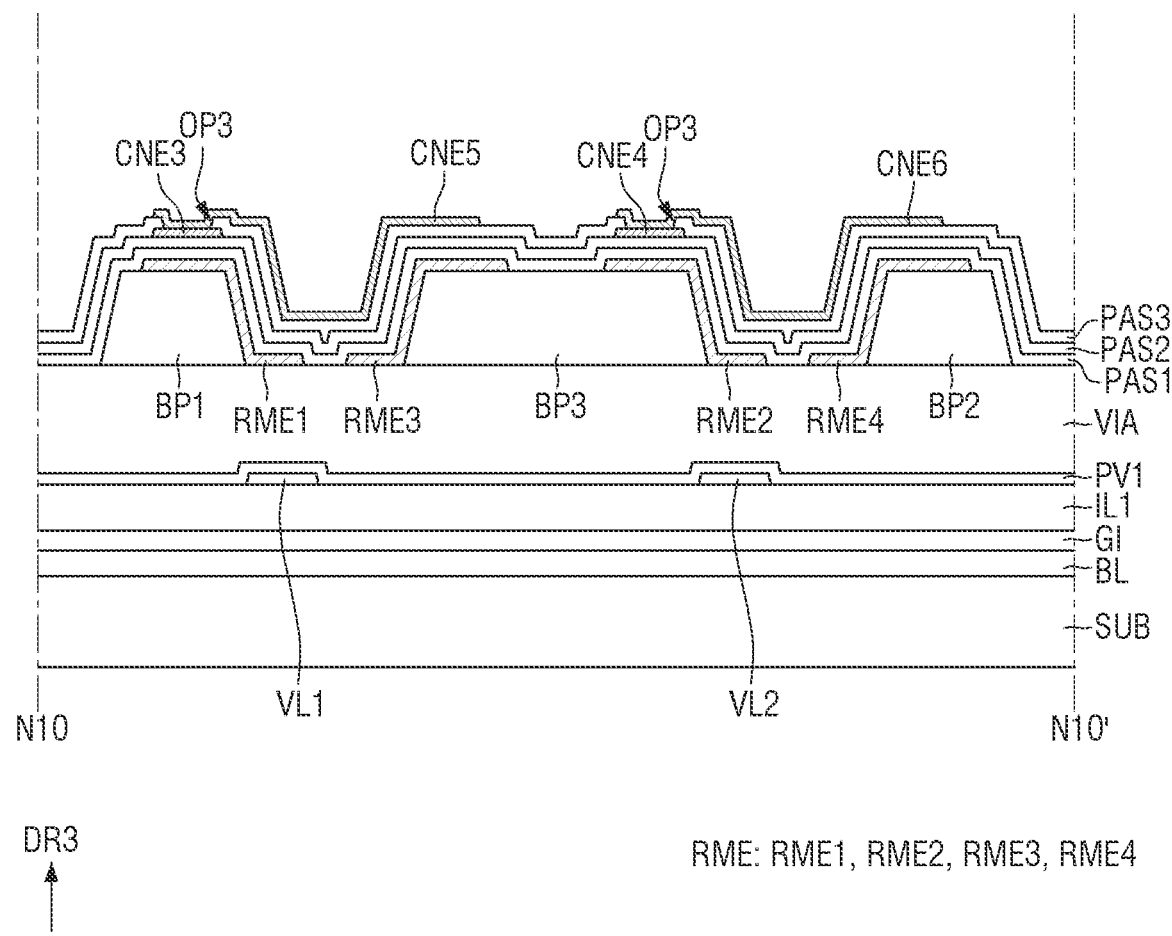
FIG. 38 is a cross-sectional view taken along the line N10-N10' of FIG. 37.

FIG. 37 is an enlarged view of a part C of FIG. 31. FIG. 38 is a cross-sectional view taken along the line N10-N10' of FIG. 37. FIG. 38 illustrates a cross section across the third openings OP3 of the third insulating layer PAS3 in the second direction DR2.

Referring to FIGS. 37 and 38 in conjunction with FIGS. 31 to 36, in the display device 10_5 according to one or more embodiments, the third connection electrode CNE3 of the first connection electrode layer and the fifth connection electrode CNE5 of the second connection electrode layer may be connected to each other, and the fourth connection electrode CNE4 of the first connection electrode layer and the sixth connection electrode CNE6 of the second connection electrode layer may be connected to each other.

The fifth connection electrode CNE5 and the sixth connection electrode CNE6 may each include a second connection portion CP2 disposed on one side facing (or opposing) the seventh connection electrode CNE7 in the first direction DR1. The fifth connection electrode CNE5 and the sixth connection electrode CNE6 may each extend in the first direction DR1 and have a shape in which the second connection portion CP2 is bent in the second direction DR2. Unlike the above-described embodiments, each of the third connection electrode CNE3 and the fourth connection electrode CNE4 may not include the first connection portion CP1 bent in the second direction DR2.

The second connection portion CP2 of each of the fifth connection electrode CNE5 and the sixth connection electrode CNE6 may be disposed on the first electrode RME1 or the second electrode RME2. The second connection portion CP2 of the fifth connection electrode CNE5 may be disposed on the first electrode RME1 to overlap the third connection electrode CNE3, and the second connection portion CP2 of the sixth connection electrode CNE6 may be disposed on the second electrode RME2 to overlap the fourth connection electrode CNE4. Each of the third connection electrode CNE3 and the fourth connection electrode CNE4 may have a top surface exposed while overlapping the third opening OP3 of the third insulating layer PAS3, and the second connection portions CP2 of the fifth connection electrode CNE5 and the sixth connection electrode CNE6 may be in direct contact with the third connection electrode CNE3 or the fourth connection electrode CNE4 exposed by the third opening OP3.

Each of the first connection electrode CNE1 and the second connection electrode CNE2 may be a first type connection electrode connected to the electrodes RME1, RME2, RME3, and RME4 directly connected to the third conductive layer, and each of the third connection electrode CNE3, the fourth connection electrode CNE4, the fifth connection electrode CNE5, the sixth connection electrode CNE6, and the seventh connection electrode CNE7 may be a third type connection electrode that is not connected to the electrode RME. The third type connection electrode may be in contact with the light emitting elements ED without being connected to the electrode RME, and may constitute an electrical connection circuit of the light emitting elements ED together with other connection electrodes CNE.

The plurality of light emitting elements ED may be classified into different light emitting elements ED depending on the connection electrodes CNE to be in contact with both ends of the light emitting elements ED to correspond to the arrangement structure of the connection electrodes CNE. The first light emitting element ED1 and the second light emitting element ED2 may have first ends in contact with the first type connection electrodes and second ends in contact with the second type connection electrodes. The first light emitting element ED1 may be in contact with the first connection electrode CNE1 and the fifth connection electrode CNE5, and the second light emitting element ED2 may be in contact with the second connection electrode CNE2 and the sixth connection electrode CNE6. The third light emitting element ED3 and the fourth light emitting element ED4 may have both ends in contact with the third type connection electrodes. The third light emitting element ED3 may be in contact with the third connection electrode CNE3 and the seventh connection electrode CNE7, and the fourth light emitting element ED4 may be in contact with the fourth connection electrode CNE4 and the seventh connection electrode CNE7.

The plurality of light emitting elements ED may be connected in series through the plurality of connection electrodes CNE. Because the display device 10_4 according to the described embodiment includes a larger number of light emitting elements ED for each sub-pixel SPXn and the light emitting elements ED are connected in series, the light emission amount per unit area may be further increased.

Further, in the display device 10_7 according to one or more embodiments, the plurality of connection electrodes CNE may be classified into the connection electrodes of different connection electrode layers depending on the layer disposed with respect to the second insulating layer PAS2 and the third insulating layer PAS3. In accordance with one or more embodiments, the connection electrodes CNE1, CNE2, CNE3, CNE4, CNE5, CNE6, and CNE7 disposed on the same connection electrode layer may be in contact with the same end between both ends of the light emitting element ED. Such arrangement of the connection electrodes CNE may be desirable in that it may be possible to deal with the misalignment of the overlay design between the patterns by shifting the patterns of the connection electrodes CNE even if the patterns of the second insulating layer PAS2 and the third insulating layer PAS3 were shifted in the manufacturing process of the display device 10_5.

As described above, the first connection electrode CNE1, the second connection electrode CNE2, the third connection electrode CNE3, and the fourth connection electrode CNE4 disposed on the first connection electrode layer may be in contact with the first ends of the light emitting elements ED, and the fifth connection electrode CNE5, the sixth connection electrode CNE6, and the seventh connection electrode CNE7 disposed on the second connection electrode layer may be in contact with the second ends of the light emitting elements ED. Because the connection electrodes disposed on or at the same connection electrode layer are disposed to be in contact with the same one end with respect to the light emitting element ED, the display device 10_4 may be desirable in that it may be easy to deal with the overlay misalignment.

The seventh connection electrode CNE7 is disposed across the plurality of electrodes RME and is disposed to be in contact with different light emitting elements ED3 and ED4. Because, the seventh connection electrodes CNE7 are designed to be in contact with only the same one end between both ends of the different light emitting elements ED3 and ED4, it is possible to prevent or reduce a problem that only any one of the different light emitting elements ED3 and ED4 is in contact with the connection electrode CNE and the other light emitting element is not in contact with the connection electrode CNE. Further, even if the seventh connection electrode CNE7 disposed across the plurality of electrodes RME is formed while being shifted during overlay alignment, the electrode extension portions CN_E1 and CN_E2 of the seventh connection electrodes CNE7 move in the same direction and, thus, it is possible to maintain the same distance between the electrode extension portions CN_E1 and CN_E2 and another connection electrode CNE.

In concluding the detailed description, those skilled in the art will appreciate that many variations and modifications can be made to the embodiments without substantially departing from the teachings of the present disclosure. Therefore, the disclosed embodiments of the present disclosure are used in a generic and descriptive sense only and not for purposes of limitation.

What is claimed is:

1. A display device comprising:
   a first electrode extending in a first direction, and a second electrode spaced from the first electrode in a second direction;
   a plurality of light emitting elements on the first electrode and the second electrode, a light emitting element of the plurality of light emitting elements comprising a first end on the first electrode and a second end on the second electrode;
   a first connection electrode extending in the first direction and located on the first electrode;
   a second connection electrode extending in the first direction and located on the second electrode;
   a third connection electrode located on the first electrode and spaced from the first connection electrode in the first direction; and
   a fourth connection electrode located on the second electrode and spaced from the second connection electrode in the second direction,
      wherein the plurality of light emitting elements comprises first light emitting elements and second light emitting elements, each of the first light emitting elements having a first end in contact with the first connection electrode, and each of the second light emitting elements having a second end in contact with the second connection electrode,
   the third connection electrode extends in the second direction on one side opposing the first connection electrode, and comprises a first connection portion on the first electrode and the second electrode, and
   wherein the fourth connection electrode comprises a second connection portion on the first connection portion and in direct contact with the first connection portion.

2. The display device of claim 1, wherein a first light emitting element of the first light emitting elements has a second end in contact with the fourth connection electrode, and
   wherein a second light emitting element of the second light emitting elements has a first end in contact with the third connection electrode.

3. The display device of claim 1, further comprising:
   a first insulating layer on the first electrode and the second electrode;
   a second insulating layer on the first insulating layer and the light emitting element; and
   a third insulating layer on the second insulating layer,
   wherein the light emitting element is directly on the first insulating layer.

4. The display device of claim 3, wherein at least a part of each of the first connection electrode and the third connection electrode is located between the second insulating layer and the third insulating layer, and
   wherein at least a part of each of the second connection electrode and the fourth connection electrode is on the third insulating layer.

5. The display device of claim 3, further comprising:
   a plurality of first openings on one side of the first electrode opposing the second electrode and penetrating the second insulating layer to expose the first ends of the first light emitting element and the second light emitting element; and a plurality of second openings on one side of the second electrode opposing the first electrode and penetrating the second insulating layer and the third insulating layer to expose the second ends of the first light emitting element and the second light emitting element.

6. The display device of claim 5, wherein the plurality of first openings are spaced from each other in the first direction,
wherein the plurality of second openings are spaced from each other in the first direction, and
wherein a first opening of the plurality of first openings and a second opening of the plurality of second openings are spaced from each other in the second direction.

7. The display device of claim 3, wherein the second connection portion is in contact with the first connection portion through a third opening penetrating the third insulating layer to expose a part of the first connection portion, and
wherein the second insulating layer does not overlap the third insulating layer while overlapping the first connection portion and the second connection portion at a portion where the first connection portion and the second connection portion are in contact with each other.

8. The display device of claim 7, wherein a width of the third opening measured in the second direction is greater than a width of the first connection portion measured in the second direction.

9. The display device of claim 3, wherein the first connection electrode is electrically connected to the first electrode, and
wherein the second connection electrode is electrically connected to the second electrode.

10. The display device of claim 3, further comprising a bank layer on the first insulating layer and surrounding an emission area in which the light emitting elements are located, and a sub-region located in the first direction of the emission area,
wherein the first connection electrode is in contact with the first electrode through a first contact portion penetrating the first insulating layer and the second insulating layer to expose a part of a top surface of the first electrode in the sub-region, and
wherein the second connection electrode is in contact with the second electrode through a second contact portion penetrating the first insulating layer, the second insulating layer, and the third insulating layer to expose a part of a top surface of the second electrode in the sub-region.

11. A display device comprising:
a plurality of electrodes comprising a first electrode extending in a first direction, a second electrode spaced from the first electrode in a second direction, a third electrode located between the first electrode and the second electrode, and a fourth electrode spaced from the second electrode in the second direction;
a plurality of light emitting elements on the plurality of electrodes that are spaced from each other in the second direction; and
a plurality of connection electrodes on at least some of the plurality of electrodes and in contact with the plurality of light emitting elements, the plurality of connection electrodes being spaced from each other in the first direction and the second direction,
wherein the plurality of connection electrodes comprises:
a first connection electrode on the first electrode;
a second connection electrode on the second electrode;
a third connection electrode on the first electrode and spaced from the first connection electrode in the first direction;
a fourth connection electrode on the second electrode and spaced from the second connection electrode in the first direction;
a fifth connection electrode on the third electrode and spaced from the first connection electrode in the second direction;
a sixth connection electrode on the fourth electrode and spaced from the second connection electrode in the second direction; and
a seventh connection electrode comprising a first electrode extension portion on the third electrode and spaced from the third connection electrode in the second direction, a second electrode extension portion on the fourth electrode and spaced from the fourth connection electrode in the second direction, and a first electrode connection portion connecting the first electrode extension portion to the second electrode extension portion,
wherein each of the third connection electrode and the fourth connection electrode comprises a first connection portion extending in the second direction on one side opposing the first connection electrode or the second connection electrode, the first connection portion being on the plurality of electrodes that are spaced from each other in the second direction, and
wherein each of the fifth connection electrode and the sixth connection electrode comprises a second connection portion on the first connection portion and in direct contact with the first connection portion.

12. The display device of claim 11, wherein the plurality of light emitting elements comprises:
a first light emitting element on the first electrode and the third electrode and in contact with the first connection electrode and the fifth connection electrode;
a second light emitting element on the second electrode and the fourth electrode and in contact with the second connection electrode and the sixth connection electrode;
a third light emitting element on the first electrode and the third electrode and in contact with the third connection electrode and the seventh connection electrode; and
a fourth light emitting element on the second electrode and the fourth electrode and in contact with the fourth connection electrode and the seventh connection electrode.

13. The display device of claim 12, further comprising:
a first insulating layer on the plurality of electrodes;
a second insulating layer on the first insulating layer and the plurality of light emitting elements; and
a third insulating layer on the second insulating layer,
wherein the plurality of light emitting elements are located directly on the first insulating layer.

14. The display device of claim 13, wherein at least a part of each of the first connection electrode, the second connection electrode, the third connection electrode, and the fourth connection electrode is located between the second insulating layer and the third insulating layer, and
wherein at least a part of each of the fifth connection electrode, the sixth connection electrode, and the seventh connection electrode is on the third insulating layer.

15. The display device of claim 13, further comprising:
a plurality of first openings on one side of the first electrode opposing the third electrode and penetrating the second insulating layer to expose first ends of the first light emitting element and the third light emitting element; and a plurality of second openings on one side of the second electrode opposing the fourth electrode and penetrating the second insulating layer to expose first ends of the second light emitting element and the fourth light emitting element, wherein the first connection electrode and the third connection electrode are in contact with the first ends of the first light emitting element and the third light emitting element exposed through the first openings, respectively, and wherein the second connection electrode and the fourth connection electrode are in contact with the first ends of the second light emitting element and the fourth light emitting element exposed through the second openings, respectively.

16. The display device of claim 13, wherein the second connection portion of the fifth connection electrode and the sixth connection electrode is in contact with the first connection portion through a third opening penetrating the third insulating layer to expose the first connection portion of each of the third connection electrode and the fourth connection electrode, and wherein the second insulating layer does not overlap the third insulating layer while overlapping the first connection portion and the second connection portion at a portion where the first connection portion and the second connection portion are in contact with each other.

17. The display device of claim 13, further comprising:
a plurality of fourth openings located on one side of the third electrode opposing the first electrode and penetrating the second insulating layer and the third insulating layer to expose second ends of the first light emitting element and the third light emitting element; and a plurality of fifth openings located on one side of the fourth electrode opposing the second electrode and penetrating the second insulating layer and the third insulating layer to expose second ends of the second light emitting element and the fourth light emitting element, wherein the first electrode extension portions of the fifth connection electrode and the seventh connection electrode are in contact with the second ends of the first light emitting element and the third light emitting element exposed through the fourth openings, respectively, and wherein the second electrode extension portions of the sixth connection electrode and the seventh connection electrode are in contact with the second ends of the second light emitting element and the fourth light emitting element exposed through the fifth openings, respectively.

18. The display device of claim 13, further comprising:
a bank layer on the first insulating layer and surrounding an emission area in which the plurality of light emitting elements are located, and a sub-region located in the first direction of the emission area; and a first contact portion and a second contact portion located in the sub-region and penetrating the first insulating layer and the second insulating layer.

19. The display device of claim 18, wherein the plurality of electrodes is located across the emission area and the sub-region, wherein the first contact portion overlaps the first electrode, wherein the second contact portion overlaps the second electrode, wherein the first connection electrode is in contact with the first electrode through the first contact portion, and wherein the second connection electrode is in contact with the second electrode through the second contact portion.

20. The display device of claim 19, further comprising:
a third contact portion on the third electrode in the sub-region and penetrating the first insulating layer, the second insulating layer, and the third insulating layer; and a fourth contact portion on the fourth electrode in the sub-region and penetrating the first insulating layer, the second insulating layer, and the third insulating layer, wherein the fifth connection electrode is in contact with the third electrode through the third contact portion, and the sixth connection electrode is in contact with the fourth electrode through the fourth contact portion.

21. A display device comprising:
a plurality of electrodes comprising a first electrode extending in a first direction, a second electrode spaced from the first electrode in a second direction, a third electrode between the first electrode and the second electrode, and a fourth electrode spaced from the second electrode in the second direction;

a plurality of light emitting elements on the plurality of electrodes that are spaced from each other in the second direction; and a plurality of connection electrodes on at least some of the plurality of electrodes and in contact with the plurality of light emitting elements, the plurality of connection electrodes being spaced from each other in the first direction and the second direction, wherein the plurality of connection electrodes comprises:
a first connection electrode located on the first electrode;
a second connection electrode located on the second electrode;
a third connection electrode located on the first electrode and spaced from the first connection electrode in the first direction;
a fourth connection electrode located on the second electrode and spaced from the second connection electrode in the first direction;
a fifth connection electrode located on the third electrode and spaced from the first connection electrode in the second direction;
a sixth connection electrode located on the fourth electrode and spaced from the second connection electrode in the second direction; and
a seventh connection electrode comprising a first electrode extension portion on the third electrode and spaced from the third connection electrode in the second direction, a second electrode extension portion on the fourth electrode and spaced from the fourth connection electrode in the second direction, and a first electrode connection portion connecting the first electrode extension portion to the second electrode extension portion, wherein each of the fifth connection electrode and the sixth connection electrode comprises a connection portion on the third connection electrode and the fourth connection electrode, wherein the connection portion of the fifth connection electrode is in direct contact with the third connection electrode, and wherein the connection portion of the sixth connection electrode is in direct contact with the fourth connection electrode.

22. The display device of claim 21, further comprising:

a first insulating layer on the plurality of electrodes;

a second insulating layer on the first insulating layer and the plurality of light emitting elements; and a third insulating layer on the second insulating layer, wherein at least a part of each of the first connection electrode, the second connection electrode, the third connection electrode, and the fourth connection electrode is located between the second insulating layer and the third insulating layer, and wherein at least a part of each of the fifth connection electrode, the sixth connection electrode, and the seventh connection electrode is located on the third insulating layer.

23. The display device of claim 22, further comprising:

a plurality of first openings on one side of the first electrode opposing the third electrode and penetrating the second insulating layer; and a plurality of second openings on one side of the second electrode opposing the fourth electrode and penetrating the second insulating layer, wherein the connection portions of the fifth connection electrode and the sixth connection electrode are in contact with the third connection electrode and the fourth connection electrode through a plurality of third openings penetrating the third insulating layer to expose the third connection electrode and the fourth connection electrode, respectively.

24. The display device of claim 23, wherein the plurality of third openings are respectively located on the first electrode and the second electrode, wherein the connection portion of the fifth connection electrode is in contact with the third connection electrode on the first electrode, and wherein the connection portion of the sixth connection electrode is in contact with the fourth connection electrode on the second electrode.

25. The display device of claim 23, further comprising:

a plurality of fourth openings on one side of the third electrode opposing the first electrode and penetrating the second insulating layer and the third insulating layer; and a plurality of fifth openings on one side of the fourth electrode opposing the second electrode and penetrating the second insulating layer and the third insulating layer.

26. The display device of claim 22, further comprising a bank layer on the first insulating layer and surrounding an emission area in which the plurality of light emitting elements are located, and a sub-region located in the first direction of the emission area, wherein the second electrode and the third electrode are partially connected to each other in the sub-region, and wherein the first electrode comprises a main portion extending in the first direction, and a protrusion portion bent from the main portion in the second direction to overlap the bank layer.

27. The display device of claim 26, further comprising:

a first contact portion overlapping the protrusion portion of the first electrode in the sub-region and penetrating the first insulating layer and the second insulating layer;

a second contact portion overlapping a portion where the second electrode and the third electrode are connected in the sub-region and penetrating the first insulating layer and the second insulating layer; and a third contact portion overlapping the fourth electrode in the sub-region and penetrating the first insulating layer and the second insulating layer.

28. The display device of claim 27, wherein the first connection electrode is in contact with the first electrode through the first contact portion, and the second connection electrode is in contact with the second electrode, the third electrode, and the fourth electrode through the second contact portion and the third contact portion.

* * * * *